(12) United States Patent
Kim et al.

(10) Patent No.: US 10,930,853 B2
(45) Date of Patent: Feb. 23, 2021

(54) ORGANIC LIGHT-EMITTING DEVICE

(71) Applicant: SAMSUNG DISPLAY CO., LTD., Yongin-si (KR)

(72) Inventors: Seulong Kim, Yongin-si (KR); Younsun Kim, Yongin-si (KR); Dongwoo Shin, Yongin-si (KR); Jungsub Lee, Yongin-si (KR); Naoyuki Ito, Yongin-si (KR); Jino Lim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 243 days.

(21) Appl. No.: 15/182,298

(22) Filed: Jun. 14, 2016

(65) Prior Publication Data

US 2017/0155048 A1 Jun. 1, 2017

(30) Foreign Application Priority Data

Nov. 26, 2015 (KR) .................. 10-2015-0166408

(51) Int. Cl.
*H01L 51/00* (2006.01)
*H01L 51/50* (2006.01)

(52) U.S. Cl.
CPC ........ *H01L 51/006* (2013.01); *H01L 51/0052* (2013.01); *H01L 51/0054* (2013.01);
(Continued)

(58) Field of Classification Search
CPC ............... H01L 51/006; H01L 51/0052; H01L 51/0054; H01L 51/0058; H01L 51/0061;
(Continued)

(56) References Cited

U.S. PATENT DOCUMENTS

| 5,840,217 A | 11/1998 | Lupo et al. |
| 6,911,551 B2 | 6/2005 | Stössel et al. |

(Continued)

FOREIGN PATENT DOCUMENTS

| CN | 101535256 A | 9/2009 |
| CN | 102668157 A | 9/2012 |

(Continued)

OTHER PUBLICATIONS

Concise Description of Relevance of the Third-Party Submission, submitted in U.S. Appl. No. 14/856,487, 9 pages.

(Continued)

*Primary Examiner* — John E Uselding
(74) *Attorney, Agent, or Firm* — Lewis Roca Rothgerber Christie LLP

(57) ABSTRACT

An organic light-emitting device includes: a first electrode; a second electrode facing the first electrode; an emission layer between the first electrode and the second electrode; a hole transport region between the first electrode and the emission layer; and an electron transport region between the emission layer and the second electrode, wherein the hole transport region includes a first compound, the emission layer includes a second compound as a fluorescent host and a third compound as a fluorescent dopant, and the electron transport region includes a fourth compound and a fifth compound including, as a ring-forming moiety, a nitrogen-containing heterocyclic group including *=N—*', wherein the first compound, the fourth compound, and at least one selected from the second compound and the third compound each independently include at least one group selected from groups represented by Formulae A to D:

(Continued)

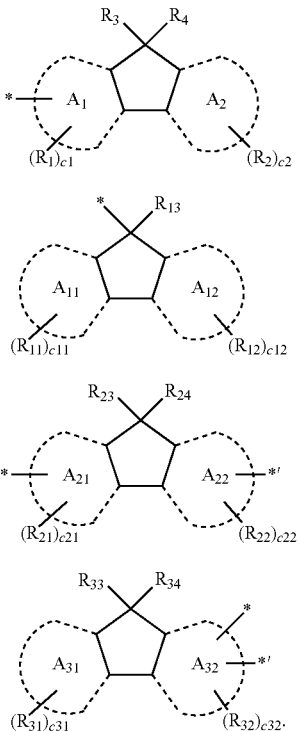

Formula A

Formula B

Formula C

Formula D

20 Claims, 2 Drawing Sheets

(52) U.S. Cl.
CPC ...... *H01L 51/0058* (2013.01); *H01L 51/0061* (2013.01); *H01L 51/0067* (2013.01); *H01L 51/0072* (2013.01); *H01L 51/0073* (2013.01); *H01L 51/0094* (2013.01); *H01L 51/0055* (2013.01); *H01L 51/0056* (2013.01); *H01L 51/0081* (2013.01); *H01L 51/508* (2013.01); *H01L 51/5012* (2013.01); *H01L 51/5016* (2013.01); *H01L 51/5056* (2013.01); *H01L 51/5064* (2013.01); *H01L 51/5072* (2013.01); *H01L 2251/5384* (2013.01)

(58) Field of Classification Search
CPC ............. H01L 51/0067; H01L 51/0072; H01L 51/0073; H01L 51/0094
See application file for complete search history.

(56) References Cited

U.S. PATENT DOCUMENTS

| | | | |
|---|---|---|---|
| 7,663,304 | B2 | 2/2010 | Fukuoka et al. |
| 7,956,531 | B2 | 6/2011 | Smith |
| 8,394,510 | B2 | 3/2013 | Mizuki et al. |
| 8,679,647 | B2 | 3/2014 | Pflumm et al. |
| 8,890,126 | B2 | 11/2014 | Ryu et al. |
| 8,932,732 | B2 | 1/2015 | Buesing et al. |
| 9,040,172 | B2 | 5/2015 | Parham et al. |
| 9,070,885 | B2 | 6/2015 | Ono |
| 9,871,208 | B2 | 1/2018 | Lee et al. |
| 9,972,789 | B2 | 5/2018 | Cho et al. |
| 2002/0098379 | A1 | 7/2002 | Arakane et al. |
| 2003/0160564 | A1 | 8/2003 | Park et al. |
| 2005/0106419 | A1 | 5/2005 | Endoh et al. |
| 2006/0055305 | A1 | 3/2006 | Funahashi et al. |
| 2006/0088728 | A1 | 4/2006 | Kwong et al. |
| 2006/0220535 | A1 | 10/2006 | Nakayama |
| 2007/0252516 | A1 | 11/2007 | Kondakova et al. |
| 2008/0124572 | A1 | 5/2008 | Mizuki et al. |
| 2009/0309487 | A1 | 12/2009 | Royster, Jr. et al. |
| 2010/0001636 | A1 | 1/2010 | Yabunouchi |
| 2010/0046336 | A1 | 2/2010 | Takahashi et al. |
| 2010/0187977 | A1 | 7/2010 | Kai et al. |
| 2011/0037062 | A1 | 2/2011 | Fukumatsu et al. |
| 2011/0248246 | A1 | 10/2011 | Ogita et al. |
| 2011/0279020 | A1 | 11/2011 | Inoue et al. |
| 2012/0068170 | A1 | 3/2012 | Pflumm et al. |
| 2012/0091885 | A1 | 4/2012 | Kim et al. |
| 2012/0112169 | A1 | 5/2012 | Mizuki et al. |
| 2012/0112174 | A1 | 5/2012 | Lee et al. |
| 2012/0138915 | A1 | 6/2012 | Nishimura et al. |
| 2012/0153272 | A1 | 6/2012 | Fukuzaki |
| 2012/0181518 | A1 | 7/2012 | Ogiwara et al. |
| 2012/0203010 | A1 | 8/2012 | Matsumoto et al. |
| 2012/0235123 | A1 | 9/2012 | Lee et al. |
| 2012/0256123 | A1 | 10/2012 | Cho et al. |
| 2012/0273764 | A1 | 11/2012 | Yu et al. |
| 2012/0305898 | A1 | 12/2012 | Okamoto |
| 2013/0075716 | A1 | 3/2013 | Nishimura et al. |
| 2013/0105771 | A1 | 5/2013 | Ryu et al. |
| 2013/0119354 | A1 | 5/2013 | Ma et al. |
| 2013/0256634 | A1 | 10/2013 | Cho et al. |
| 2013/0292665 | A1* | 11/2013 | Ono ........ C09K 11/06 257/40 |
| 2013/0313536 | A1 | 11/2013 | Nishimura et al. |
| 2014/0001446 | A1 | 1/2014 | Mizuki et al. |
| 2014/0034943 | A1 | 2/2014 | Mizuki et al. |
| 2014/0048784 | A1 | 2/2014 | Inoue et al. |
| 2014/0054564 | A1 | 2/2014 | Kim et al. |
| 2014/0061609 | A1 | 3/2014 | Kim et al. |
| 2014/0070204 | A1 | 3/2014 | Nagao et al. |
| 2014/0084270 | A1 | 3/2014 | Kato et al. |
| 2014/0131665 | A1 | 5/2014 | Xia et al. |
| 2014/0197386 | A1 | 7/2014 | Kim et al. |
| 2014/0217393 | A1 | 8/2014 | Kato et al. |
| 2014/0225046 | A1 | 8/2014 | Jatsch et al. |
| 2014/0275530 | A1 | 9/2014 | Jatsch et al. |
| 2014/0299865 | A1 | 10/2014 | Nishimura et al. |
| 2014/0306207 | A1 | 10/2014 | Nishimura et al. |
| 2014/0312331 | A1 | 10/2014 | Inoue et al. |
| 2014/0312338 | A1 | 10/2014 | Mizutani et al. |
| 2014/0326985 | A1 | 11/2014 | Mizuki et al. |
| 2014/0367649 | A1 | 12/2014 | Cho et al. |
| 2014/0374711 | A1 | 12/2014 | Cho et al. |
| 2015/0001488 | A1 | 1/2015 | Min et al. |
| 2015/0060796 | A1 | 3/2015 | Kim et al. |
| 2015/0065730 | A1 | 3/2015 | Montenegro et al. |
| 2015/0069352 | A1 | 3/2015 | Kim et al. |
| 2015/0102301 | A1 | 4/2015 | Cho et al. |
| 2015/0115239 | A1 | 4/2015 | Pflumm et al. |
| 2015/0155498 | A1 | 6/2015 | Ahn et al. |
| 2015/0179953 | A1 | 6/2015 | Mujica-Fernaud et al. |
| 2015/0207079 | A1 | 7/2015 | Cho et al. |
| 2015/0236262 | A1 | 8/2015 | Cho et al. |
| 2015/0243897 | A1 | 8/2015 | Montenegro et al. |
| 2015/0280136 | A1* | 10/2015 | Ryu ........ C09K 11/06 257/40 |
| 2015/0303379 | A1 | 10/2015 | Lee et al. |
| 2015/0325795 | A1 | 11/2015 | Lee et al. |
| 2015/0325800 | A1 | 11/2015 | Ito et al. |
| 2015/0349270 | A1 | 12/2015 | Lee et al. |
| 2016/0149139 | A1* | 5/2016 | Xia ........ H01L 51/0054 257/40 |
| 2016/0197289 | A1 | 7/2016 | Sado et al. |
| 2017/0084844 | A1 | 3/2017 | Parham et al. |

FOREIGN PATENT DOCUMENTS

| | | |
|---|---|---|
| CN | 102858912 A | 1/2013 |
| CN | 103328420 A | 9/2013 |
| CN | 104795503 A | 7/2015 |
| CN | 104860883 A | 8/2015 |

(56) References Cited

FOREIGN PATENT DOCUMENTS

| | | |
|---|---|---|
| CN | 104903421 A | 9/2015 |
| CN | 105051011 A | 11/2015 |
| JP | 2010-34548 A | 2/2010 |
| JP | 2012-156449 A | 8/2012 |
| JP | 2012-156499 A | 8/2012 |
| KR | 10-2003-0071617 A | 9/2003 |
| KR | 10-2005-0085046 A | 8/2005 |
| KR | 10-2005-0086729 A | 8/2005 |
| KR | 10-2009-0073260 A | 7/2009 |
| KR | 10-2010-0105099 A | 9/2010 |
| KR | 10-2011-0007124 A | 1/2011 |
| KR | 10-2011-0011647 A | 2/2011 |
| KR | 10-2011-0015836 A | 2/2011 |
| KR | 10-2011-0066766 A | 6/2011 |
| KR | 10-2011-0071127 A | 6/2011 |
| KR | 10-2012-0042633 A | 5/2012 |
| KR | 10-2012-0047706 A | 5/2012 |
| KR | 10-2012-0057611 A | 6/2012 |
| KR | 10-2012-0088752 A | 8/2012 |
| KR | 10-2012-0092550 A | 8/2012 |
| KR | 10-2012-0127746 A | 11/2012 |
| KR | 10-2013-0039671 A | 4/2013 |
| KR | 10-2013-0054205 A | 5/2013 |
| KR | 10-2013-0115027 A | 10/2013 |
| KR | 10-2013-0118059 A | 10/2013 |
| KR | 10-2014-0000259 A | 1/2014 |
| KR | 10-2014-0031213 A | 3/2014 |
| KR | 10-2014-0069199 A | 6/2014 |
| KR | 10-2014-0073406 | 6/2014 |
| KR | 10-2014-0073412 | 6/2014 |
| KR | 10-2014-0074286 A | 6/2014 |
| KR | 10-2014-0081879 A | 7/2014 |
| KR | 10-2014-0094520 A | 7/2014 |
| KR | 10-2014-0095072 A | 7/2014 |
| KR | 10-2014-0095491 A | 8/2014 |
| KR | 10-2014-0096203 A | 8/2014 |
| KR | 10-2014-0104895 A | 8/2014 |
| KR | 10-1427605 B1 | 8/2014 |
| KR | 10-2014-0108637 | 9/2014 |
| KR | 10-2014-0124654 A | 10/2014 |
| KR | 10-2014-0133572 A | 11/2014 |
| KR | 10-2014-0145456 A | 12/2014 |
| KR | 10-2014-0145887 A | 12/2014 |
| KR | 10-2014-0145888 A | 12/2014 |
| KR | 10-2014-0146103 A | 12/2014 |
| KR | 10-1476231 B1 | 12/2014 |
| KR | 10-2015-0001101 A | 1/2015 |
| KR | 10-2015-0006199 A | 1/2015 |
| KR | 10-2015-0007476 A | 1/2015 |
| KR | 10-2015-0024735 A | 3/2015 |
| KR | 10-2015-0034333 A | 4/2015 |
| KR | 10-2015-0036721 A | 4/2015 |
| KR | 10-2015-0041652 A | 4/2015 |
| KR | 10-2015-0042603 A | 4/2015 |
| KR | 10-2015-0086721 | 7/2015 |
| KR | 10-2015-0096593 | 8/2015 |
| WO | WO 2010/107244 A2 | 9/2010 |
| WO | WO 2011/081423 A2 | 7/2011 |
| WO | WO 2012/026780 A1 | 3/2012 |
| WO | WO 2012/070233 A1 | 5/2012 |
| WO | WO 2013/013271 A1 | 1/2013 |
| WO | WO 2013/120577 A1 | 8/2013 |
| WO | WO 2013/157886 A1 | 10/2013 |
| WO | WO 2014/088284 A1 | 6/2014 |
| WO | WO-2014097711 A1 | 6/2014 |
| WO | WO 2014/141725 A1 | 9/2014 |
| WO | WO 2015/082056 A1 | 11/2014 |
| WO | WO 2015/046916 A1 | 4/2015 |
| WO | WO 2015/050391 A1 | 4/2015 |
| WO | WO 2015/135625 A1 | 9/2015 |
| WO | WO 2015/167199 A1 | 11/2015 |

OTHER PUBLICATIONS

Machine Translation of JP 2010-034548 A. Feb. 12, 2010. (Year: 2010).
Yersin, H., "Highly Efficient OLEDs with Phosphorescent Materials," Wiley-VCH Verlag GmbH & Co. 2008. pp. 311-328.
U.S. Office Action dated Aug. 17, 2017, issued in U.S. Appl. No. 15/183,627 (22 pages).
U.S. Office Action dated Nov. 3, 2017, issued in U.S. Appl. No. 14/856,487 (28 pages).
U.S. Final Office Action dated Dec. 15, 2017, issued in U.S. Appl. No. 15/183,627 (12 pages).
U.S. Office Action dated Apr. 6, 2018, issued in U.S. Appl. No. 15/390,294 (13 pages).
U.S. Office Action dated May 24, 2018, issued in U.S. Appl. No. 15/273,515 (11 pages).
U.S. Advisory Action dated Jun. 14, 2018, issued in U.S. Appl. No. 14/856,487 (4 pages).
U.S. Office Action dated Jul. 17, 2018, issued in U.S. Appl. No. 15/183,627 (14 pages).
U.S. Office Action dated Apr. 6, 2018, issued in U.S. Appl. No. 15/390,210 (14 pages).
EPO Extended Search Report dated Jul. 26, 2017, corresponding to European Patent Application No. 17150355.0 (7 pages).
U.S. Office Action dated Aug. 7, 2018, issued in U.S. Appl. No. 15/293,174 (14 pages).
U.S. Office Action dated Oct. 4, 2018, issued in U.S. Appl. No. 15/372,042 (22 pages).
Machine translation of W0 2011-081423. (Year: 2011).
U.S. Final Office Action dated Jan. 17, 2019, issued in U.S. Appl. No. 15/293,174 (11 pages).
U.S. Office Action dated Apr. 3, 2019, issued in U.S. Appl. No. 15/273,515 (12 pages).
U.S. Final Office Action dated Apr. 5, 2019, issued in U.S. Appl. No. 14/856,487 (29 pages).
U.S. Office Action dated Apr. 15, 2019, issued in U.S. Appl. No. 15/293,174 (10 pages).
U.S. Final Office Action dated Aug. 1, 2019, issued in U.S. Appl. No. 15/390,210, 14 pages.
Cosimbescu et al. "Electron Transport Materials: Synthesis, Properties and Device Performance", International Journal of Organic Chemistry, 2012, 2, 101-110. (Year: 2012) 10 pages.
Office action issued in U.S. Appl. No. 15/183,627 by the USPTO, dated Jul. 18, 2019, 11 pages.
Hu, Jian-Yong, et al.; Synthesis and Photophysical Properties of Pyrene-Based Multiply Conjugated Shaped Light-Emitting Architectures: Toward Efficient Organic-Light Emitting Diodes, InTech Chapter 2, pp. 21-60, dated Jul. 27, 2011.
Office Action issued in U.S. Appl. No. 15/390,210 by the USPTO, dated Nov. 14, 2019, 12 pages.
Office Action issued in U.S. Appl. No. 15/183,627 by the USPTO, dated Dec. 13, 2019, 15 pages.
Office Action issued in U.S. Appl. No. 15/273,515 by the USPTO, dated Jan. 22, 2020, 10 pages.
U.S. Office Action dated Apr. 3, 2020, issued in U.S. Appl. No. 14/856,487 (43 pages).
U.S. Final Office Action dated Jun. 8, 2020, issued in U.S. Appl. No. 15/273,515 (12 pages).

* cited by examiner

| 190 |
|---|
| 170 |
| 150 |
| 130 |
| 110 |

| 290 |
|---|
| 280 |
| 270 |
| 260 |
| 250 |
| 240 |
| 230 |
| 220 |
| 210 |

ORGANIC LIGHT-EMITTING DEVICE

CROSS-REFERENCE TO RELATED APPLICATION

This application claims priority to and the benefit of Korean Patent Application No. 10-2015-0166408, filed on Nov. 26, 2015, in the Korean Intellectual Property Office, the entire content of which is incorporated herein by reference.

BACKGROUND

1. Field

One or more aspects of embodiments of the present disclosure relate to an organic light-emitting device.

2. Description of the Related Art

Organic light emitting devices are self-emission devices that have wide viewing angles, high contrast ratios, short response times, and excellent brightness, driving voltage, and response speed characteristics, compared to related display devices in the art. For example, an organic light-emitting device may include a first electrode disposed (e.g., positioned) on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons.

SUMMARY

One or more aspects of embodiments of the present disclosure are directed toward an organic light-emitting device having high efficiency and long lifespan.

Additional aspects will be set forth in part in the description which follows and, in part, will be apparent from the description, or may be learned by practice of the presented embodiments, According to one or more embodiments, an organic light-emitting device includes:

a first electrode;

a second electrode facing the first electrode;

an emission layer between the first electrode and the second electrode;

a hole transport region between the first electrode and the emission layer; and an electron transport region between the emission layer and the second electrode, wherein the hole transport region includes a first compound, the emission layer includes a second compound and a third compound, and the electron transport region includes a fourth compound and a fifth compound, wherein the second compound included in the emission layer is a fluorescent host and the third compound included in the emission layer is a fluorescent dopant, the first compound and the fourth compound each independently include at least one group selected from groups represented by Formulae A to D, at least one selected from the second compound and the third compound includes at least one group selected from groups represented by Formulae A to D, and the fifth compound includes, as a ring-forming moiety, a nitrogen-containing heterocyclic group including *=N—*':

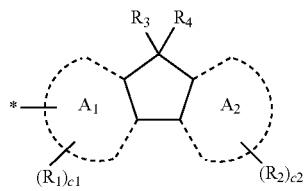

Formula A

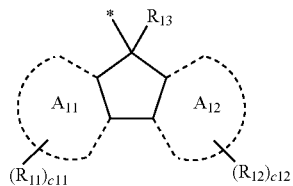

Formula B

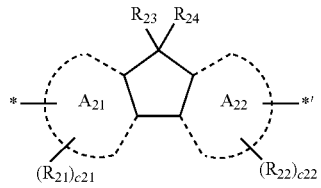

Formula C

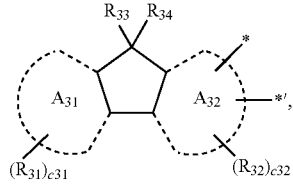

Formula D wherein, in Formulae A to D, ring $A_1$, ring $A_2$, ring $A_{11}$, ring $A_{12}$, ring $A_{21}$, ring $A_{22}$, ring $A_{31}$, and ring $A_{32}$ may each independently be selected from a $C_5$-$C_{30}$ carbocyclic group and a $C_1$-$C_{30}$ heterocyclic group, $R_1$ to $R_4$, $R_{11}$ to $R_{13}$, $R_{21}$ to $R_{24}$, and $R_{31}$ to $R_{34}$ may each independently be selected from hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —N($Q_4$)($Q_5$), wherein $Q_1$ to $Q_5$ are as defined herein.

c1, c2, c11, c12, c21, c22, c31, and c32 may each independently be an integer selected from 0 to 10, $R_1$ and $R_3$ may optionally be linked to each other to form a saturated or unsaturated ring, $R_2$ and $R_4$ may optionally be linked to each other to form a saturated or unsaturated ring, $R_3$ and $R_4$ may optionally be linked to each other to form a saturated or unsaturated ring, $R_{12}$ and $R_{13}$ may optionally be linked to each other to form a saturated or unsaturated ring, $R_{21}$ and $R_{23}$ may optionally be linked to each other to form a saturated or unsaturated ring, $R_{23}$ and $R_{24}$ may optionally be linked to each other to form a saturated or unsaturated ring, $R_{22}$ and $R_{24}$ may optionally be linked to each other to form a saturated or unsaturated ring, $R_{31}$ and $R_{33}$ may optionally be linked to each other to form a saturated or unsaturated ring, and $R_{33}$ and $R_{34}$ may optionally be linked to each other to form a saturated or unsaturated ring, and

* and *' each indicate a binding site with a neighboring atom.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic view of a structure of an organic light-emitting device according to an embodiment; and FIG. 2 is a schematic view of a structure of an organic light-emitting device according to another embodiment.

DETAILED DESCRIPTION

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

An organic light-emitting device according to an embodiment of the present disclosure may include: a first electrode, a second electrode facing the first electrode, an emission layer between the first electrode and the second electrode, a hole transport region between the first electrode and the emission layer; and an electron transport region between the emission layer and the second electrode, wherein the hole transport region may include a first compound, the emission layer may include a second compound and a third compound, and the electron transport region may include a fourth compound and a fifth compound, wherein the second compound included in the emission layer may be a fluorescent host and the third compound included in the emission layer may be a fluorescent dopant.

The first electrode may be an anode and the second electrode may be a cathode. Descriptions of the first electrode and the second electrode may be understood by referring to the descriptions provided below.

The first compound and the fourth compound may each independently include at least one group selected from groups represented by Formulae A to D below, at least one selected from the second compound and the third compound may include at least one group selected from groups represented by Formulae A to D below, and the fifth compound may include, as a ring-forming moiety, a nitrogen-containing heterocyclic group including *=N—*':

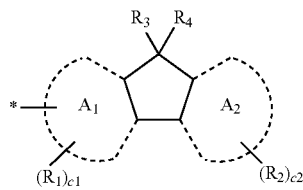

Formula A

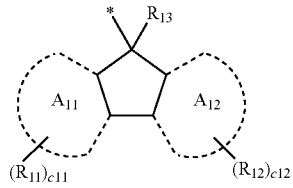

Formula B

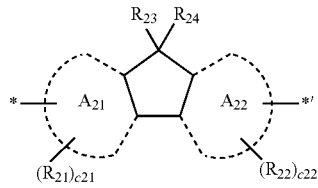

Formula C

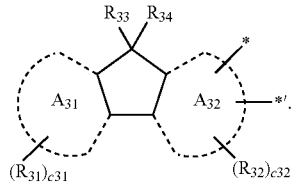

Formula D

In Formulae A to D, ring $A_1$, ring $A_2$, ring $A_{11}$, ring $A_{12}$, ring $A_{21}$, ring $A_{22}$, ring $A_{31}$, and ring $A_{32}$ may each independently be selected from a $C_5$-$C_{30}$ carbocyclic group and a $C_1$-$C_{30}$ heterocyclic group.

For example, in Formulae A to D, ring $A_1$, ring $A_2$, ring $A_{11}$, ring $A_{12}$, ring $A_{21}$, ring $A_{22}$, ring $A_{31}$, and ring $A_{32}$ may each independently be selected from a benzene, a naphthalene, a phenanthrene, an anthracene, a fluorene, a benzofluorene, a chrysene, a triphenylene, a pyridine, a pyrimidine, a quinoline, an isoquinoline, a benzoquinoline, a quinoxaline, a quinazoline, phenanthroline, an indole, a carbazole, a benzofuran, a benzothiophene, a dibenzofuran, a dibenzothiophene, and a benzonaphthothiophene.

In various embodiments, in Formulae A to D, ring $A_1$, ring $A_2$, ring $A_{11}$, ring $A_{12}$, ring $A_{21}$, ring $A_{22}$, ring $A_{31}$, and ring $A_{32}$ may each independently be selected from a benzene, a naphthalene, a fluorene, an anthracene, a phenanthrene, a chrysene, a triphenylene, a carbazole, a dibenzofuran, a dibenzothiophene, and a benzonaphthothiophene.

In Formulae A to D, $R_1$ to $R_4$, $R_{11}$ to $R_{13}$, $R_{21}$ to $R_{24}$, and $R_{31}$ to $R_{34}$ may each independently be selected from hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —N($Q_4$)($Q_5$), wherein $Q_1$ to $Q_5$ are as defined herein.

For example, in Formulae A to D, $R_1$ to $R_4$, $R_{11}$ to $R_{13}$, $R_{21}$ to $R_{24}$, and $R_{31}$ to $R_{34}$ may each independently be selected from the group consisting of:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —Si($Q_{31}$)($Q_{32}$)($Q_{33}$), and —N($Q_{34}$)($Q_{35}$); and —Si($Q_1$)($Q_2$)($Q_3$) and —N($Q_4$)($Q_5$), wherein $Q_1$ to $Q_5$ and $Q_{31}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, in Formulae A to D, $R_1$ to $R_4$, $R_{11}$ to $R_{13}$, $R_{21}$ to $R_{24}$, and $R_{31}$ to $R_{34}$ may each independently be selected from the group consisting of:

hydrogen, deuterium, —F, —Cl, —Br, —I, a hydroxyl group, a cyano group, a nitro group, an amino group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, and an amino group;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, a quinoxalinyl group, and a carbazolyl group;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, a quinoxalinyl group, and a carbazolyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, and a $C_6$-$C_{16}$ aryl group; and —Si($Q_1$)($Q_2$)($Q_3$) and —N($Q_4$)($Q_5$), wherein $Q_1$ to $Q_5$ may each independently be selected from a $C_1$-$C_{10}$ alkyl group, a $C_1$-$C_{10}$ alkoxy group, a phenyl group, a biphenyl group, a terphenyl group, a fluorenyl group, and a naphthyl group.

In Formulae A to D, c1, c2, c11, c12, c21, c22, c31, and c32 may each independently be an integer selected from 0 to 10. For example, c1 indicates the number of $R_1$ in Formula A, wherein when c1 is two or more, two or more $R_1$(s) may be identical to or different from each other. Descriptions of c2, c11, c12, c21, c22, c31, and c32 may be understood by referring to the descriptions provided herein in connection with the structures of Formulae A to D and with c1.

In various embodiments, c1, c2, c11, c12, c21, c22, c31, and c32 may each independently be 0 or 1.

In Formulae A to D, $R_1$ and $R_3$ may optionally be linked to each other to form a saturated or unsaturated ring, $R_2$ and $R_4$ may optionally be linked to each other to form a saturated or unsaturated ring, $R_3$ and $R_4$ may optionally be linked to each other to form a saturated or unsaturated ring, $R_{12}$ and $R_{13}$ may optionally be linked to each other to form a saturated or unsaturated ring, $R_{21}$ and $R_{23}$ may optionally be linked to each other to form a saturated or unsaturated ring, $R_{23}$ and $R_{24}$ may optionally be linked to each other to form a saturated or unsaturated ring, $R_{22}$ and $R_{24}$ may optionally be linked to each other to form a saturated or unsaturated ring, $R_{31}$ and $R_{33}$ may optionally be linked to each other to form a saturated or unsaturated ring, and $R_{33}$ and $R_{34}$ may optionally be linked to each other to form a saturated or unsaturated ring.

In Formulae A to D, * and *' each indicate a binding site with a neighboring atom.

In various embodiments, the first compound and the fourth compound may each independently include at least one group selected from groups represented by Formulae A-1, A-2, B-1, C-1, C-2, and D-1 below, and At least one of the second compound and the third compound may each independently include at least one group selected from groups represented by Formulae A-1, A-2, B-1, C-1, C-2, and D-1 below:

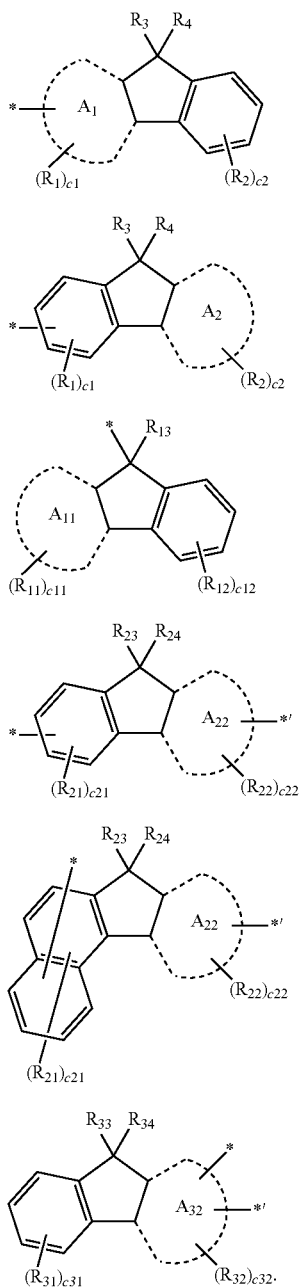

In Formulae A-1, A-2, B-1, C-1, C-2, and D-1,
descriptions of $A_1$, $A_2$, $A_{11}$, $A_{22}$, $A_{32}$, $R_1$ to $R_4$, $R_{11}$ to $R_{13}$, $R_{21}$ to $R_{24}$, and $R_{31}$ to $R_{34}$ may be understood by referring to the descriptions thereof provided herein,
descriptions of c1, c2, c11, c12, c21, c22, c31, and c32 may be understood by referring to the descriptions thereof provided herein, and
* and *' each indicate a binding site with a neighboring atom.

In various embodiments, the first compound and the fourth compound may each independently include at least one group selected from groups represented by Formulae A(1) to A(27), B(1), B(2), C(1) to C(9), and D(1) to D(4) below, and at least one selected from the second compound and the third compound may include at least one group selected from groups represented by Formulae A(1) to A(26), B(1), B(2), C(1) to C(9), and D(1) to D(4) below:

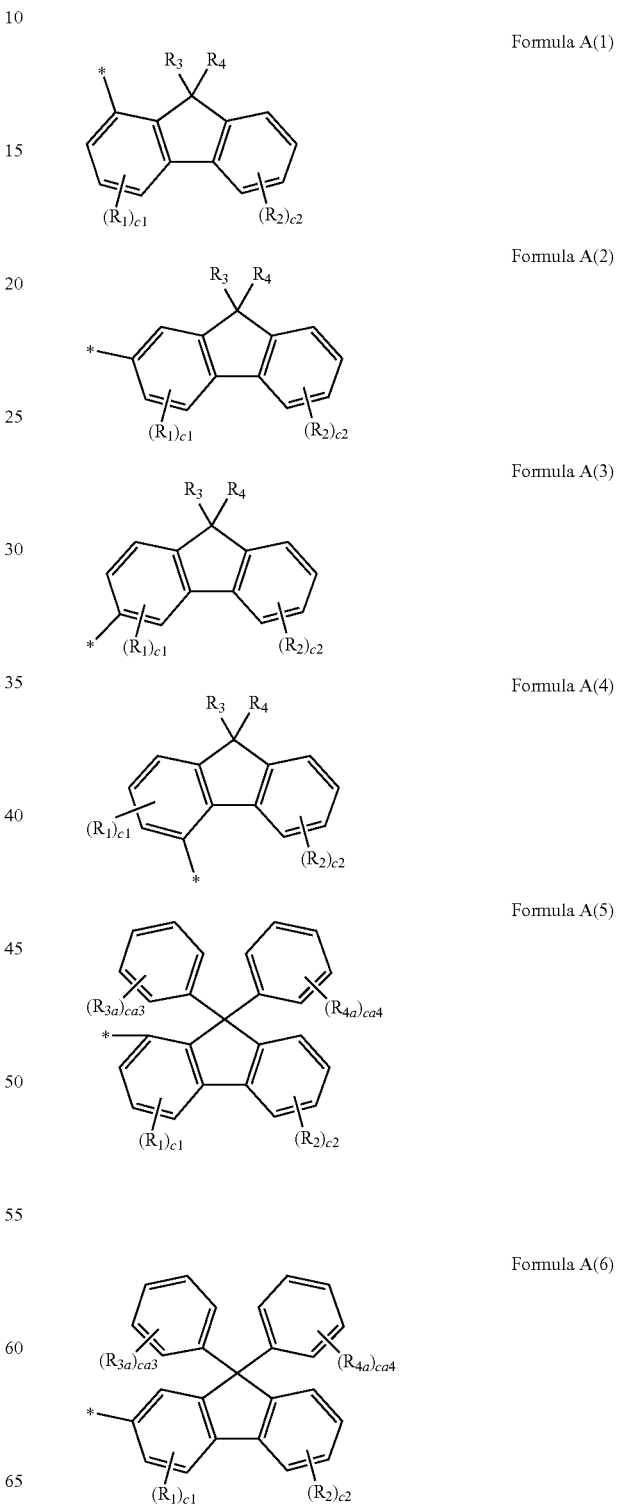

-continued
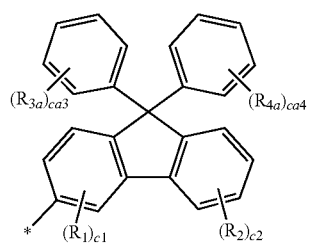
Formula A(7)
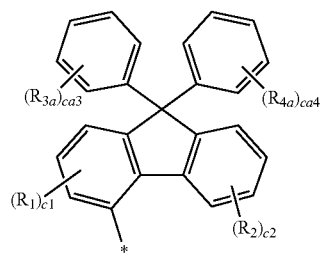
Formula A(8)
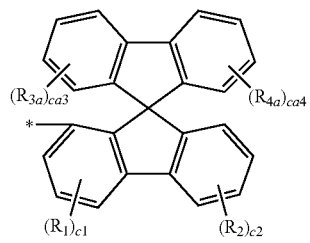
Formula A(9)
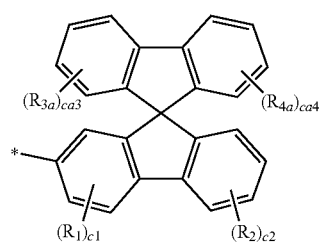
Formula A(10)
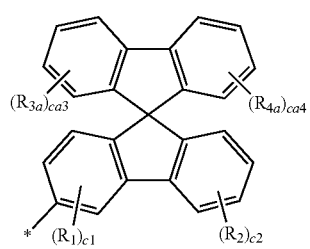
Formula A(11)
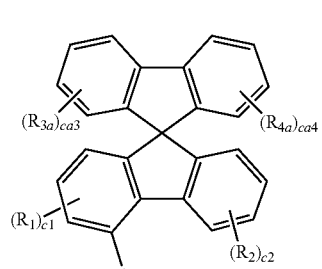
Formula A(12)
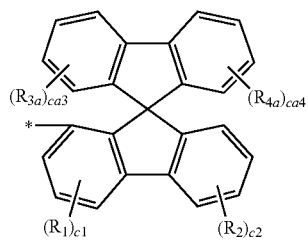
Formula A(13)
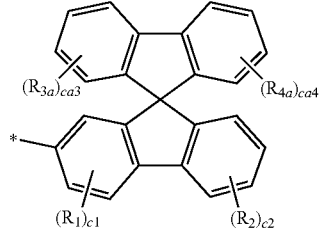
Formula A(14)
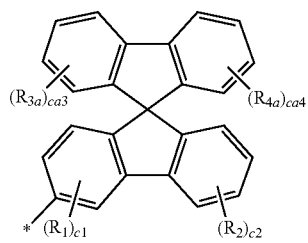
Formula A(15)
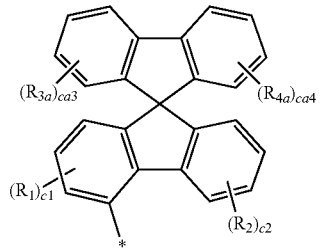
Formula A(16)
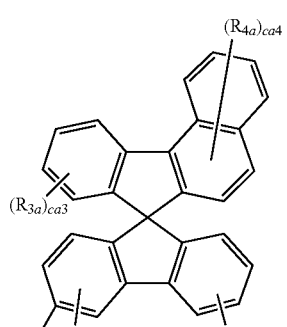
Formula A(17)
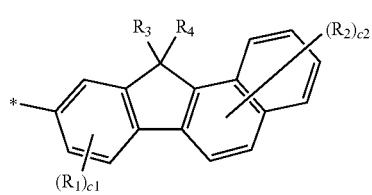
Formula A(18)

-continued
Formula A(19)
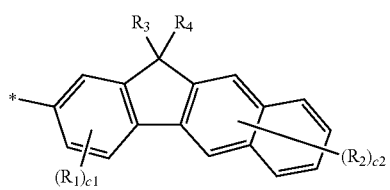
Formula A(20)
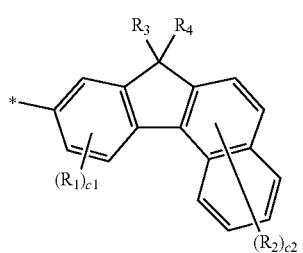
Formula A(21)
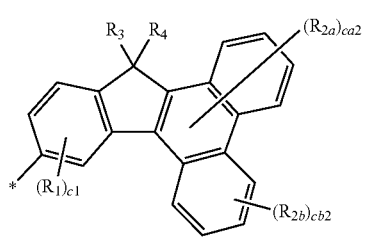
Formula A(22)
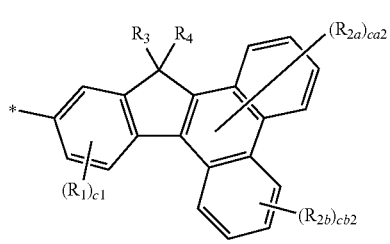
Formula A(23)
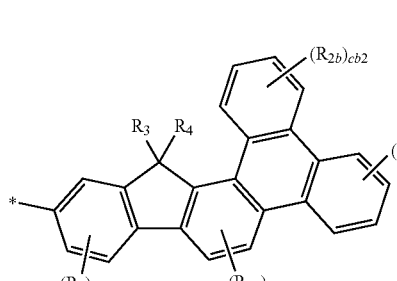
Formula A(24)
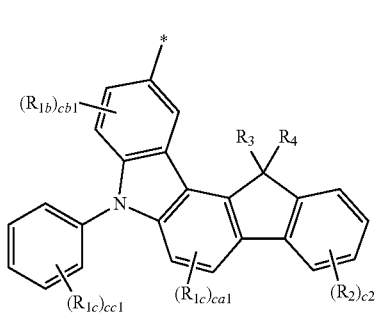
-continued
Formula A(25)
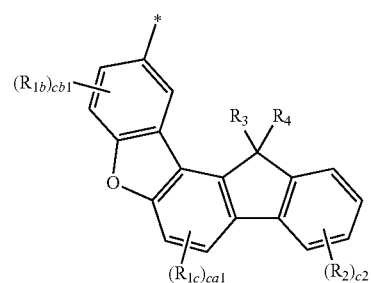
Formula A(26)
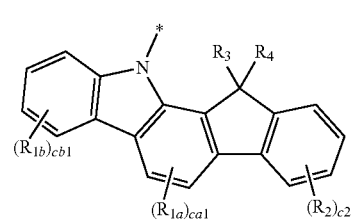
Formula A(27)
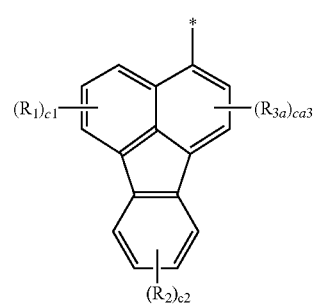
Formula B(1)
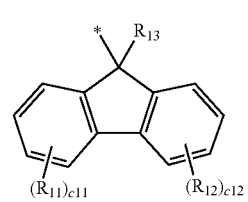
Formula B(2)
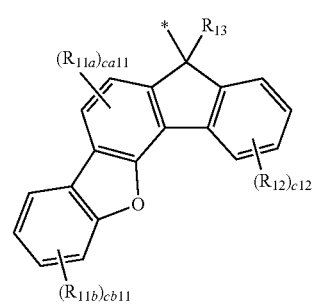
Formula C(1)
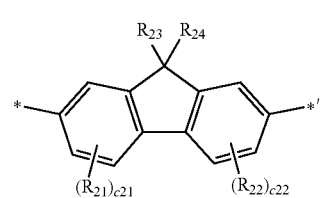

Formula C(2)
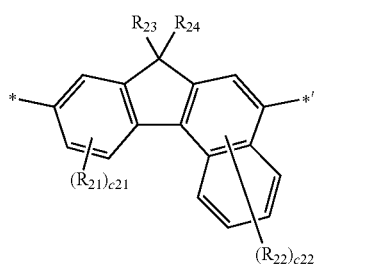
Formula C(3)
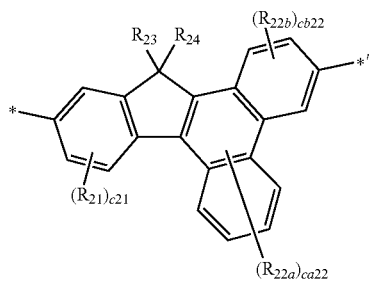
Formula C(4)
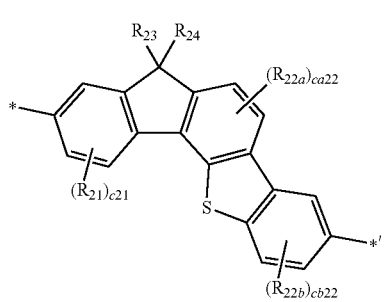
Formula C(5)
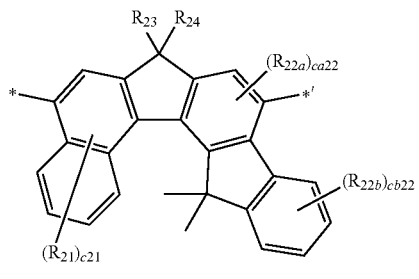
Formula C(6)
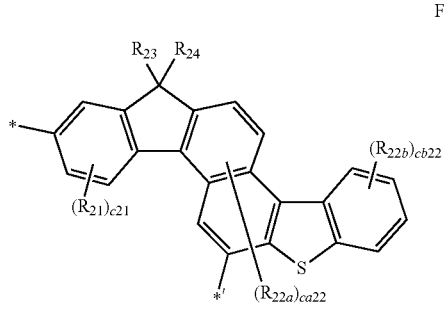
Formula C(7)
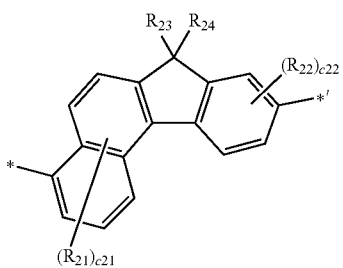
Formula C(8)
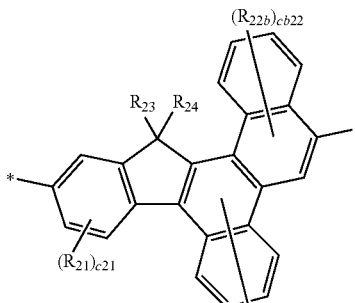
Formula C(9)
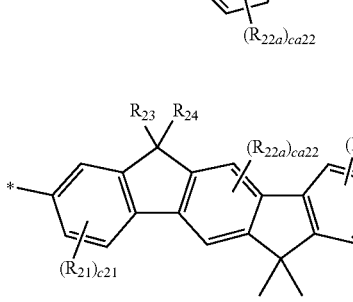
Formula D(1)
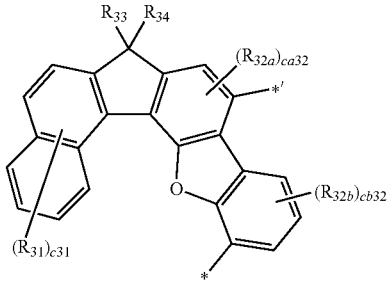
Formula D(2)
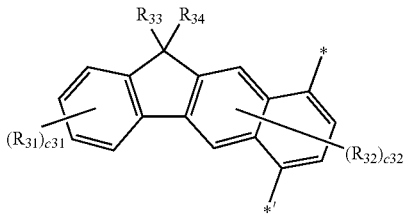
Formula D(3)
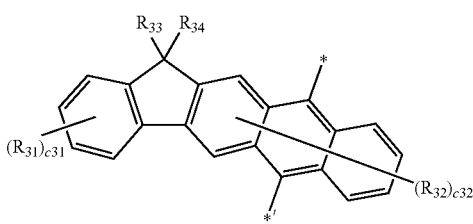

-continued

Formula D(4)

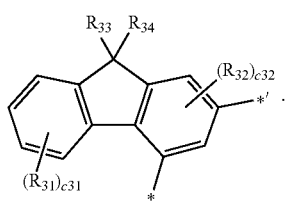

In Formulae A(1) to A(27), B(1) to B(6), C(1) to C(9) and D(1) to D(4), descriptions of $R_1$ to $R_4$, $R_{11}$ to $R_{13}$, $R_{21}$ to $R_{24}$, $R_{31}$ to $R_{34}$ may be understood by referring to the descriptions thereof provided herein, descriptions of c1, c2, c11, c12, c21, c22, c31, and c32 may be understood by referring to the descriptions thereof provided herein, descriptions of $R_{2a}$, $R_{2b}$, and $R_{2c}$ may each independently be the same as the description of $R_2$ provided herein, descriptions of ca2, cb2, and cc2 may each independently be the same as the description of c2 provided herein, a description of $R_{3a}$ may be the same as the description of $R_3$ provided herein, a description of $R_{4a}$ may be the same as the description of $R_4$ provided herein, a description of ca3 may be the same as the description of c3 provided herein, a description of ca4 may be the same as the description of c4 provided herein, descriptions of $R_{11a}$ and $R_{11b}$ may each independently be the same as the description of $R_{11}$ provided herein, descriptions of ca11 and cb11 may each independently be the same as the description of c11 provided herein, descriptions of $R_{22a}$ and $R_{22b}$ may each independently be the same as the description of $R_{22}$ provided herein, descriptions of ca22 and cb22 may each independently be the same as the description of c22 provided herein, descriptions of $R_{32a}$ and $R_{32b}$ may each independently be the same as the description of $R_{32}$ provided herein, descriptions of ca32 and cb32 may each independently be the same as the description of c32 provided herein, descriptions of $R_{1a}$, $R_{1b}$, and $R_{1c}$ may each independently be the same as the description of $R_1$ provided herein, descriptions of ca1, cb1, and cc1 may each independently be the same as the description of c1 provided herein, and

* and *' each each indicate a binding site with a neighboring atom.

In various embodiments, the first compound may be selected from compounds represented by Formulae 1-1 and 1-2 below, the second compound may be selected from compounds represented by Formulae 2-1 and 2-2 below, the third compound may be selected from compounds represented by Formulae 3-1 and 3-2 below, the fourth compound may include, as a ring-forming moiety, a nitrogen-containing heterocyclic group including *=N—*', and may be selected from groups represented by one of Formulae 4-1 to 4-3 below, and the fifth compound may include, as a ring-forming moiety, a nitrogen-containing heterocyclic group including *=N—*', and may be selected from compounds represented by Formulae 5-1 and 5-2 below:

Formula 1-1
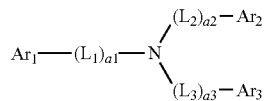

Formula 1-2
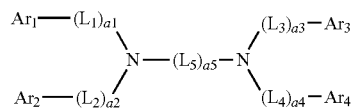

Formula 2-1
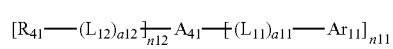

Formula 2-2
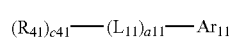

Formula 3-1

Formula 3-2
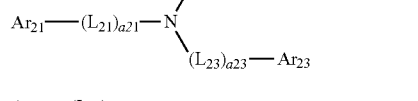

Formula 4-1
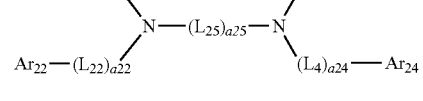

Formula 4-2
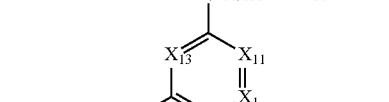

Formula 4-3
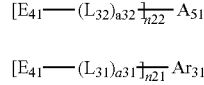

Formula 5-1
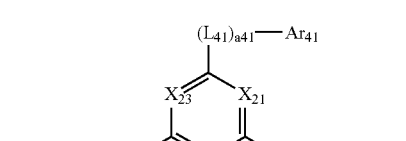

Formula 5-2
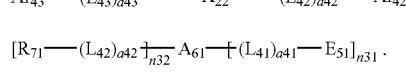

In Formula 4-1, $X_1$ may be C-$(L_{33})_{a33}$-$Ar_{33}$ or N, $X_{11}$ may be C-$(L_{34})_{a34}$-$(R_{51})$ or N, $X_{12}$ may be C-$(L_{35})_{a35}$-$(R_{52})$ or N, and $X_{13}$ may be C-$(L_{36})_{a36}$-$(R_{53})$ or N, wherein at least one selected from $X_1$ and $X_{11}$ to $X_{13}$ may be N.

In various embodiments, in Formula 4-1, i) $X_1$ may be C-$(L_{33})_{a33}$-$Ar_{33}$, and $X_{11}$ to $X_{13}$ may be N, ii) $X_1$ may be C-$(L_{33})_{a33}$-$Ar_{33}$, $X_{11}$ and $X_{13}$ may be N, and $X_{12}$ may be C-$(L_{35})_{a35}$-$(R_{52})$, or iii) $X_1$ may be N, $X_{11}$ may be C-$(L_{34})_{a34}$-$(R_{51})$, $X_{12}$ may be C-$(L_{35})_{a35}$-$(R_{52})$, and $X_{13}$ may be N.

In Formula 5-1, $X_{21}$ may be C-$(L_{44})_{a44}$-$(R_{61})$ or N, $X_{22}$ may be C-$(L_{45})_{a45}$-$(R_{62})$ or N, and $X_{23}$ may be C-$(L_{46})_{a46}$-$(R_{63})$ or N, wherein at least one selected from $X_{21}$ to $X_{23}$ may be N.

In various embodiments, in Formula 5-1, i) $X_{21}$ to $X_{23}$ may each be N, ii) $X_{21}$ and $X_{22}$ may be N, and $X_{23}$ may be C-$(L_{46})_{a46}$-$(R_{63})$, or iii) $X_{21}$ may be N, $X_{22}$ may be C-$(L_{45})_{a45}$-$(R_{62})$, and $X_{23}$ may be C-$(L_{46})_{a46}$-$(R_{63})$.

In Formulae 2-1, 4-2, and 5-2, $A_{41}$, $A_{51}$, and $A_{61}$ may each independently be selected from a $C_5$-$C_{30}$ carbocyclic group and a $C_1$-$C_{30}$ heterocyclic group.

For example, in Formulae 2-1, 4-2, and 5-2, $A_{41}$, $A_{51}$, and $A_{61}$ may each independently be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene.

In various embodiments, in Formulae 2-1, 4-2, and 5-2, $A_{41}$, $A_{51}$, and $A_{61}$ may each independently be selected from a benzene, a naphthalene, an anthracene, and a triphenylene, but are not limited thereto.

In the formulae above, $L_1$ to $L_5$, $L_{11}$, $L_{12}$, $L_{21}$ to $L_{25}$, $L_{31}$ to $L_{36}$, and $L_{41}$ to $L_{46}$ may each independently be selected from:

a group represented by Formula C above, a group represented by Formula D above, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in the formulae above, $L_1$ to $L_5$, $L_{11}$, $L_{12}$, $L_{21}$ to $L_{25}$, $L_{31}$ to $L_{36}$, and $L_{41}$ to $L_{46}$ may each independently be selected from the group consisting of:

a group represented by Formula C above, a group represented by Formula D above, a phenylene group, a pentalenylene group, an indenylene group, a naphthylene group, an azulenylene group, a heptalenylene group, an indacenylene group, an acenaphthylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In various embodiments, in the formulae above, $L_1$ to $L_5$, $L_{11}$, $L_{12}$, $L_{21}$ to $L_{25}$, $L_{31}$ to $L_{36}$, and $L_{41}$ to $L_{46}$ may each independently be selected from a group represented by Formula C above, a group represented by Formula D above, and a group represented by any of Formulae 6-1 to 6-44 below:

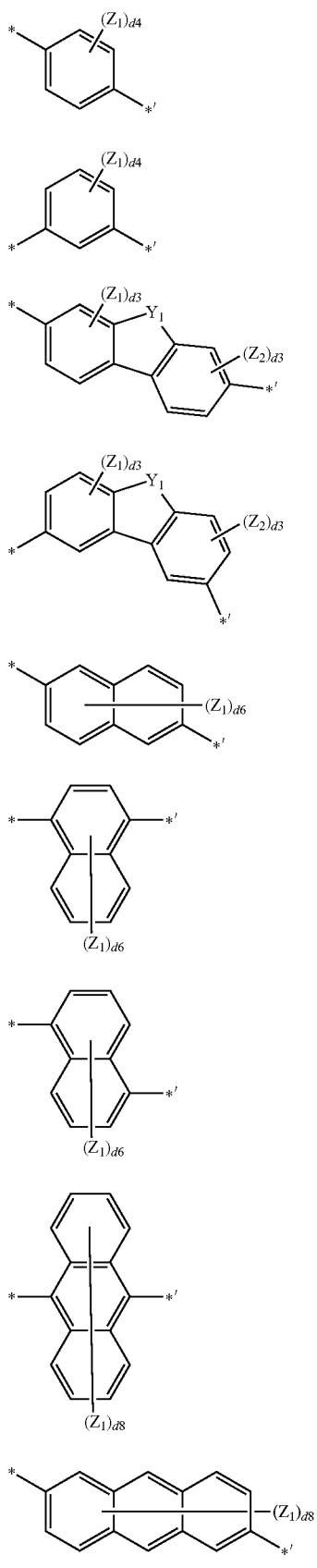

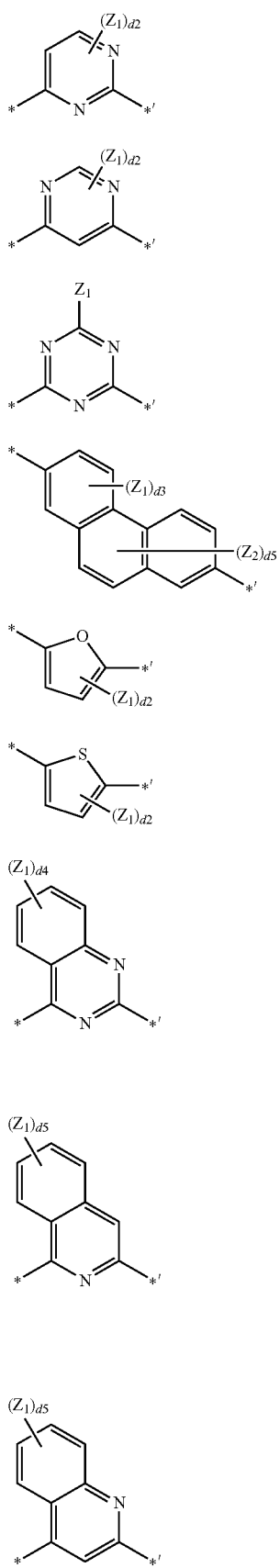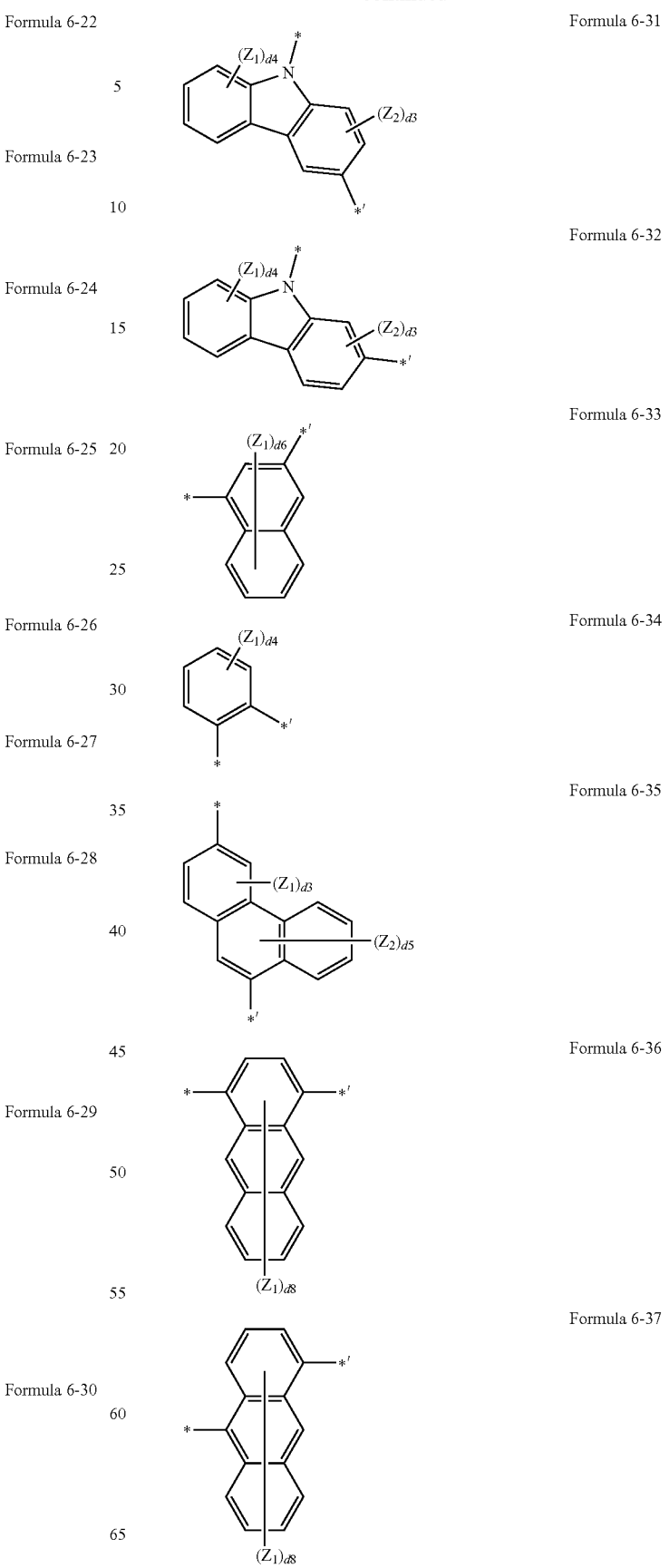

In Formulae 6-1 to 6-44, $Y_1$ may be selected from O, S, N($Z_3$), and Si($Z_4$)($Z_5$), $Z_1$ to $Z_5$ may each independently be selected from hydrogen, deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), wherein $Q_{33}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group, d2 may be 1 or 2, d3 may be an integer selected from 1 to 3, d4 may be an integer selected from 1 to 4, d5 may be an integer selected from 1 to 5, d6 may be an integer selected from 1 to 6, d8 may be an integer selected from 1 to 8, and

* and *' each indicate a binding site with a neighboring atom.

In various embodiments, $L_1$ to $L_5$, $L_{11}$, $L_{21}$ to $L_{25}$, $L_{31}$ to $L_{36}$, and $L_{41}$ to $L_{43}$ may each independently be selected from a group represented by Formula C above, a group represented by Formula D above, and a group represented by any of Formulae 7-1 to 7-39 below:

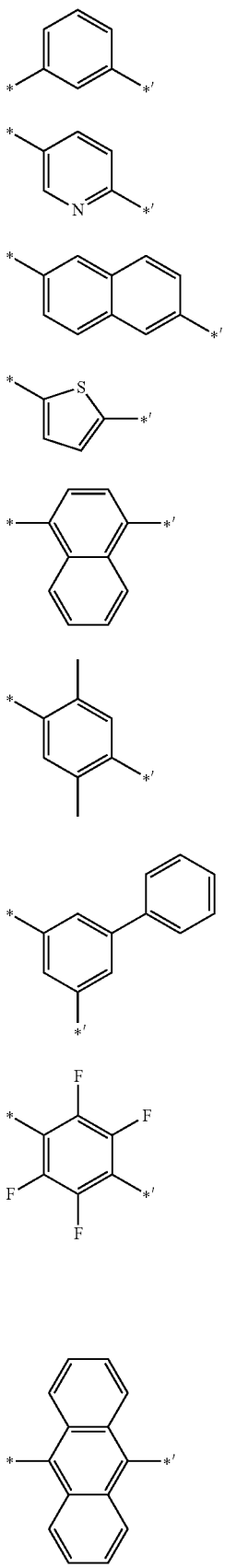
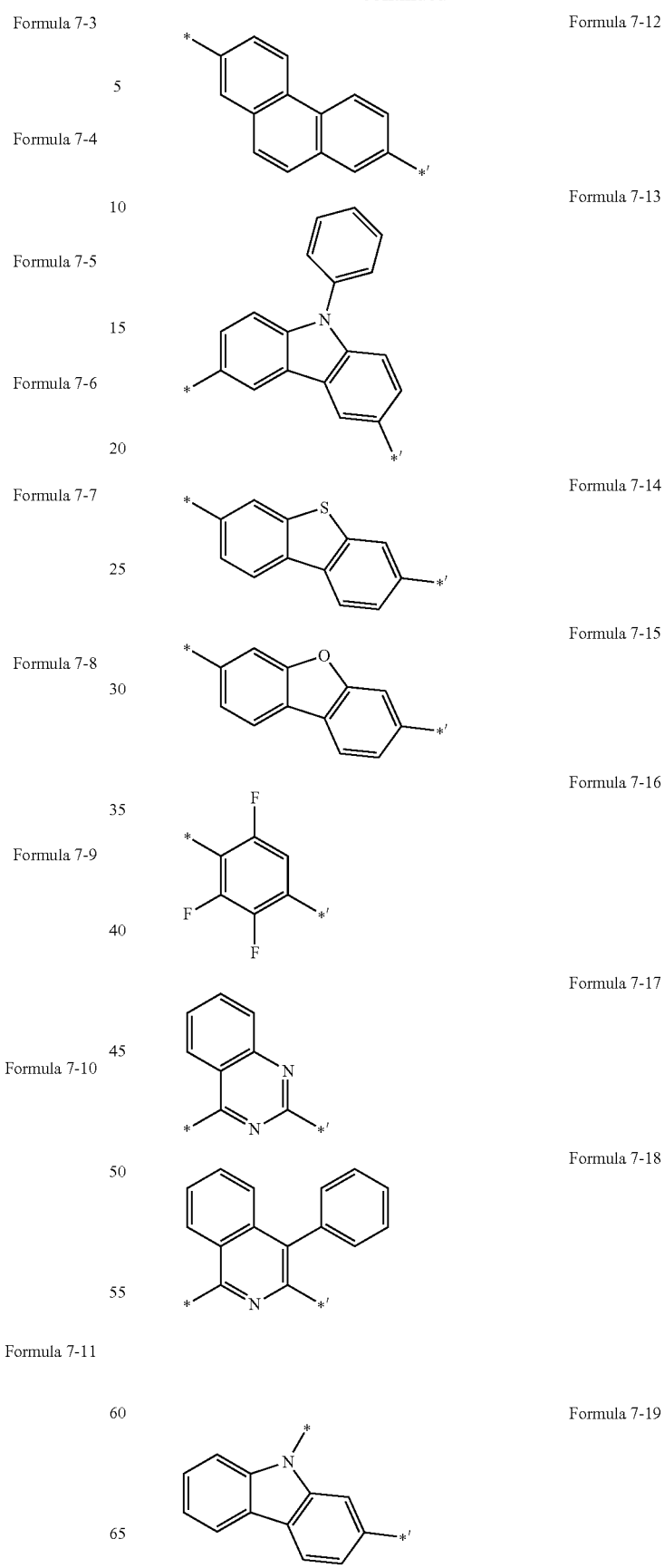
Formula 7-3
Formula 7-4
Formula 7-5
Formula 7-6
Formula 7-7
Formula 7-8
Formula 7-9
Formula 7-10
Formula 7-11
Formula 7-12
Formula 7-13
Formula 7-14
Formula 7-15
Formula 7-16
Formula 7-17
Formula 7-18
Formula 7-19

27
-continued
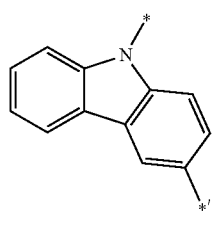
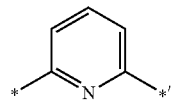
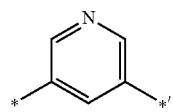
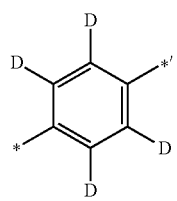
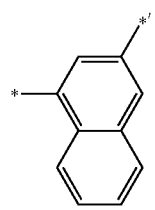
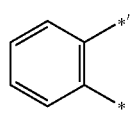
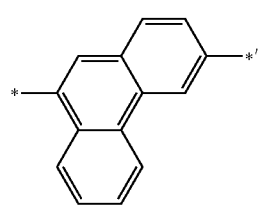
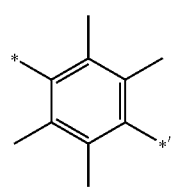
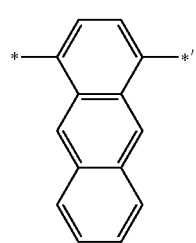
28
-continued
Formula 7-20
Formula 7-21
Formula 7-22
Formula 7-23
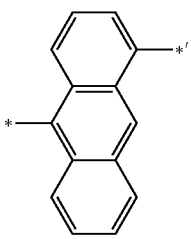
Formula 7-24
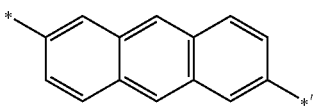
Formula 7-25
Formula 7-26
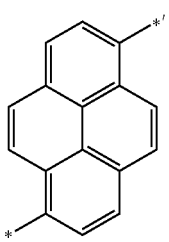
Formula 7-27
Formula 7-28
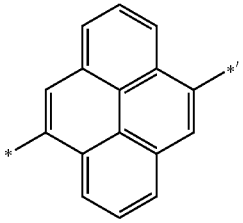
Formula 7-29
Formula 7-30
Formula 7-31
Formula 7-32
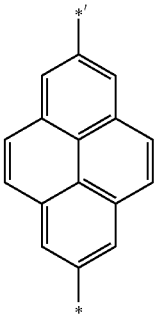
Formula 7-33
Formula 7-34
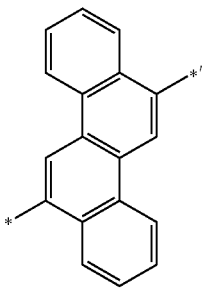

Formula 7-35

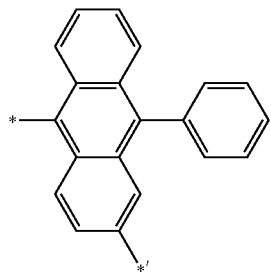

Formula 7-36

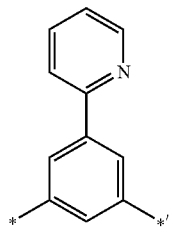

Formula 7-37

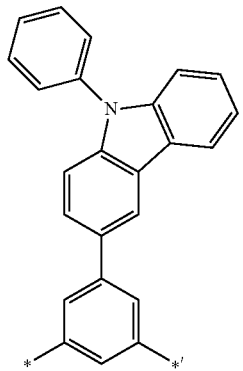

Formula 7-38

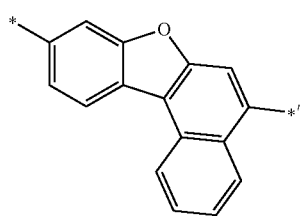

Formula 7-39

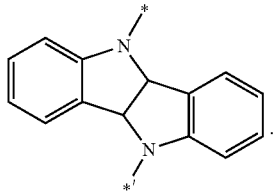

In Formulae 7-1 to 7-39, * and *' each indicate a binding site with a neighboring atom, and "D" may refer to deuterium.

In the formulae above, a1 to a5, a11, a12, a21 to a25, a31 to a36, and a41 to a46 may each independently be an integer selected from 0 to 3. In the formulae above, a1 indicates the number of $L_1$ in Formulae 1-1 and 1-2, wherein when a1 is 0, *-$(L_1)_{a1}$-*' indicates a single bond. When a1 is two or more, two or more $L_1$(s) may be identical to or different from each other. Descriptions of a2 to a5, a11, a12, a21 to a25, a31 to a36, and a41 to a46 may be understood by referring to the descriptions provided herein in connection with the structures of Formulae 1-1, 1-2, 2-1, 2-2, 3-1, 3-2, 4-1 to 4-3, 5-1, and 5-2 and with a1.

In various embodiments, a1 to a4, a11, a12, a21 to a24, a31 to a36, and a41 to a46 may each independently be 0 or 1, and a5 and a25 may each independently be 1 or 2.

In the formulae above, $Ar_1$ to $Ar_4$, $Ar_{11}$, $Ar_{21}$ to $Ar_{24}$, $Ar_{31}$ to $Ar_{33}$, $Ar_{41}$ to $Ar_{43}$, $E_{41}$, and $E_{51}$ may each independently be selected from a group represented by Formula A above, a group represented by Formula B above, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $Ar_1$ to $Ar_4$, $Ar_{11}$, $Ar_{21}$ to $Ar_{24}$, $Ar_{31}$ to $Ar_{33}$, $Ar_{41}$ to $Ar_{43}$, $E_{41}$, and $E_{51}$ may each independently be selected from the group consisting of:

a group represented by Formula A above, a group represented by Formula B above, a phenyl group, a biphenyl group, a terphenyl group, a pentalenyl group, an indenyl group, a naphthyl group, an azulenyl group, a heptalenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group; and a phenyl group, a biphenyl group, a terphenyl group, a pentalenyl group, an indenyl group, a naphthyl group, an azulenyl group, a heptalenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, an azacarbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, an azacarbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, an imidazopyrimidinyl group, and —Si($Q_{31}$)($Q_{32}$)($Q_{33}$), wherein $Q_{31}$ to $Q_{33}$ may each independently be selected from hydrogen, deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

In various embodiments, $Ar_1$ to $Ar_4$, $Ar_{11}$, $Ar_{21}$ to $Ar_{24}$, $Ar_{31}$ to $Ar_{33}$, $Ar_{41}$ to $Ar_{43}$, $E_{41}$, and $E_{51}$ may each independently be selected from a group represented by Formula A above, a group represented by Formula B above, and a group represented by any of Formulae 8-1 to 8-82 below:

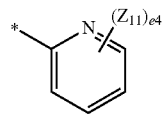

Formula 8-1

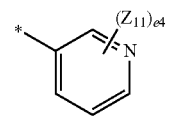

Formula 8-2

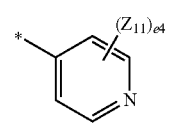

Formula 8-3

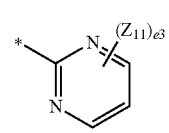

Formula 8-4

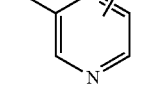

Formula 8-5

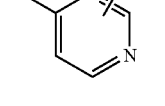

Formula 8-6

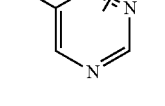

Formula 8-7

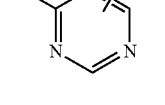

Formula 8-8

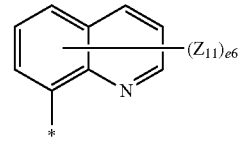

Formula 8-9

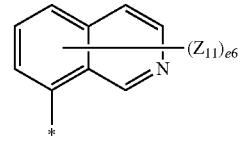

Formula 8-10

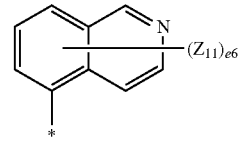

Formula 8-11

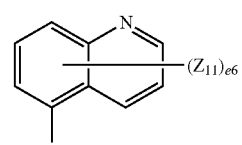

Formula 8-12

33
-continued
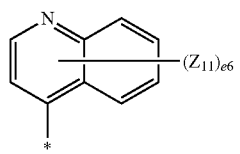
Formula 8-13
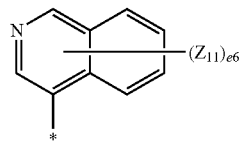
Formula 8-14
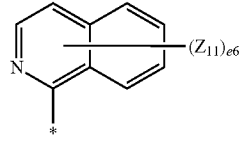
Formula 8-15
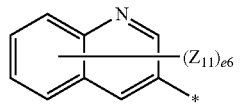
Formula 8-16
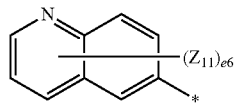
Formula 8-17
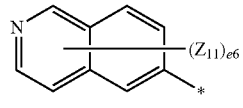
Formula 8-18
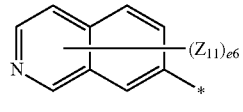
Formula 8-19
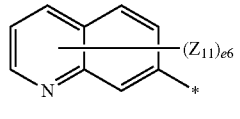
Formula 8-20
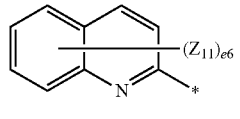
Formula 8-21
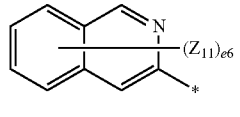
Formula 8-22
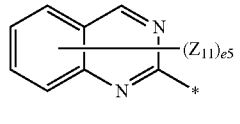
Formula 8-23
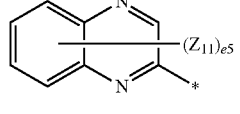
Formula 8-24
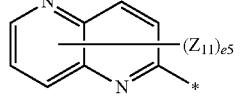
Formula 8-25
34
-continued
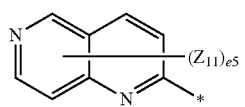
Formula 8-26
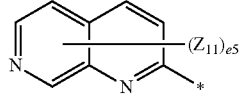
Formula 8-27
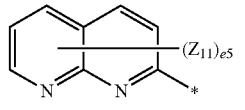
Formula 8-28
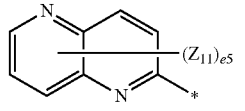
Formula 8-29
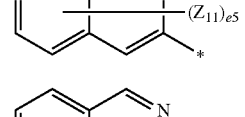
Formula 8-30
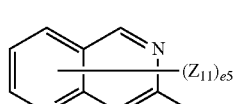
Formula 8-31
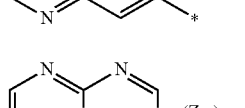
Formula 8-32
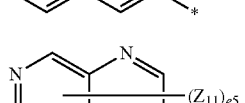
Formula 8-33
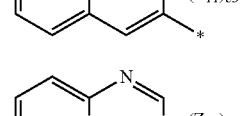
Formula 8-34
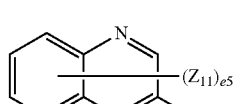
Formula 8-35
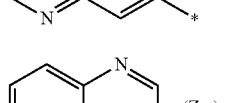
Formula 8-36
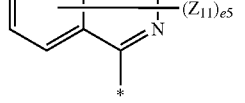
Formula 8-37
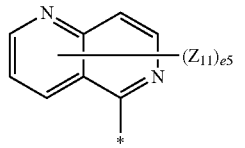
Formula 8-38

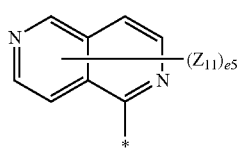
Formula 8-39
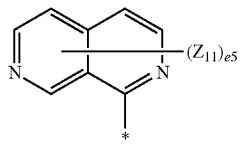
Formula 8-40
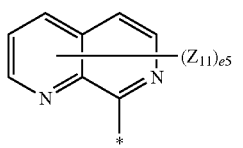
Formula 8-41
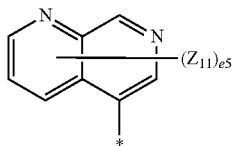
Formula 8-42
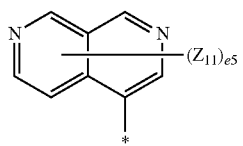
Formula 8-43
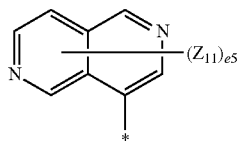
Formula 8-44
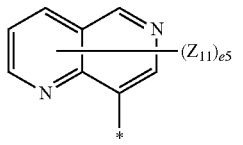
Formula 8-45
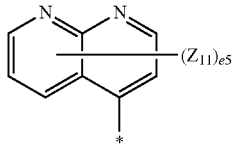
Formula 8-46
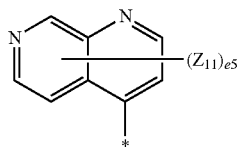
Formula 8-47
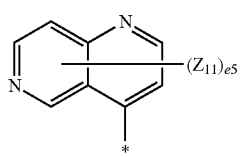
Formula 8-48
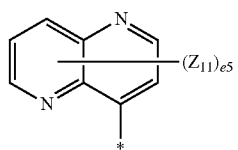
Formula 8-49
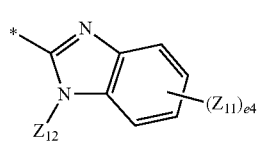
Formula 8-50
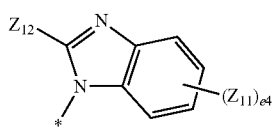
Formula 8-51
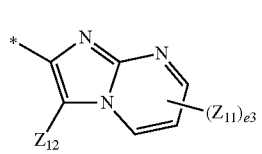
Formula 8-52
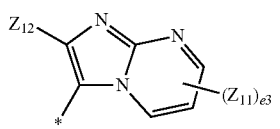
Formula 8-53
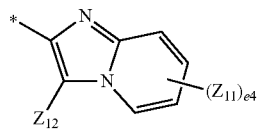
Formula 8-54
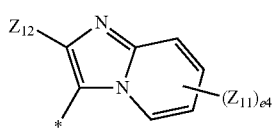
Formula 8-55
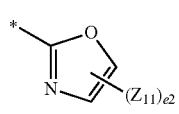
Formula 8-56
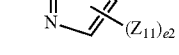
Formula 8-57
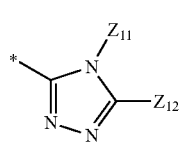
Formula 8-58
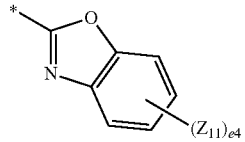
Formula 8-59

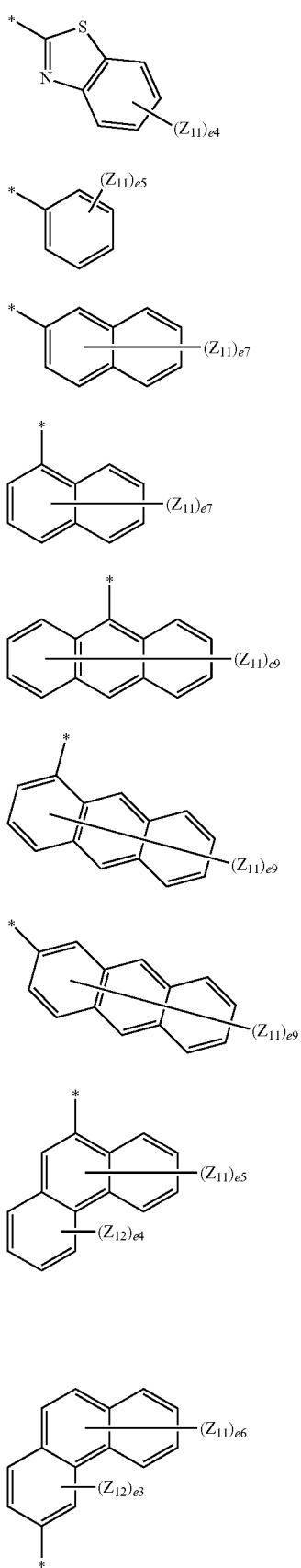
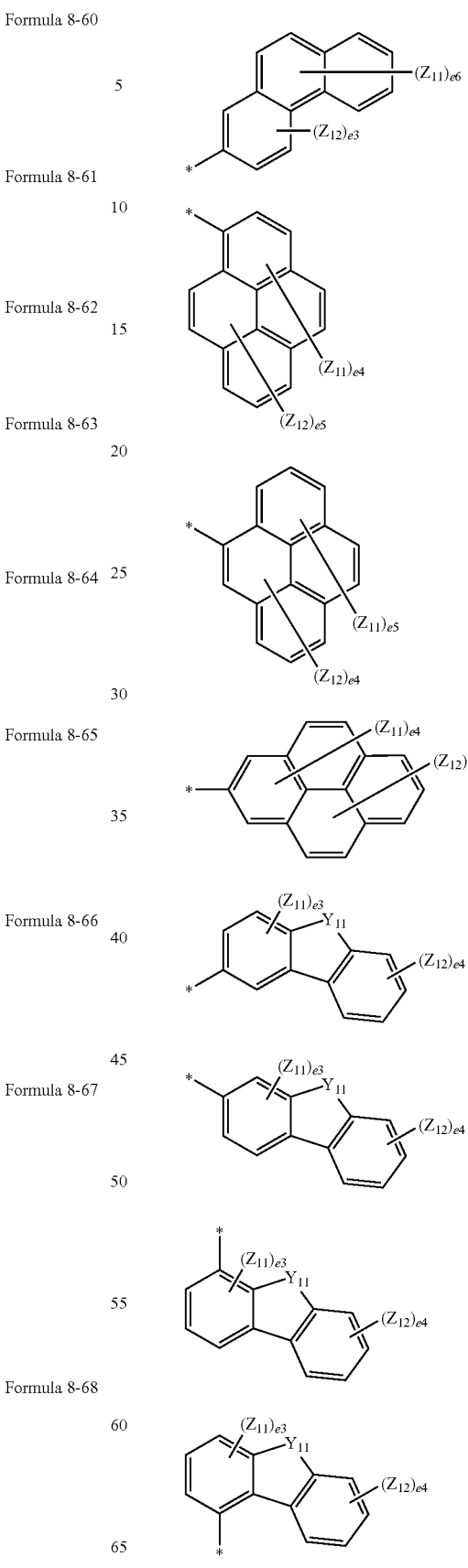

-continued

Formula 8-77
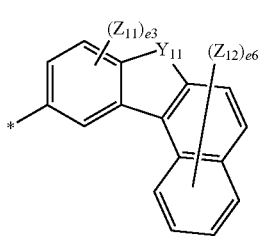

Formula 8-78
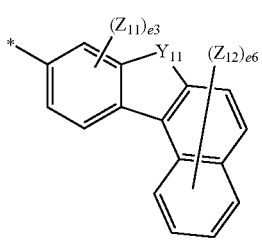

Formula 8-79
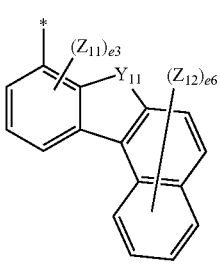

Formula 8-80
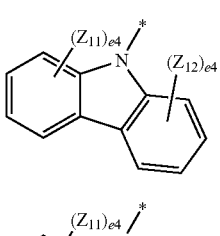

Formula 8-81
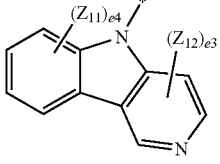

Formula 8-82
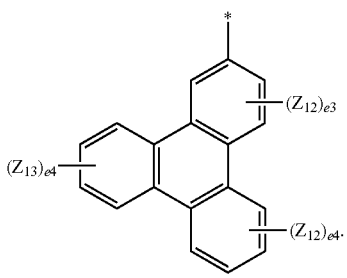

In Formulae 8-1 to 8-82, $Y_{11}$ may be selected from O, S, $N(Z_{14})$, and $Si(Z_{15})(Z_{16})$, $Z_{11}$ to $Z_{16}$ may each independently be selected from hydrogen, deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group, e2 may be 1 or 2, e3 may be an integer selected from 1 to 3, e4 may be an integer selected from 1 to 4, e5 may be an integer selected from 1 to 5, e6 may be an integer selected from 1 to 6, e7 may be an integer selected from 1 to 7, e9 may be an integer selected from 1 to 9, and \* indicates each indicate a binding site with a neighboring atom.

In various embodiments, in the formulae above, $Ar_1$ to $Ar_4$, $Ar_{11}$, $Ar_{21}$ to $Ar_{24}$, $Ar_{31}$ to $Ar_{33}$, $Ar_{41}$ to $Ar_{43}$, $E_{41}$, and $E_{51}$ may each independently be selected from a group represented by Formula A above, a group represented by Formula B above, and a group represented by any of Formulae 9-1 to 9-161 below:

Formula 9-1
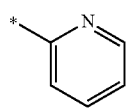

Formula 9-2
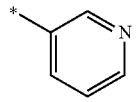

Formula 9-3
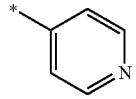

Formula 9-4
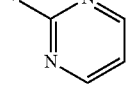

Formula 9-5
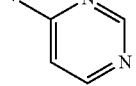

Formula 9-6
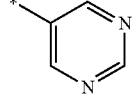

Formula 9-7
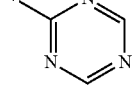

Formula 9-8

Formula 9-9

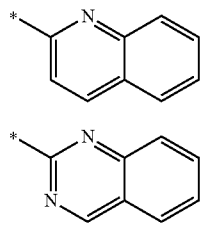

Formula 9-10
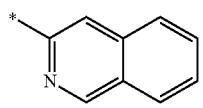
Formujla 9-11
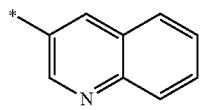
Formula 9-12
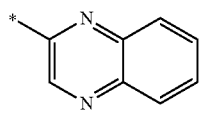
Formula 9-13
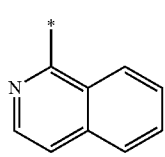
Formula 9-14
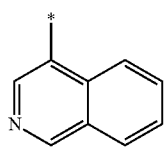
Formula 9-15
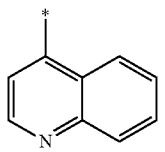
Formula 9-16
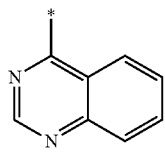
Formula 9-17
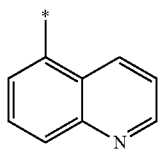
Formula 9-18
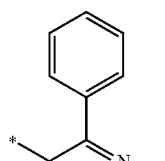
Formula 9-19
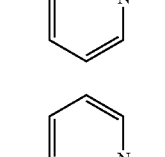
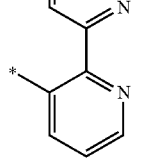
Formula 9-20
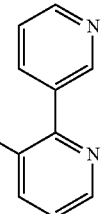
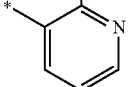
Formula 9-21
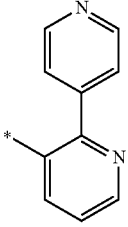
Formula 9-22
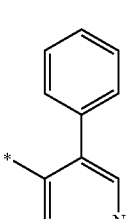
Formula 9-23
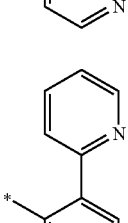
Formula 9-24
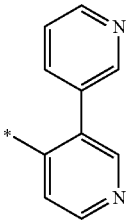
Formula 9-25
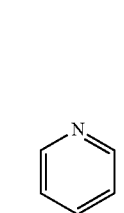

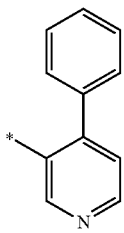
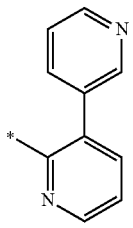
Formula 9-26
Formula 9-27
Formula 9-28
Formula 9-29
Formula 9-30
Formula 9-31
Formula 9-32
Formula 9-33
Formula 9-34
Formula 9-35
Formula 9-36
Formula 9-37

Formula 9-38
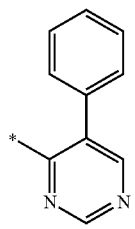
Formula 9-39
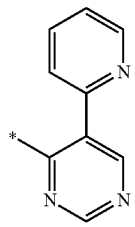
Formula 9-40
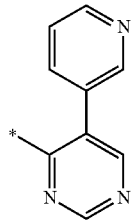
Formula 9-41
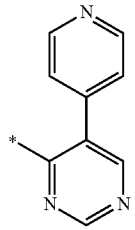
Formula 9-42
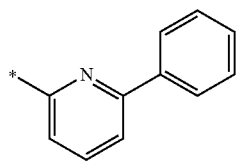
Formula 9-43
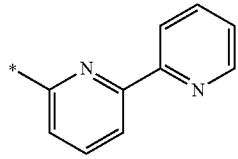
Formula 9-44
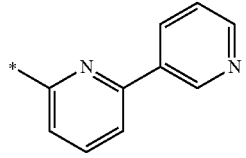
Formula 9-45
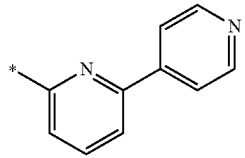
Formula 9-46
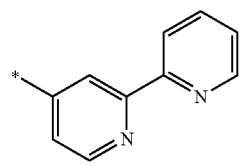
Formula 9-47
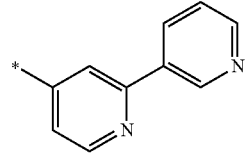
Formula 9-48
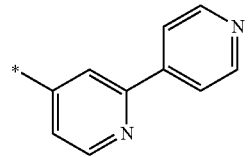
Formula 9-49
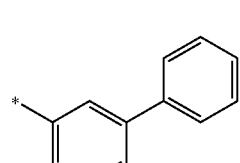
Formula 9-50
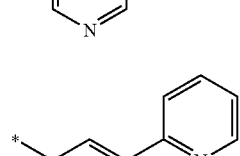
Formula 9-51
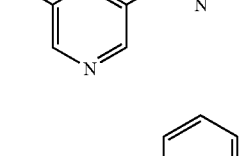
Formula 9-52
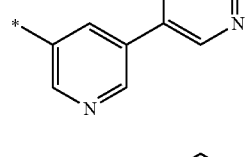
Formula 9-53
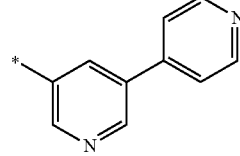
Formula 9-54
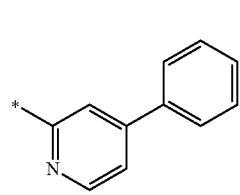

Formula 9-55
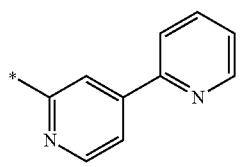
Formula 9-56
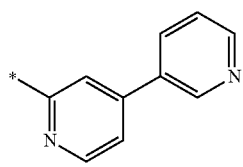
Formula 9-57
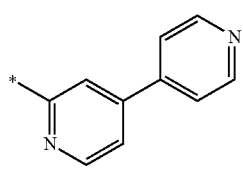
Formula 9-58
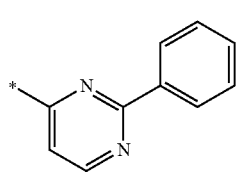
Formula 9-59
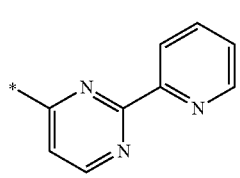
Formula 9-60
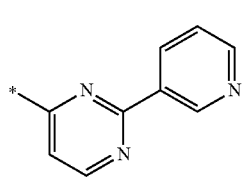
Formula 9-61
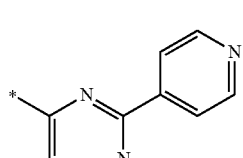
Formula 9-62
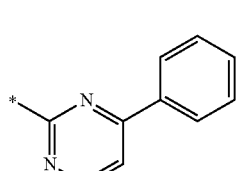
Formula 9-63
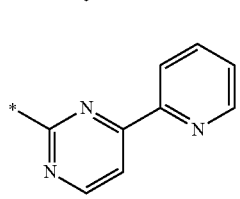
Formula 9-64
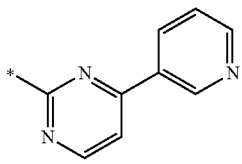
Formula 9-65
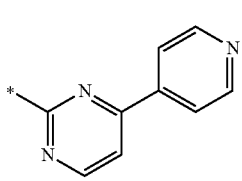
Formula 9-66
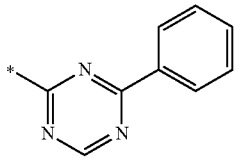
Formula 9-67
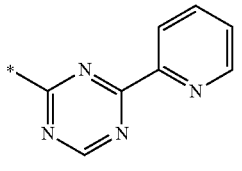
Formula 9-68
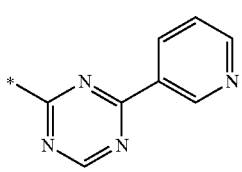
Formula 9-69
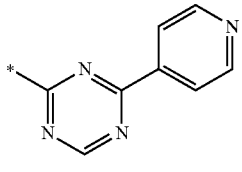
Formula 9-70
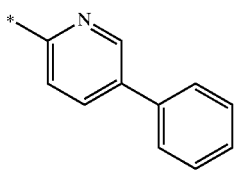
Formula 9-71
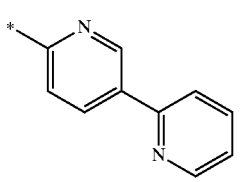
Formula 9-72
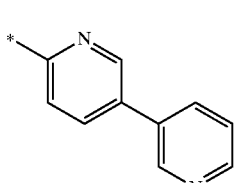

Formula 9-73

Formula 9-74

Formula 9-75

Formula 9-76

Formula 9-77

Formula 9-78

Formula 9-79

Formula 9-80

Formula 9-81

Formula 9-82

Formula 9-83

Formula 9-84

Formula 9-85

Formula 9-86

Formula 9-87

Formula 9-88

Formula 9-89
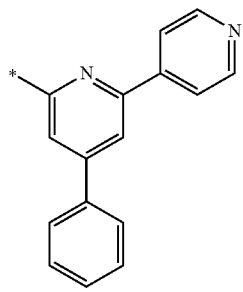
Formula 9-90
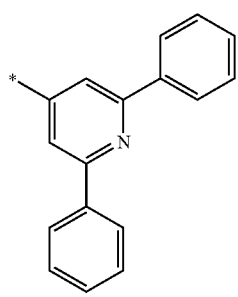
Formula 9-91
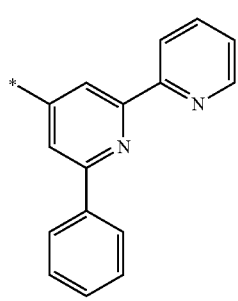
Formula 9-92
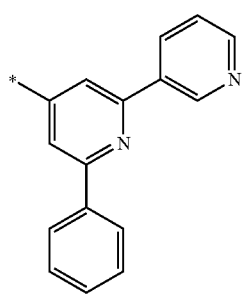
Formula 9-93
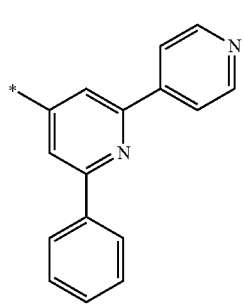
Formula 9-94
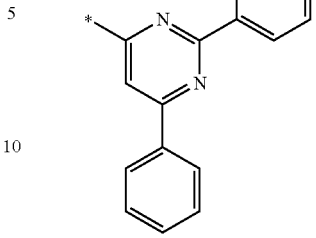
Formula 9-95
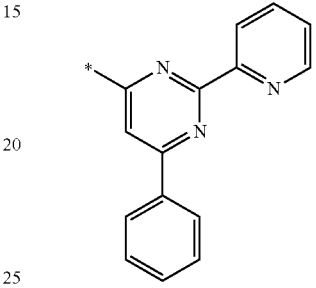
Formula 9-96
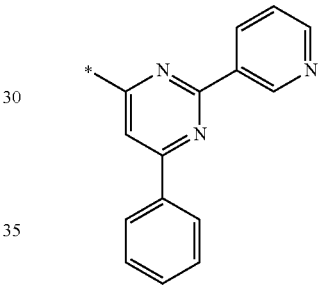
Formula 9-97
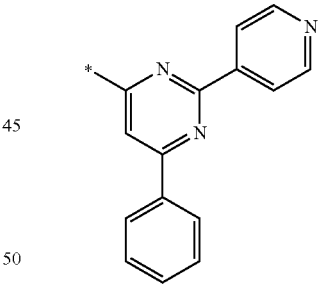
Formula 9-98
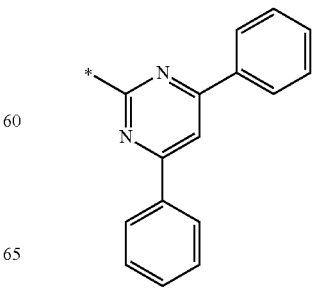

Formula 9-99
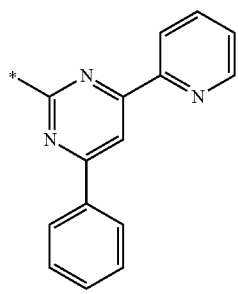
Formula 9-100
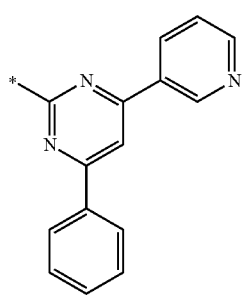
Formula 9-101
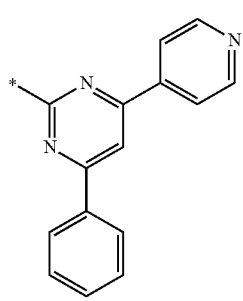
Formula 9-102
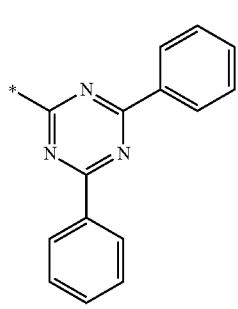
Formula 9-103
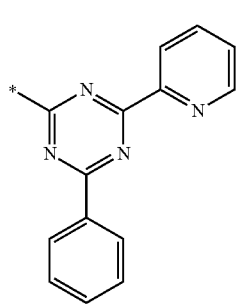
Formula 9-104
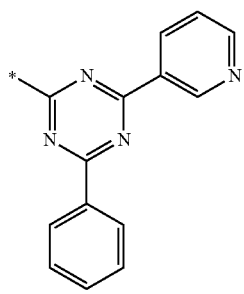
Formula 9-105
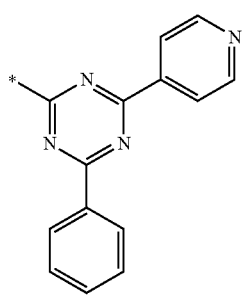
Formula 9-106
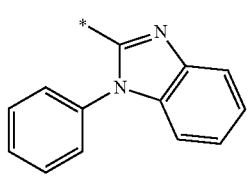
Formula 9-107
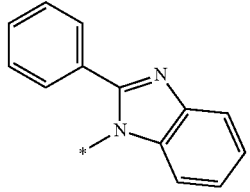
Formula 9-108
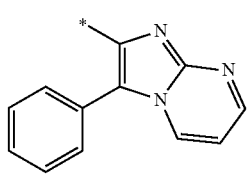
Formula 9-109
Formula 9-110
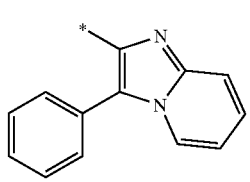

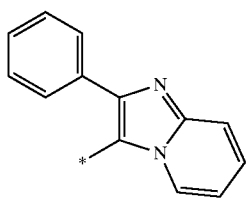
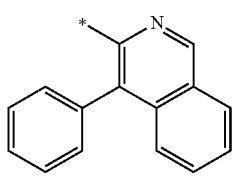
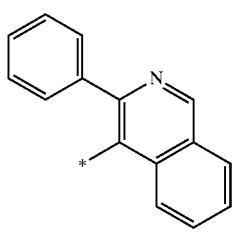
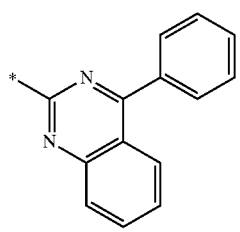
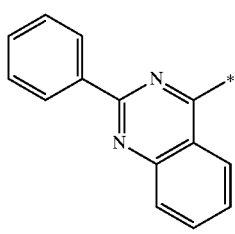
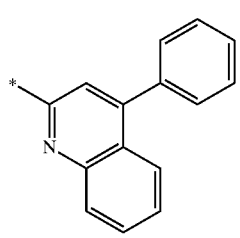
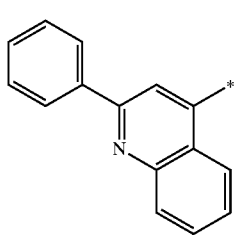
Formula 9-111
Formula 9-112
Formula 9-113
Formula 9-114
Formula 9-115
Formula 9-116
Formula 9-117
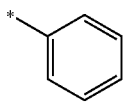 Formula 9-118
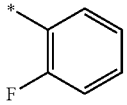 Formula 9-119
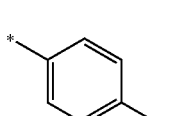 Formula 9-120
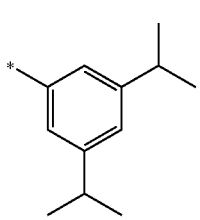 Formula 9-121
Formula 9-122
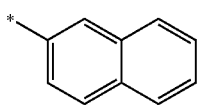
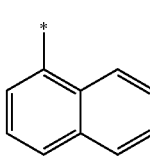 Formula 9-123
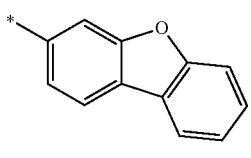 Formula 9-124
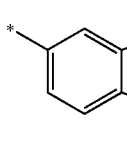 Formula 9-125
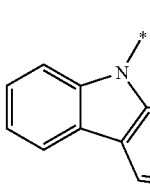 Formula 9-126
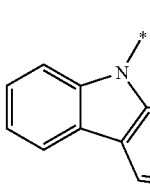 Formula 9-127

Formula 9-128
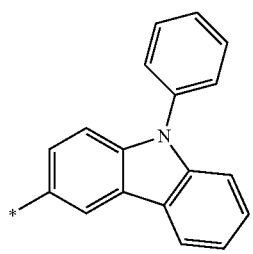
Formula 9-129
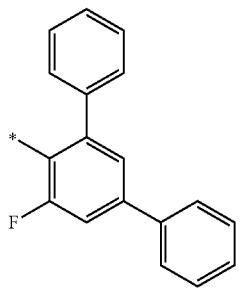
Formula 9-130
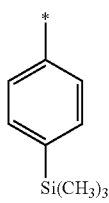
Formula 9-131
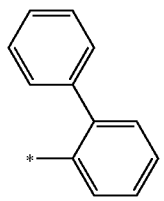
Formula 9-132
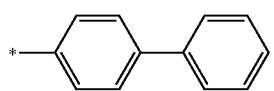
Formula 9-133
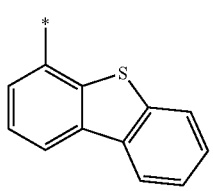
Formula 9-134
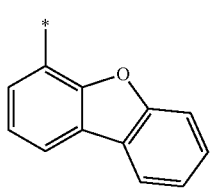
Formula 9-135
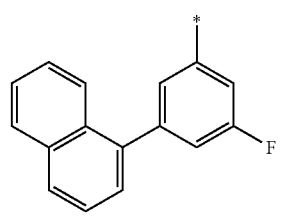
Formula 9-136
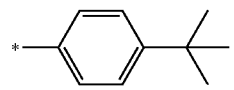
Formula 9-137
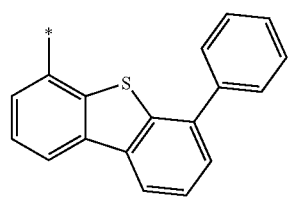
Formula 9-138
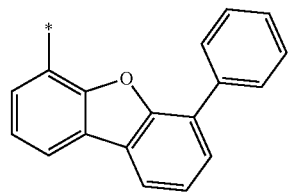
Formula 9-139
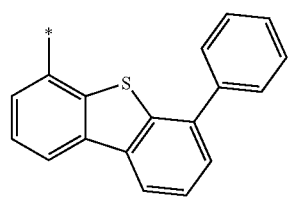
Formula 9-140
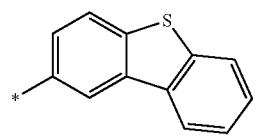
Formula 9-141
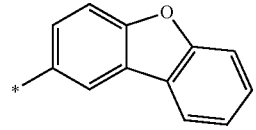
Formula 9-142
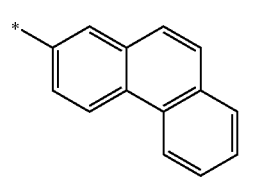
Formula 9-143
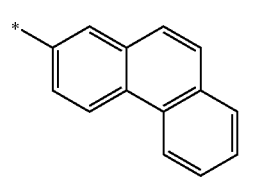

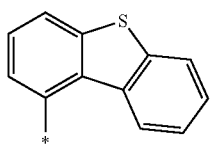
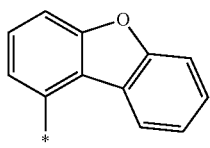
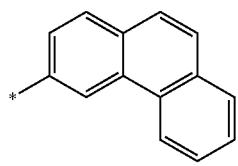
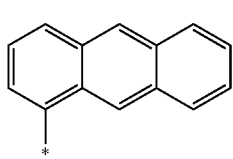
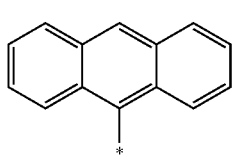
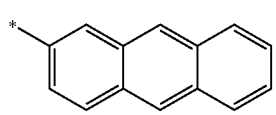
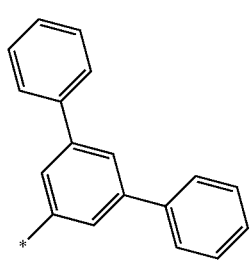
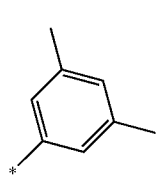
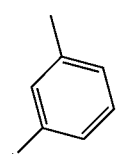
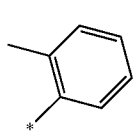
Formula 9-144
Formula 9-145
Formula 9-146
Formula 9-147
Formula 9-148
Formula 9-149
Formula 9-150
Formula 9-151
Formula 9-152
Formula 9-153
Formula 9-154
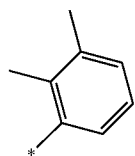
Formula 9-155
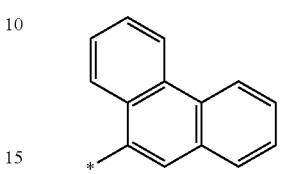
Formula 9-156
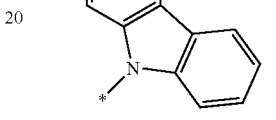
Formula 9-157
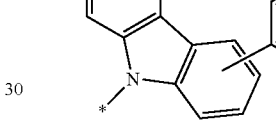
Formula 9-158
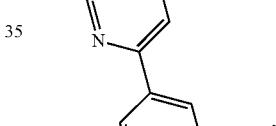
Formula 9-159
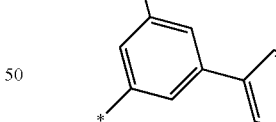
Formula 9-160
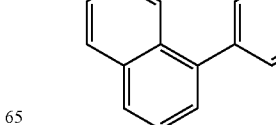

Formula 9-161

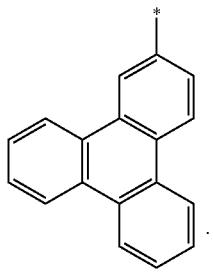

In Formulae 9-1 to 9-161, * indicates a binding site with a neighboring atom, and "D" may refer to deuterium.

In Formula 1-2, $Ar_1$ and $Ar_2$ may optionally be linked to each other to form a saturated or unsaturated ring, and $Ar_3$ and $Ar_4$ may optionally be linked to each other to form a saturated or unsaturated ring.

In various embodiments, i) at least one selected from $Ar_1$ to $Ar_3$ in Formula 1-1 may be selected from groups represented by Formulae A and B, or ii) at least one selected from $L_1$ to $L_3$ in Formula 1-1 may be selected from groups represented by Formulae C and D.

In various embodiments, i) at least one selected from $Ar_1$ to $Ar_4$ in Formula 1-2 may be selected from groups represented by Formulae A and B, or ii) $L_5$ in Formula 1-2 may be selected from groups represented by Formulae C and D.

In various embodiments, i) $Ar_{11}$ in Formula 2-1 may be selected from groups represented by Formulae A and B, ii) at least one selected from $L_{11}$ and $L_{12}$ in Formula 2-1 may be selected from groups represented by Formulae C and D, iii) $L_{11}$ in Formula 2-2 may be selected from groups represented by Formulae C and D, iv) at least one selected from $L_{21}$ to $L_{23}$ in Formula 3-1 may be selected from groups represented by Formulae C and D, v) at least one selected from $Ar_{21}$ to $Ar_{23}$ in Formula 3-1 may be selected from groups represented by Formulae A and B, vi) $L_{25}$ in Formula 3-2 may be selected from groups represented by Formulae C and D, vii) at least one selected from $Ar_{21}$ to $Ar_{24}$ in Formula 3-2 may be selected from groups represented by Formulae A and B, or viii) $Ar_{11}$ in Formula 2-1 may be selected from groups represented by Formulae A and B, at least one selected from $L_{11}$ and $L_{12}$ in Formula 2-1 may be selected from groups represented by Formulae C and D, $L_{11}$ in Formula 2-2 may be selected from groups represented by Formulae C and D, at least one selected from $L_{21}$ to $L_{23}$ in Formula 3-1 may be selected from groups represented by Formulae C and D, at least one selected from $Ar_{21}$ to $Ar_{23}$ in Formula 3-1 may be selected from groups represented by Formulae A and B, $L_{25}$ in Formula 3-2 may be selected from groups represented by Formulae C and D, and at least one selected from $Ar_{21}$ to $Ar_{24}$ in Formula 3-2 may be selected from groups represented by Formulae A and B.

For example, when $Ar_{11}$ in Formula 2-1 is selected from groups represented by Formulae A and B, when at least one selected from $L_{11}$ and $L_{12}$ in Formula 2-1 is selected from groups represented by Formulae C and D, or when $L_{11}$ in Formula 2-2 is selected from groups represented by Formulae C and D, i) at least one selected from $L_{21}$ to $L_{23}$ in Formula 3-1 may be selected from groups represented by Formulae C and D, ii) at least one selected from $Ar_{21}$ to $Ar_{23}$ in Formula 3-1 may be selected from groups represented by Formulae A and B, iii) $L_{25}$ in Formula 3-2 may be selected from groups represented by Formulae C and D, iv) at least one selected from $Ar_{21}$ to $Ar_{24}$ in Formula 3-2 may be selected from groups represented by Formulae A and B, or v) at least one selected from $L_{21}$ to $L_{23}$ in Formula 3-1 may not be selected from groups represented by Formulae C and D, at least one selected from $Ar_{21}$ to $Ar_{23}$ in Formula 3-1 may not be selected from groups represented by Formulae A and B, $L_{25}$ in Formula 3-2 may not be selected from groups represented by Formulae C and D, and at least one selected from $Ar_{21}$ to $Ar_{24}$ in Formula 3-2 may not be selected from groups represented by Formulae A and B.

In some embodiments, when $Ar_{11}$ in Formula 2-1 is not selected from groups represented by Formulae A and B, when at least one selected from $L_{11}$ and $L_{12}$ in Formula 2-1 is not selected form groups represented by Formulae C and D, or when $L_{11}$ in Formula 2-2 is not selected from groups represented by Formulae C and D, i) at least one selected from $L_{21}$ to $L_{23}$ in Formula 3-1 may be selected from groups represented by Formulae C and D, ii) at least one selected from $Ar_{21}$ to $Ar_{23}$ in Formula 3-1 may be selected from groups represented by Formulae A and B, iii) $L_{25}$ in Formula 3-2 may be selected from groups represented by Formulae C and D, or iv) at least one selected from $Ar_{21}$ to $Ar_{24}$ in Formula 3-2 may be selected from groups represented by Formulae A and B.

That is, embodiments in which $Ar_{11}$ in Formula 2-1 is not selected from groups represented by Formulae A and B, at least one selected from $L_{11}$ and $L_{12}$ in Formula 2-1 is not selected from groups represented by Formulae C and D, $L_{11}$ in Formula 2-2 is not selected from groups represented by Formulae C and D, at least one selected from $L_{21}$ to $L_{23}$ in Formula 3-1 is not selected from groups represented by Formulae C and D, at least one selected from $Ar_{21}$ to $Ar_{23}$ in Formula 3-1 is not selected from groups represented by Formulae A and B, $L_{25}$ in Formula 3-2 is not selected from groups represented by Formulae C and D, and at least one selected from $Ar_{21}$ to $Ar_{24}$ in Formula 3-2 is not selected from groups represented by Formulae A and B, are excluded.

At least one selected from $Ar_{31}$ to $Ar_{33}$ in Formula 4-1 may be selected from groups represented by Formulae A and B.

In Formula 4-2, $Ar_{31}$ may be selected from groups represented by Formulae A and B, and $E_{41}$ may include, as a ring-forming moiety, a nitrogen-containing heterocyclic group including *=N—*'.

In Formula 4-3, $Ar_{31}$ may be selected from groups represented by Formulae A and B, and $E_{41}$ may include, as a ring-forming moiety, a nitrogen-containing heterocyclic group including *=N—*'.

In Formula 5-2, $E_{51}$ may include, as a ring-forming moiety, a nitrogen-containing heterocyclic group including *=N—*'.

The first compound represented by Formulae 1-1 or 1-2 and the fourth compound represented by Formulae 4-1 to 4-3 may include a group selected from groups represented by Formulae A to D, and at least one selected from the second compound represented by Formulae 2-1 or 2-2 and the third compound represented by Formulae 3-1 or 3-2 may include a group selected from groups represented by Formulae A to D.

In Formulae 4-2, 4-3, and 5-2, $E_{41}$ and $E_{51}$ may each independently include, as a ring-forming moiety, a nitrogen-containing heterocyclic group including *=N—*'.

For example, $E_{41}$ and $E_{51}$ may each independently be selected from the group consisting of:
a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a phenanthrenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, and a benzoxazolyl group.

In various embodiments, $E_{41}$ and $E_{51}$ may each independently be selected from groups represented by Formulae 8-1 to 8-60 above.

In various embodiments, $E_{41}$ and $E_{51}$ may each independently be selected from groups represented by Formulae 9-1 to 9-117 above.

In the formulae above, $R_{41}$, $R_{51}$ to $R_{53}$, $R_{61}$ to $R_{63}$, and $R_{71}$ may each independently be selected from:

hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), wherein $Q_1$ to $Q_3$ may each independently be selected from a $C_1$-$C_{10}$ alkyl group, a $C_1$-$C_{10}$ alkoxy group, a phenyl group, a biphenyl group, a terphenyl group, and a naphthyl group.

For example, $R_{41}$, $R_{51}$ to $R_{53}$, $R_{61}$ to $R_{63}$, and $R_{71}$ may each independently be selected from the group consisting of:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{31}$)($Q_{32}$)($Q_{33}$), and —Si($Q_1$)($Q_2$)($Q_3$), wherein $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, $R_{41}$, $R_{51}$ to $R_{53}$, $R_{61}$ to $R_{63}$, and $R_{71}$ may each independently be selected from the group consisting of:

hydrogen, deuterium, —F, —Cl, —Br, —I, a hydroxyl group, a cyano group, a nitro group, a $C_1$-$C_{10}$ alkyl group, and a $C_1$-$C_{10}$ alkoxy group, a phenyl group, a biphenyl group, a terphenyl group, a naphthyl group, a pyridinyl group, a pyrimidinyl group, a triazinyl group, and a carbazolyl group, a phenyl group, a naphthyl group, a pyridinyl group, a pyrimidinyl group, a triazinyl group, and a carbazolyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a triazinyl group, and —Si$(Q_{31})(Q_{32})(Q_{33})$; and —Si$(Q_1)(Q_2)(Q_3)$, wherein $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In Formula 2-2, c41 may be an integer selected from 0 to 10. In Formula 2-2, c41 indicates the number of $R_{41}$ in Formula 2-2, wherein when c41 is two or more, two or more $R_{41}$(s) may be identical to or different from each other.

In various embodiments, c41 may be 0, 1, or 2.

In Formulae 2-1, 4-2, 4-3, and 5-2, n11, n12, n21, n22, n31, and n32 may each independently be an integer of 0 to 10. In Formula 2-1, n11 indicates the number of *-$(L_{11})_{a11}$-$Ar_{11}$, wherein when n11 is two or more, two or more *-$(L_{11})_{a11}$-$Ar_{11}$(s) may be identical to or different from each other. Descriptions of n12, n21, n22, n31, and n32 may be understood by referring to the description provided herein in connection with n11 and the corresponding structures of Formulae 2-1, 4-2, 4-3, and 5-2.

In various embodiments, n11, n21, n22, and n31 may be 1 or 2, and n32 may be 0 or 1.

In various embodiments, the first compound may be selected from compounds represented by Formulae 1-1(1) to 1-1(5) and 1-2(1) to 1-2(3) below, the second compound may be selected from compounds represented by Formulae 2-1(1) and 2-2(1) to 2-2(4) below, the third compound may be selected from compounds represented by Formulae 3-1(1) and 3-2(1) to 3-2(8) below, the fourth compound may be selected from compounds represented by Formulae 4-1(1) to 4-1(3), 4-2(1), and 4-3(1) below, and the fifth compound may be selected from compounds represented by Formulae 5-1(1), 5-1(2), and 5-2(1) below:

Formula 1-1(1)
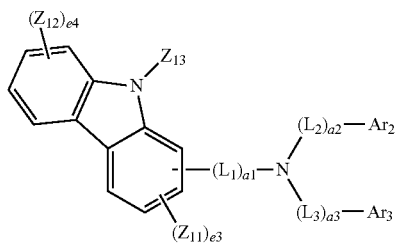

Formula 1-1(2)
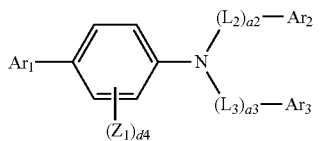

Formula 1-1(3)
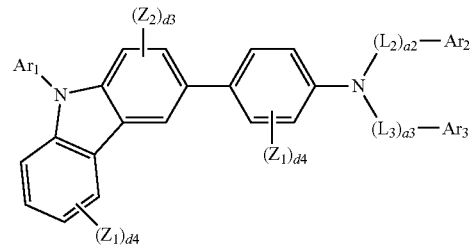

Formula 1-1(4)
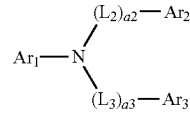

Formula 1-1(5)
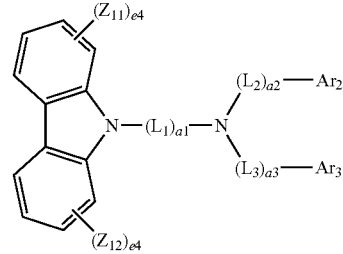

Formula 1-2(1)
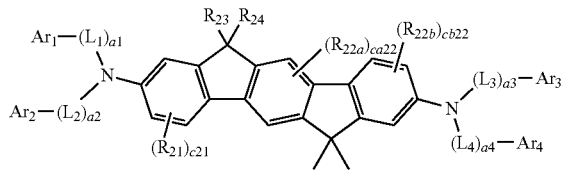

Formula 1-2(2)
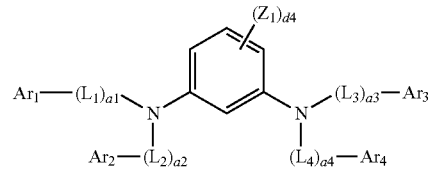

Formula 1-2(3)
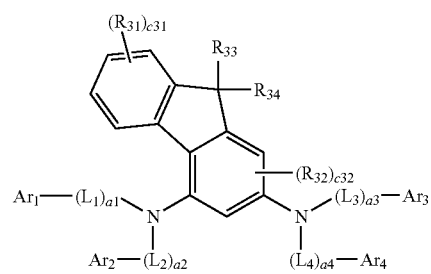

Formula 2-1(1)
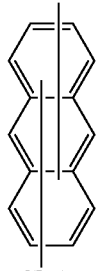
Formula 2-2(1)
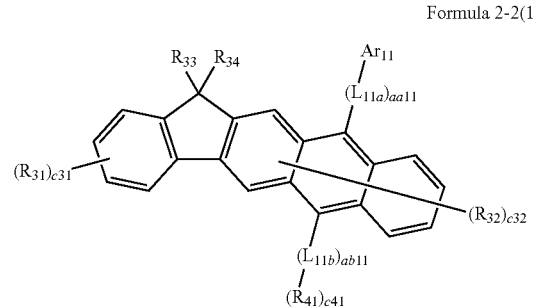
Formula 2-2(2)
Formula 2-2(3)
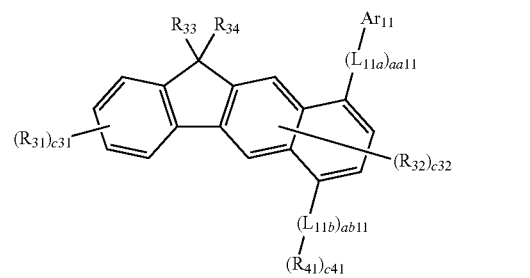
Formula 2-2(4)
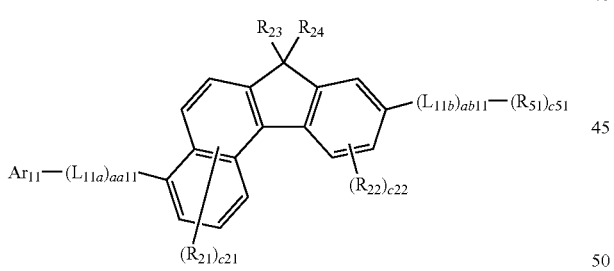
Formula 3-1(1)
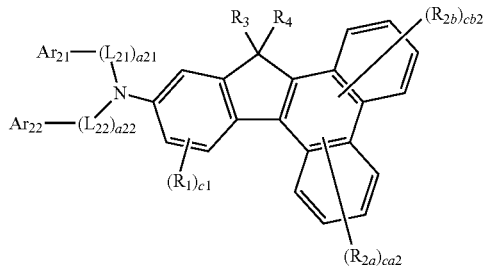
Formula 3-2(1)
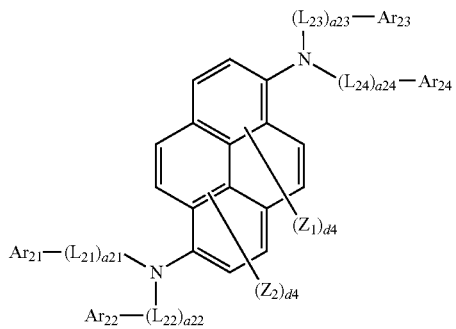
Formula 3-2(2)
Formula 3-2(3)
Formula 3-2(4)

-continued

Formula 3-2(5)
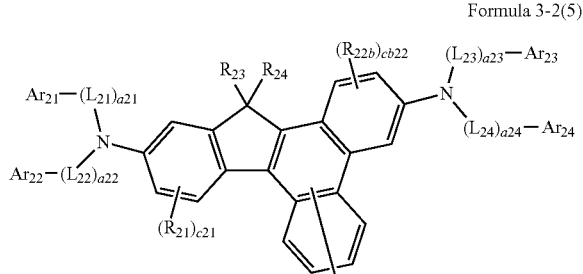

Formula 3-2(6)
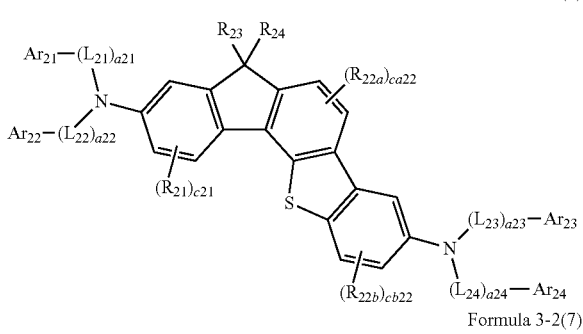

Formula 3-2(7)
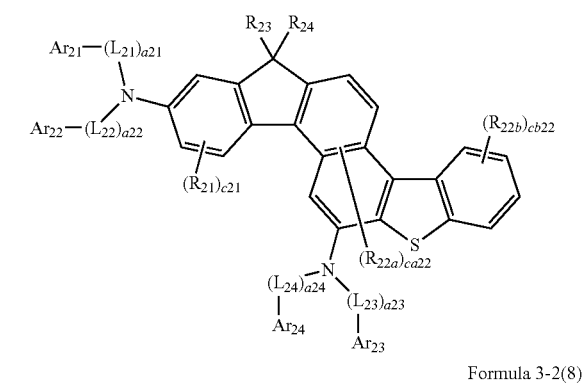

Formula 3-2(8)
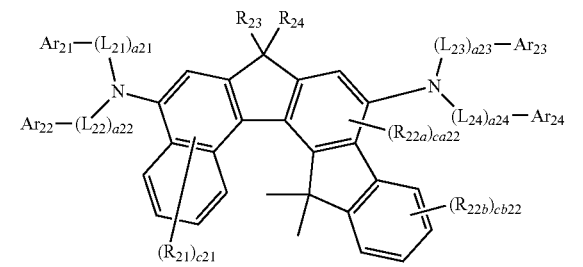

Formula 4-1(1)
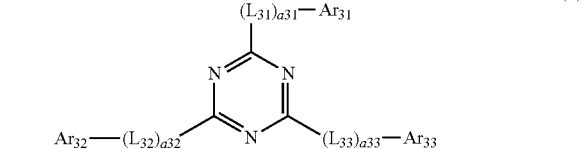

Formula 4-1(2)

-continued

Formula 4-1(3)
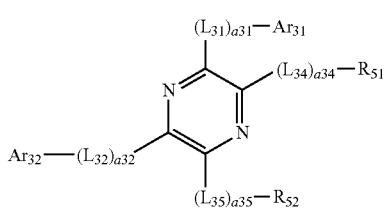

Formula 4-2(1)
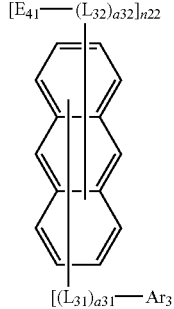

Formula 4-3(1)
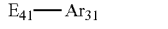

Formula 5-1(1)
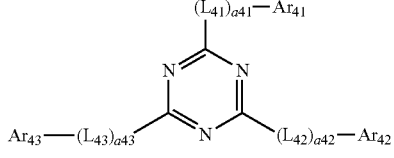

Formula 5-1(2)
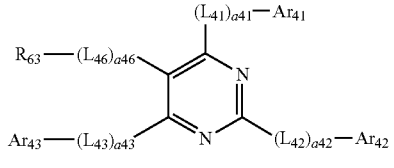

Formula 5-2(1)
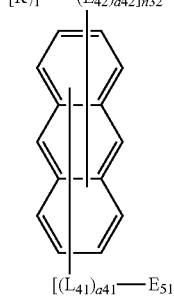

In the formulae above, descriptions of $L_1$ to $L_4$, $L_{11}$, $L_{12}$, $L_{21}$ to $L_{24}$, $L_{31}$ to $L_{35}$, $L_{41}$ to $L_{43}$, $L_{46}$, a1 to a4, a11, a12, a21 to a24, a31 to a35, a41 to a43, a46, $Ar_1$ to $Ar_4$, $Ar_{11}$, $Ar_{21}$ to $Ar_{24}$, $Ar_{31}$ to $Ar_{35}$, $Ar_{41}$ to $Ar_{43}$, $E_{41}$, $E_{51}$, $R_1$, $R_{2a}$, $R_{2b}$, $R_3$, $R_4$, $R_{21}$ to $R_{24}$, $R_{22a}$, $R_{22b}$, $R_{31}$ to $R_{34}$, $R_{41}$, $R_{52}$, $R_{63}$, $R_{71}$, c1, c21, c22, ca22, cb22, c31, c32, c41, n21, n22, n31, n32, $Y_1$, $Z_1$ to $Z_5$, $Z_{11}$ to $Z_{13}$, d3, d4, d5, d8, e3, and e4 may be understood by referring to the descriptions thereof provided herein.

Descriptions of $L_{11a}$ and $L_{11b}$ may be understood by referring to the descriptions provided herein in connection with $L_{11}$.

Descriptions of aa11 and ab11 may be understood by referring to the descriptions provided herein in connection with a11.

In various embodiments, the first compound may be one of Compounds 1-1 to 1-20 below, the second compound may be one of Compounds 2-1 to 2-19 below,
the third compound may be one of Compounds 3-1 to 3-18 below,
the fourth compound may be one of Compounds 4-1 to 4-19 below, and
the fifth compound may be one of Compounds 5-1 to 5-9 below:
1-1
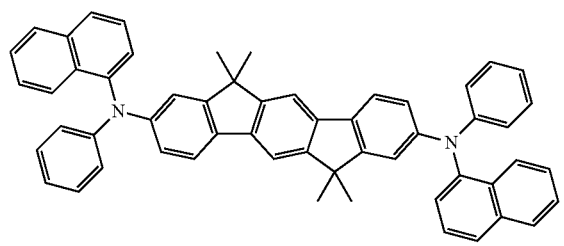
1-2
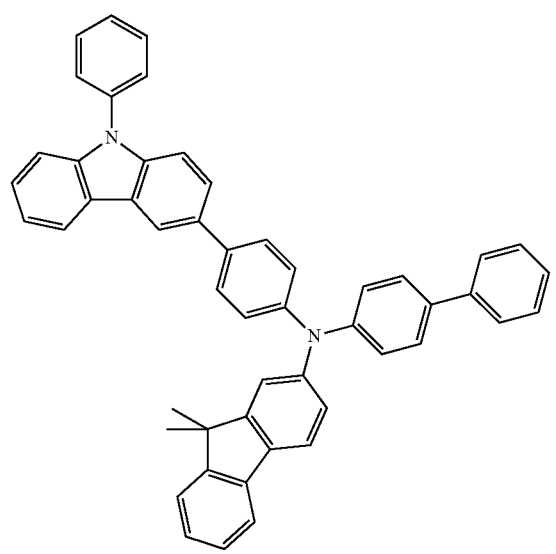
1-3
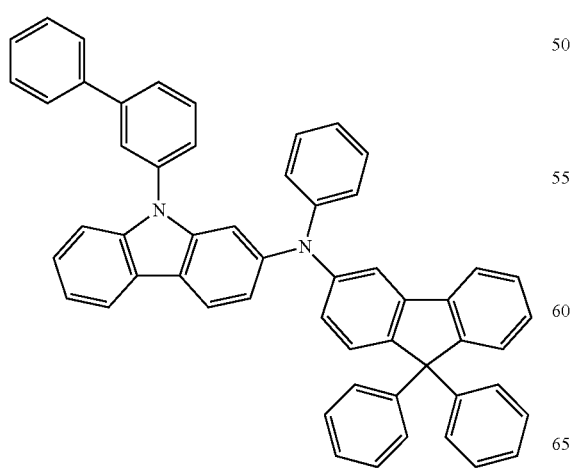
-continued
1-4
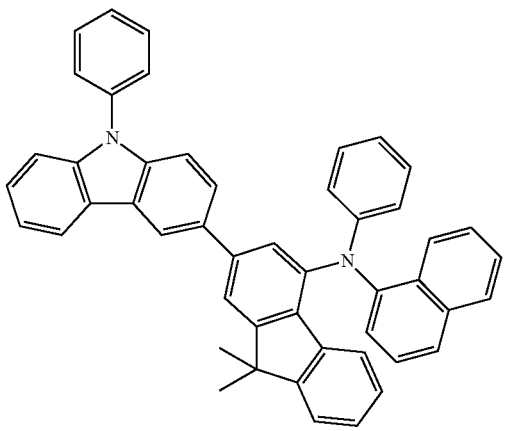
1-5
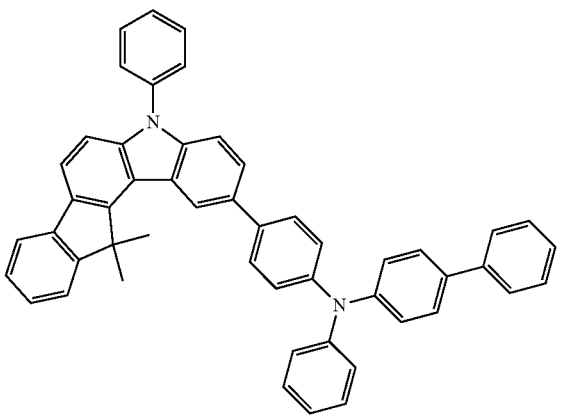
1-6
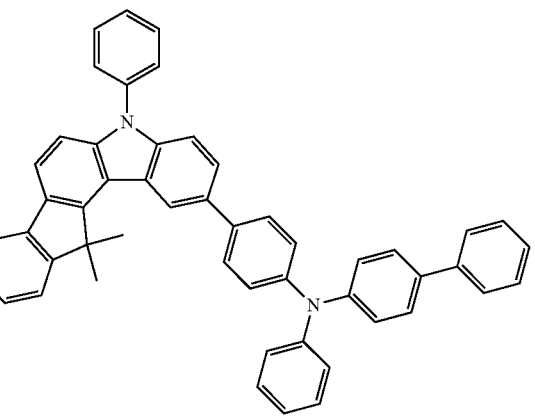

1-7
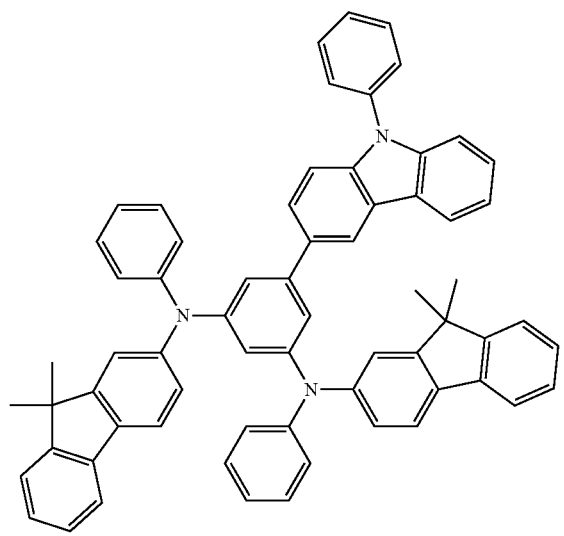
1-8
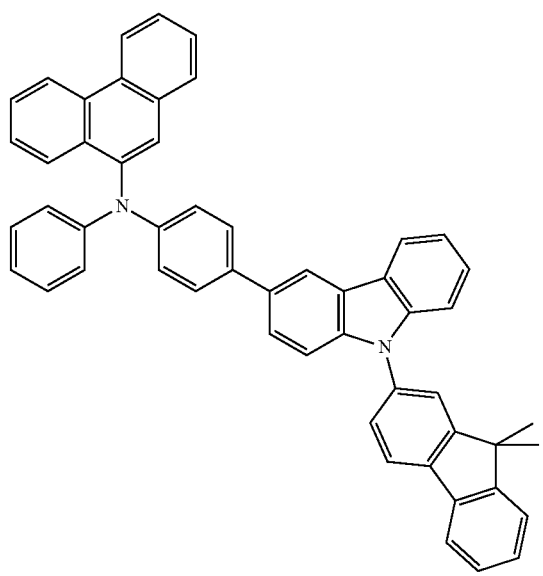
1-9
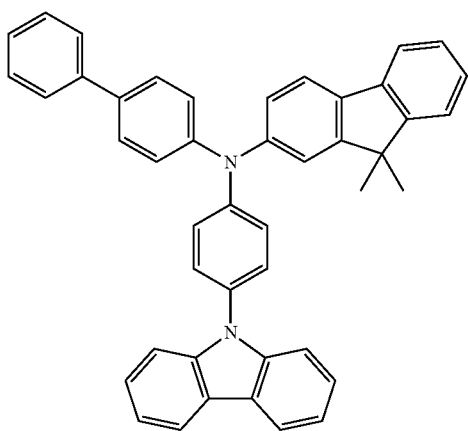
1-10
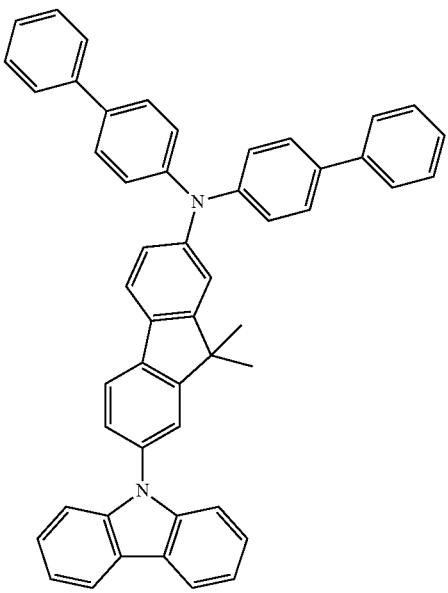
1-11
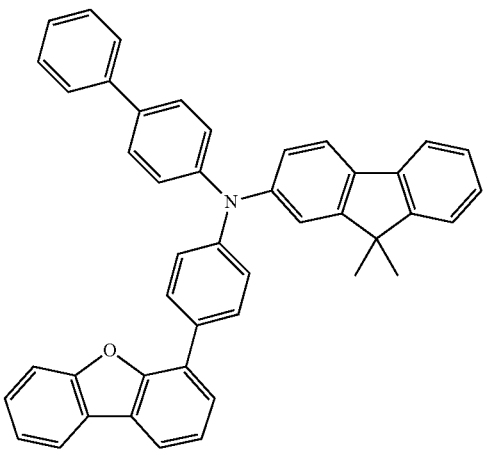
1-12
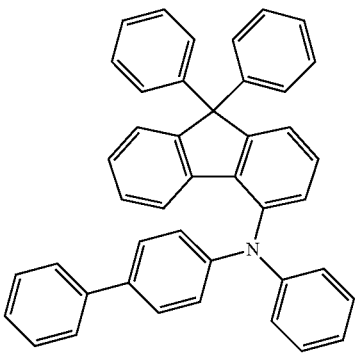

1-13
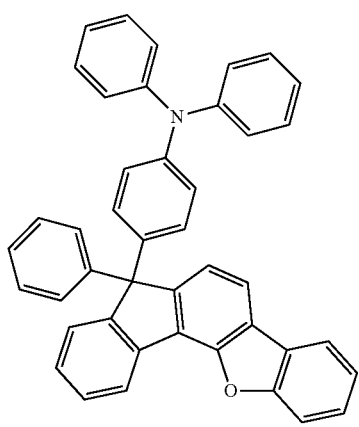
1-14
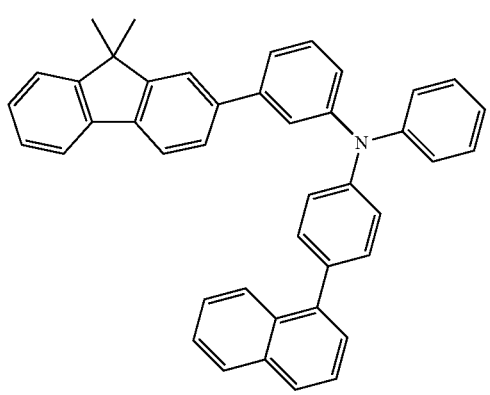
1-15
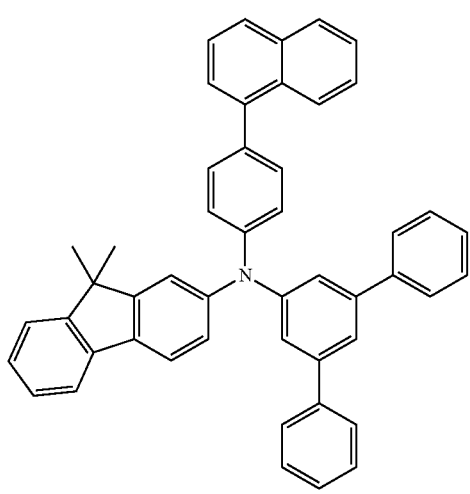
1-16
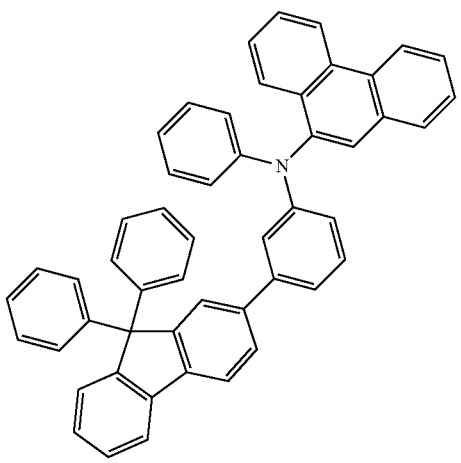
1-17
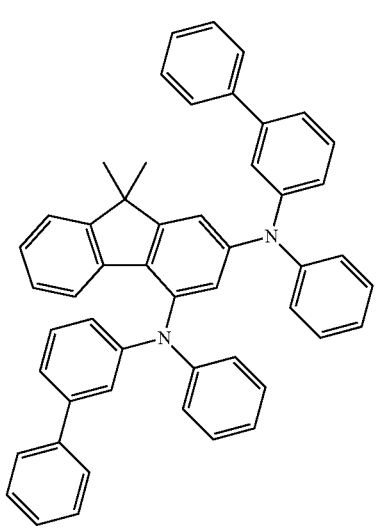
1-18
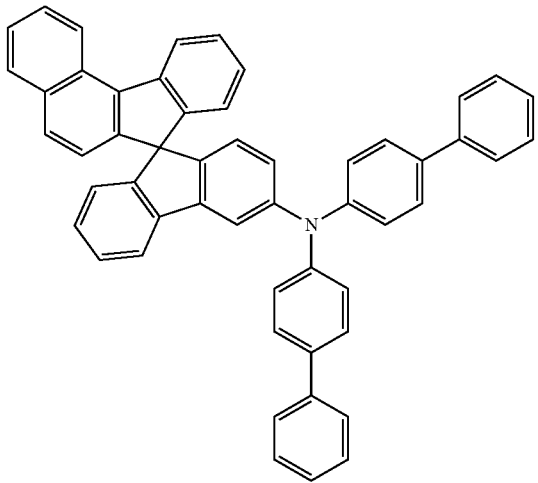

-continued
1-19
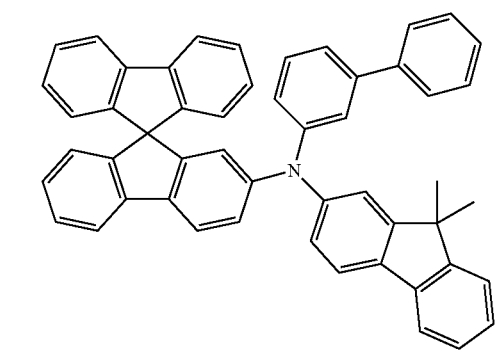
1-20
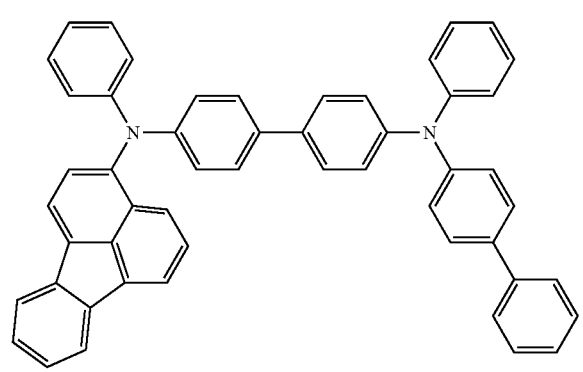
2-1
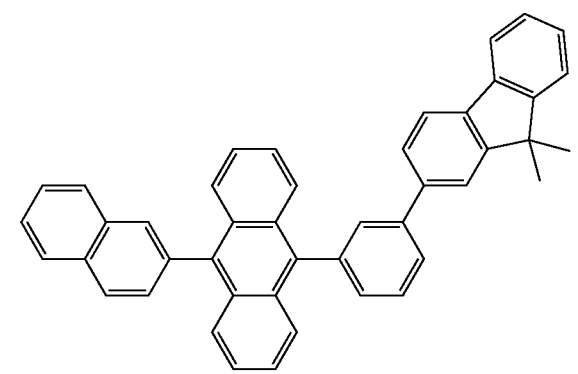
2-2
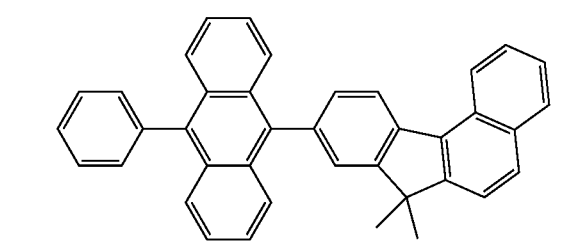
2-3
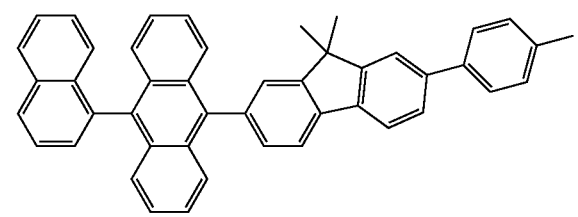
-continued
2-4
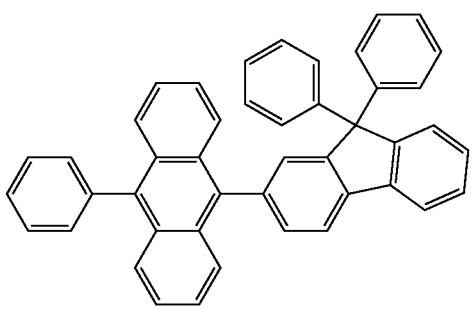
2-5
2-6
2-7
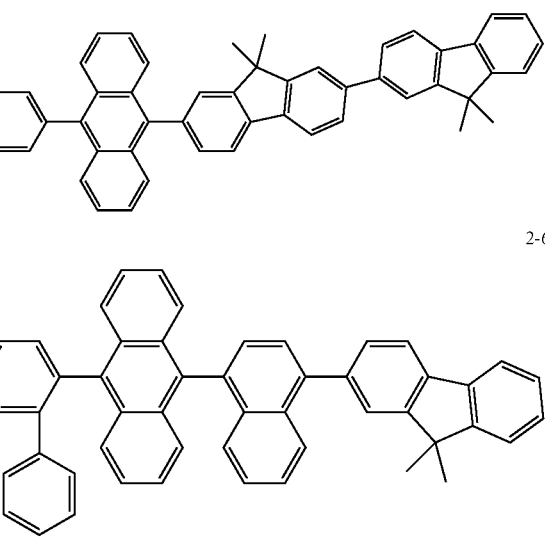
2-8
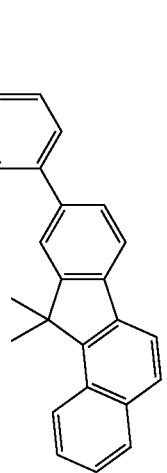

2-9
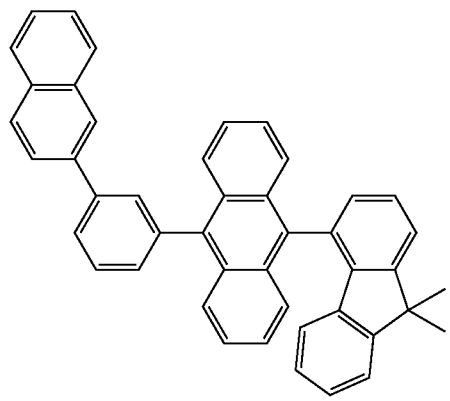
2-13
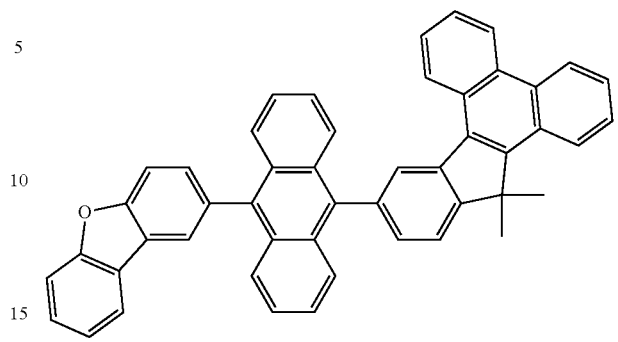
2-10
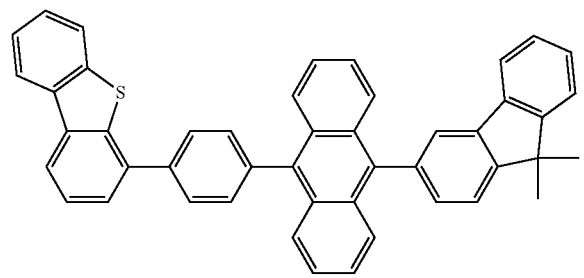
2-14
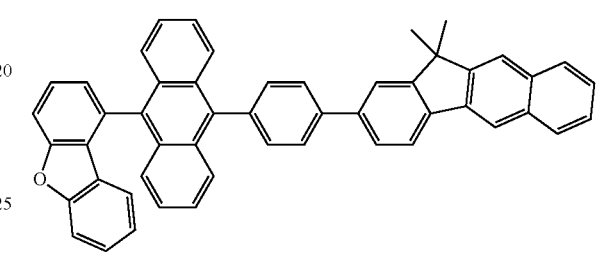
2-11
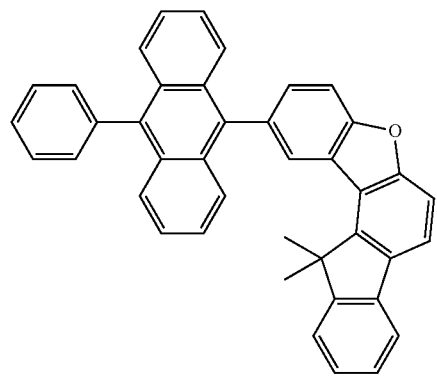
2-15
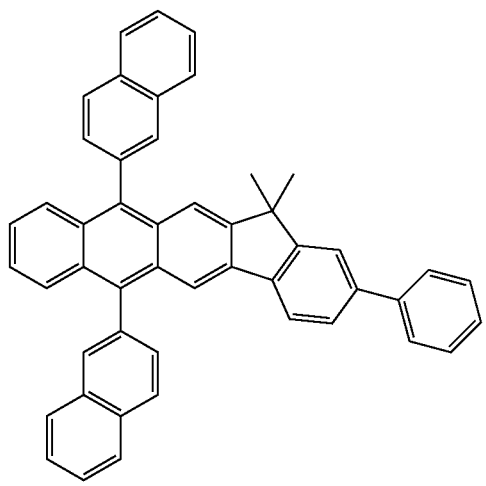
2-12
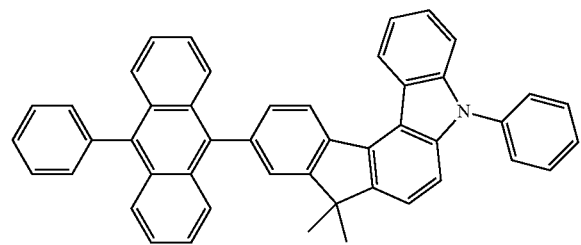
2-16
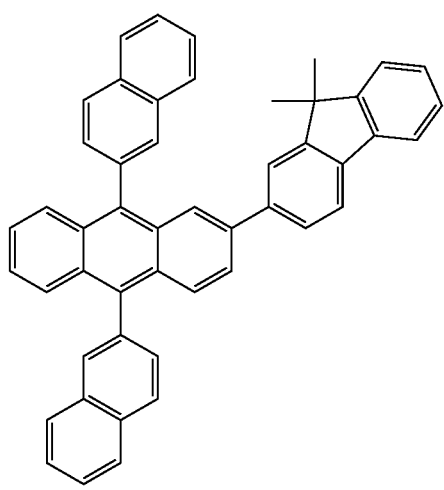

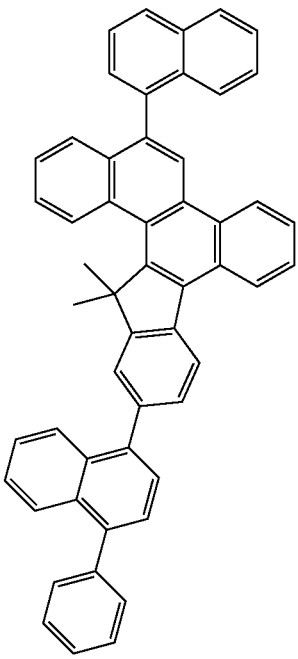
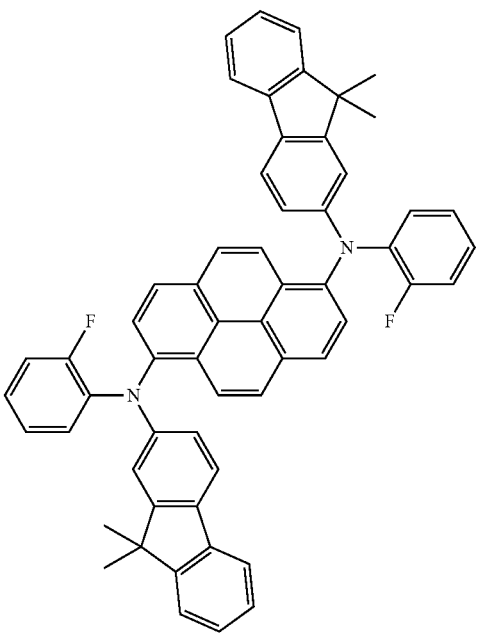

3-2
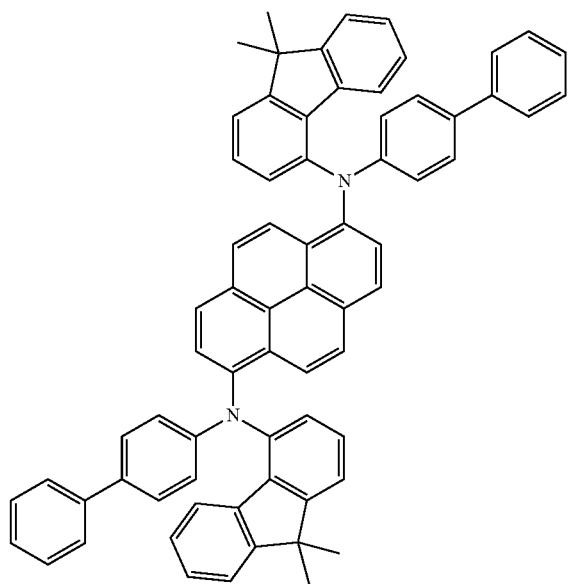
3-3
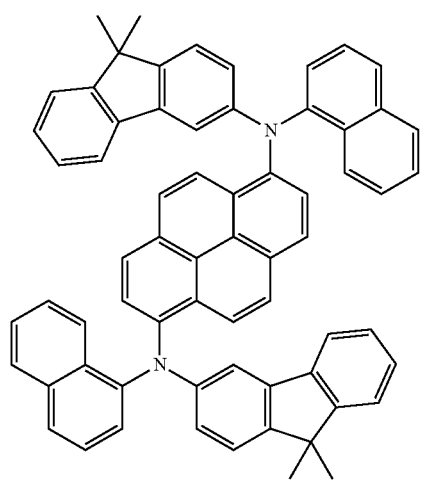
3-4
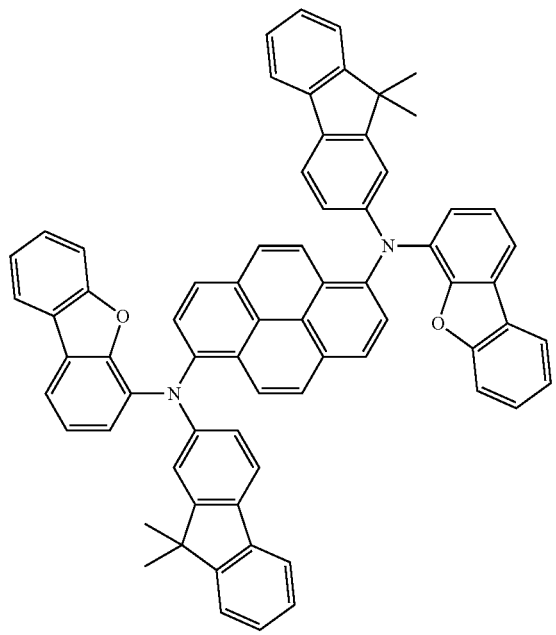
3-5
3-6
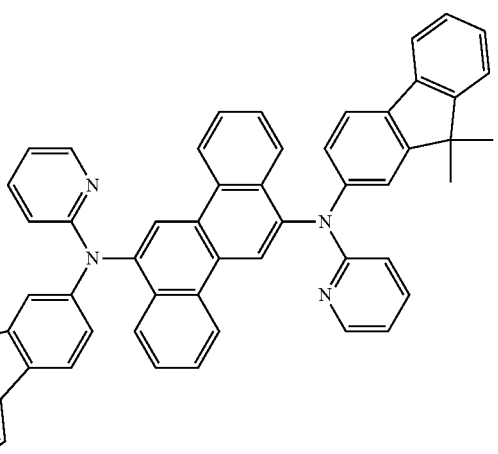

3-7
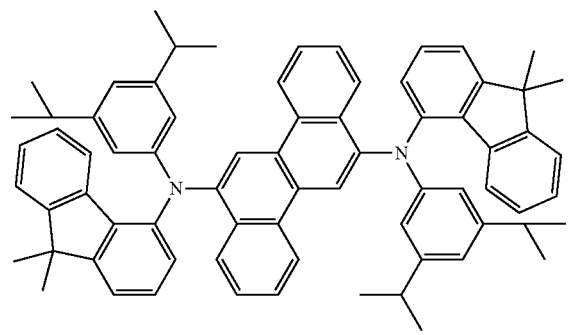
3-11
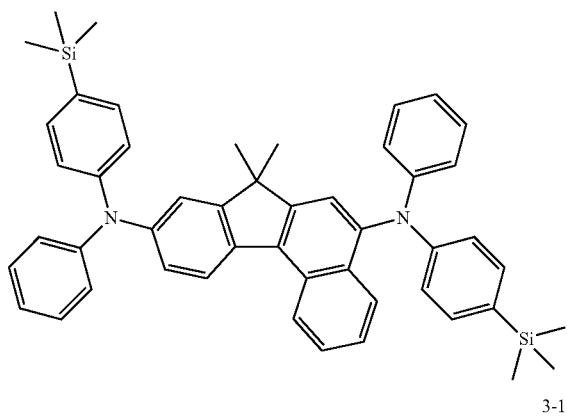
3-8
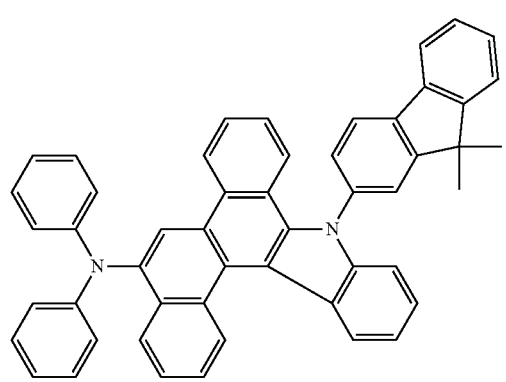
3-12
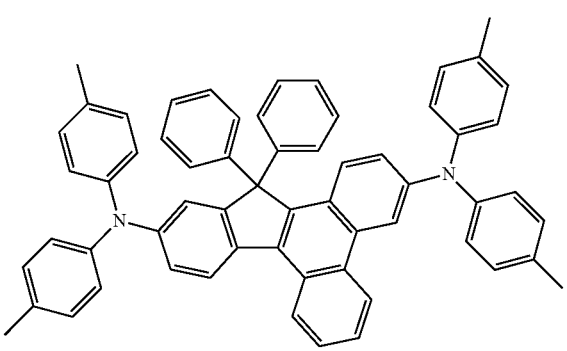
3-9
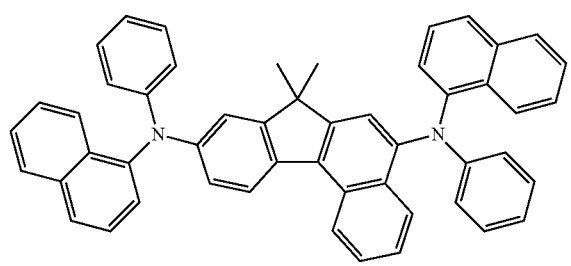
3-13
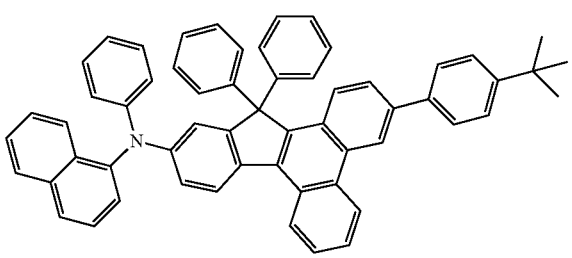
3-10
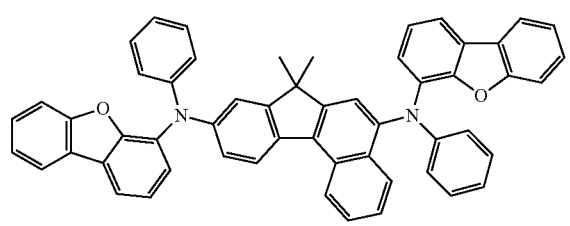
3-14

3-15
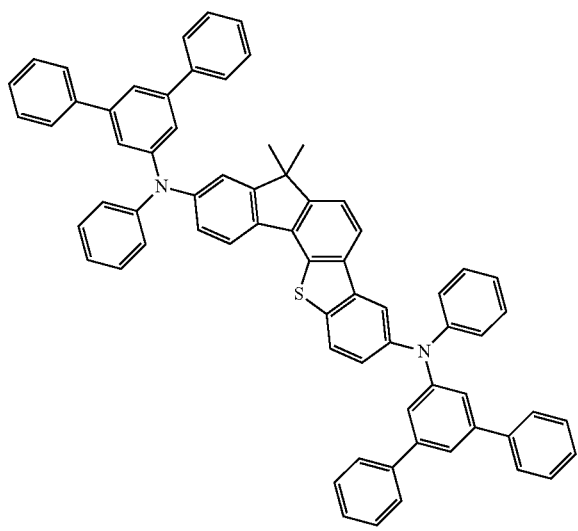
3-18
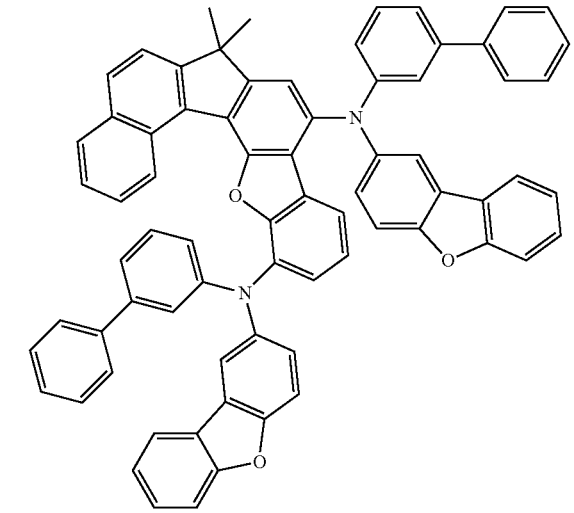
3-16
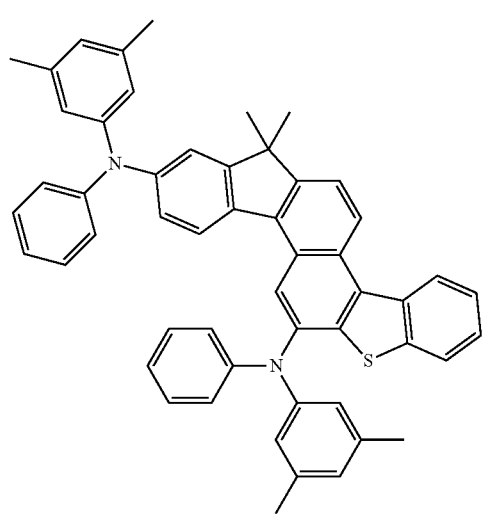
4-1
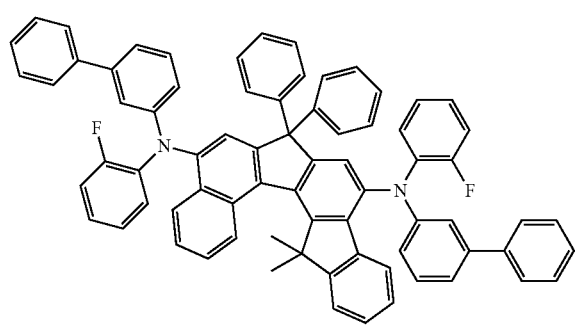
3-17
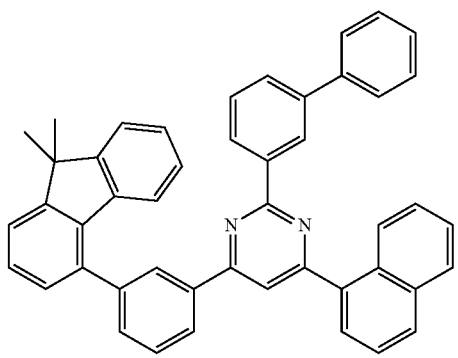
4-2

4-3
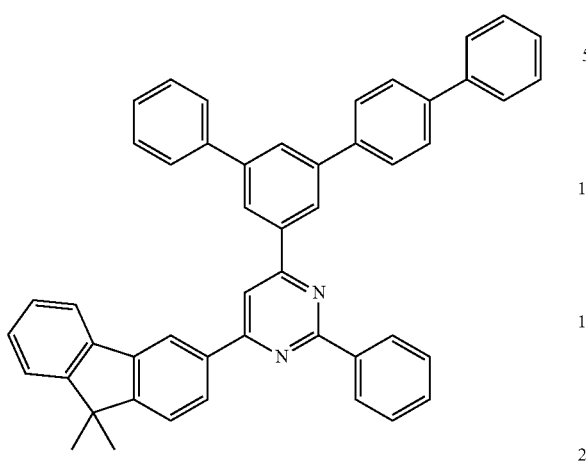
4-4
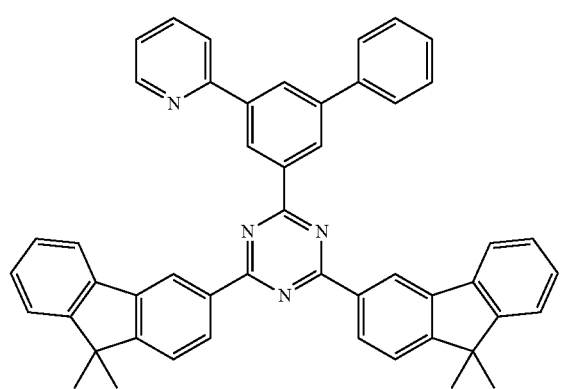
4-5
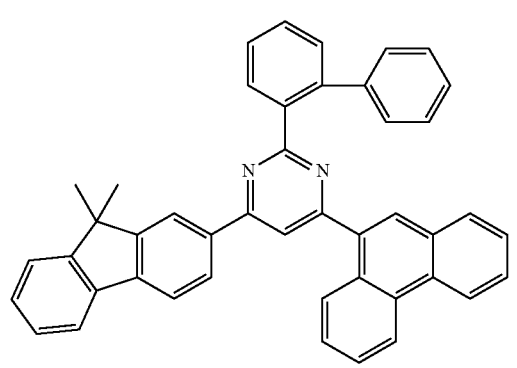
4-6
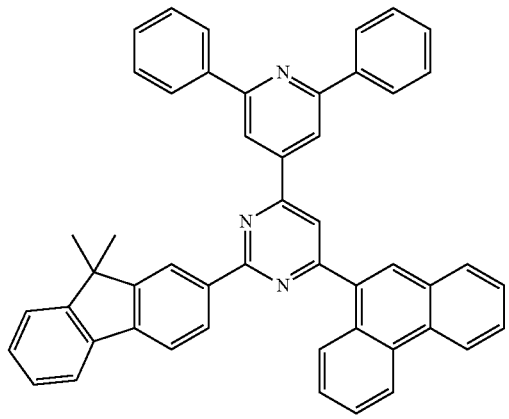
4-7
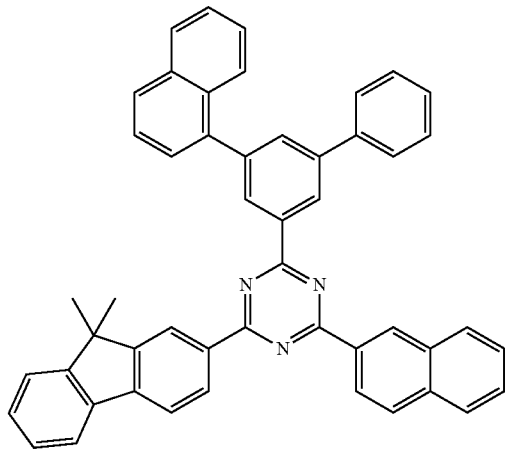
4-8
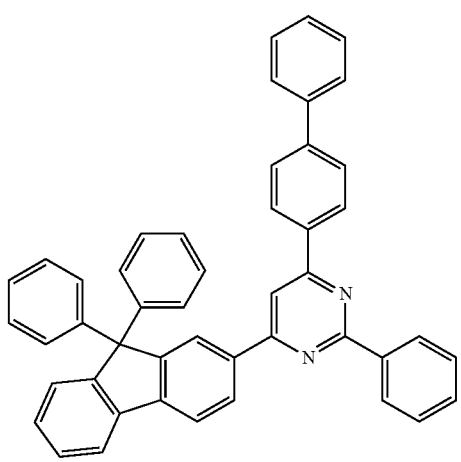

4-9
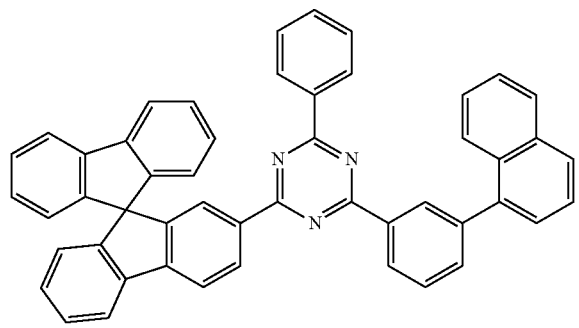
4-10
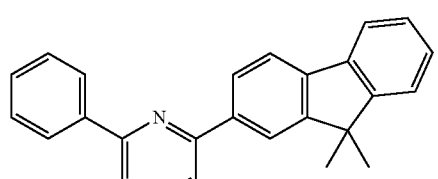
4-11
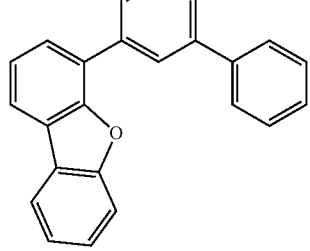
4-12
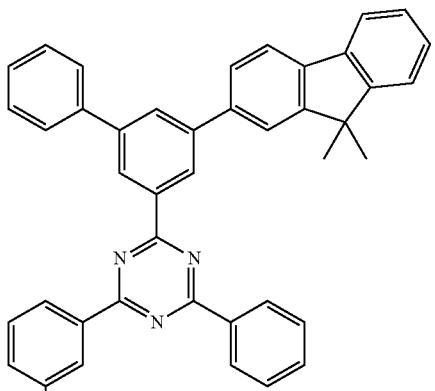
4-13
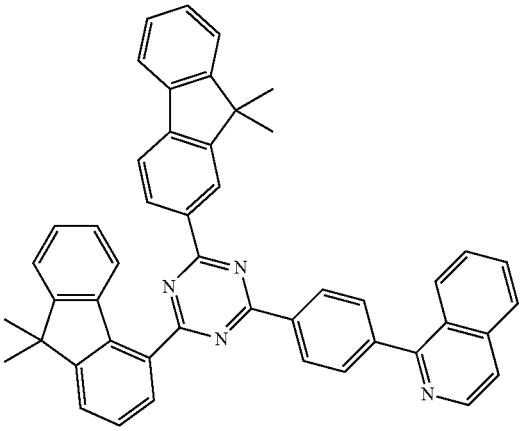
4-14
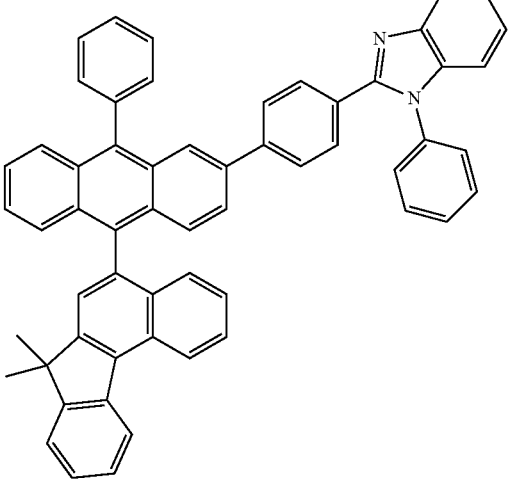

4-15
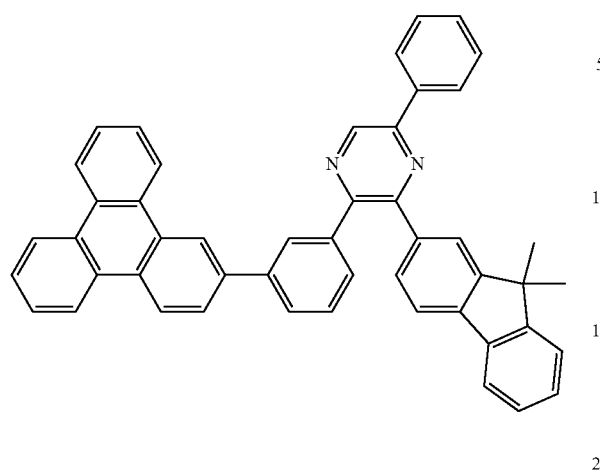
4-18
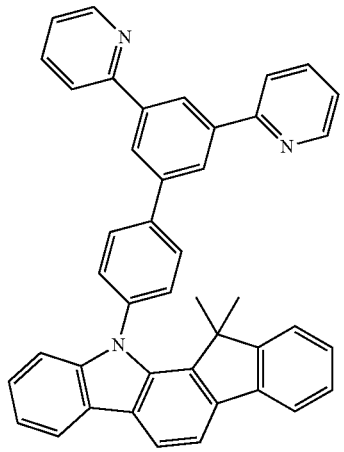
4-16
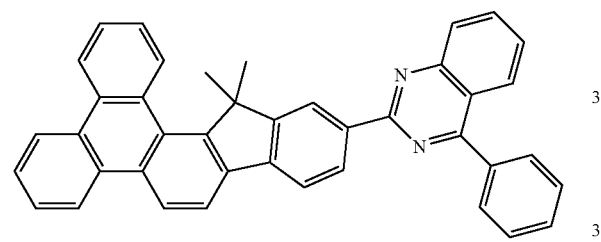
4-19
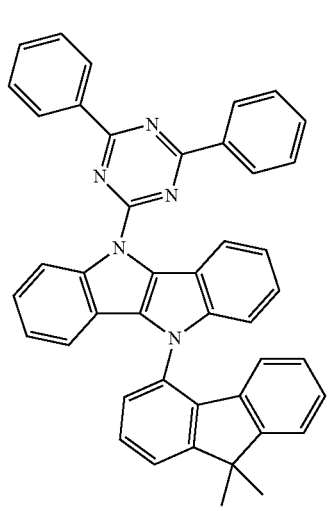
4-17
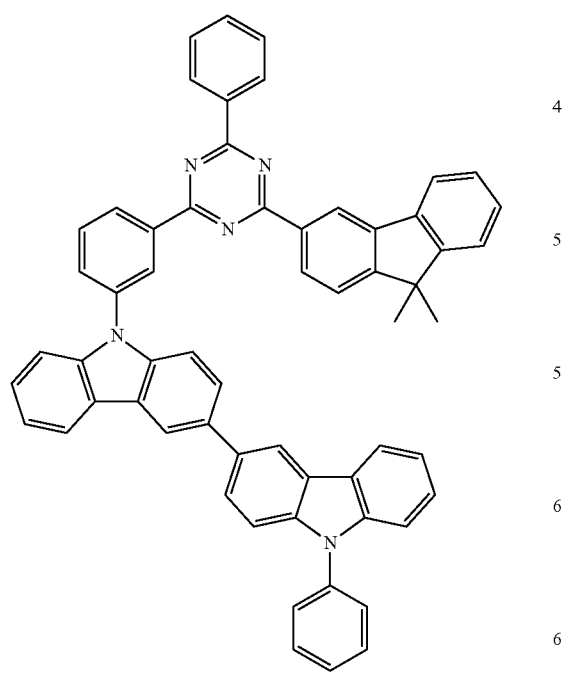
5-1
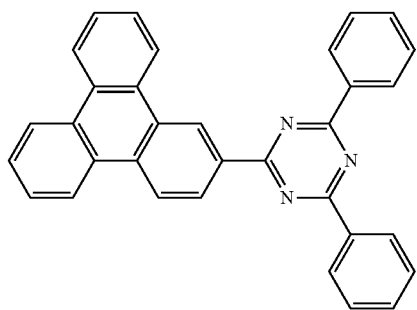

5-2
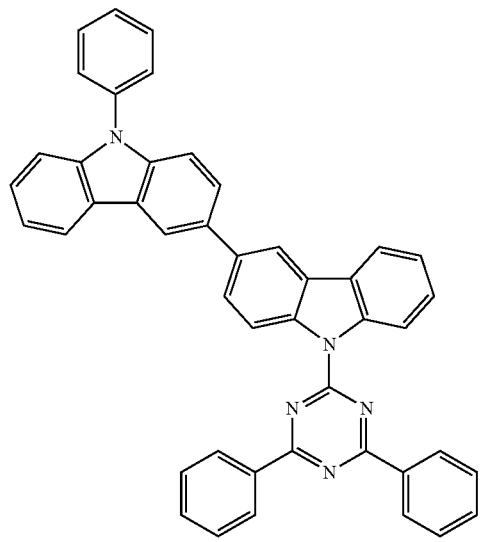
5-3
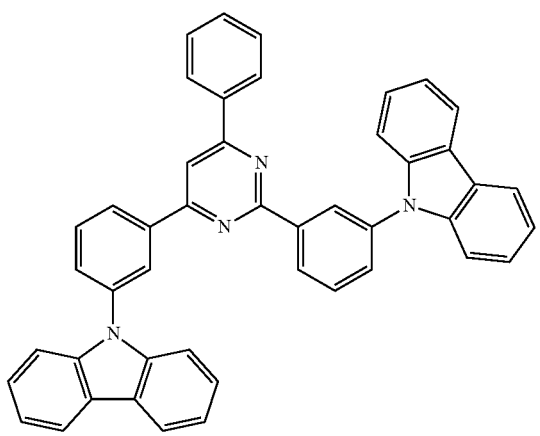
5-4
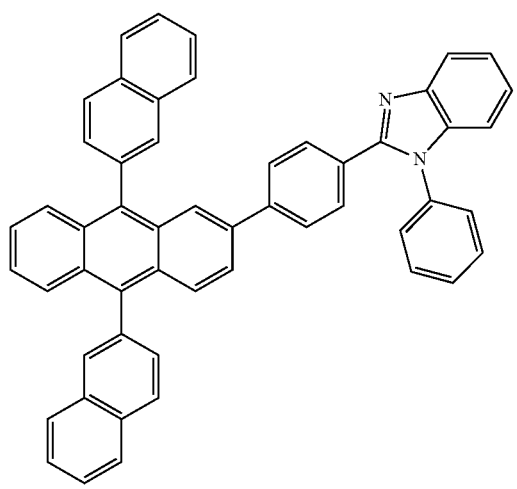
5-5
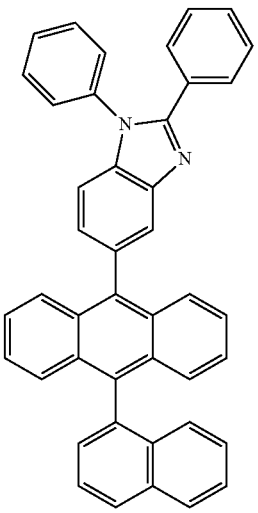
5-6
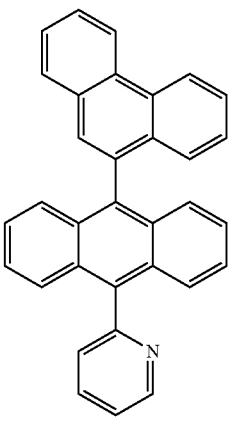
5-7
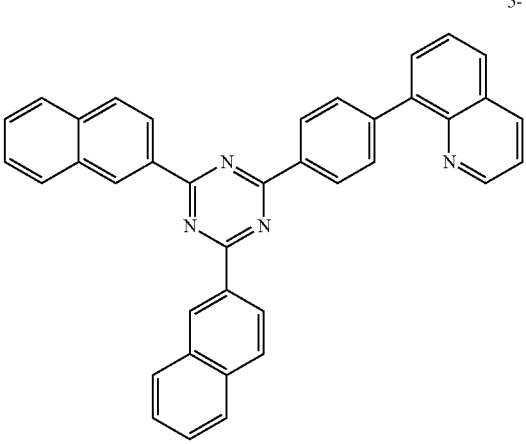

5-8

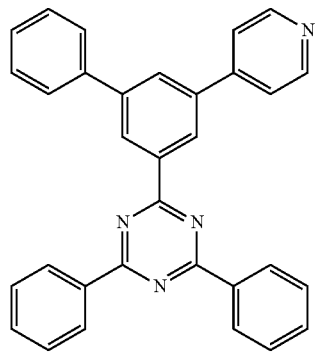

5-9

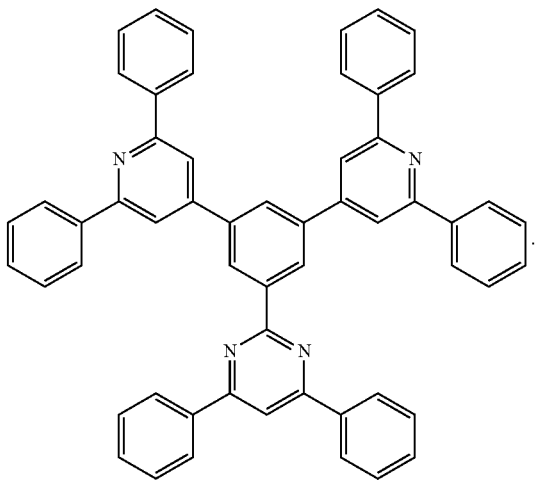

At least two compounds selected from the first compound to the fourth compound may have the lowest triplet energy of 2.4 eV or more, for example, 2.5 eV or more. When the lowest triplet energy is within the range above, in the case of a fluorescent organic light-emitting device, for example, emission efficiency thereof may be improved due to triplet-triplet fusion (TTF), and in the case of a phosphorescent organic light-emitting device, transition of triplet excitons that are formed in an emission layer may be blocked or reduced, thereby preventing or reducing efficiency degradation.

The first compound to the fourth compound may each independently have an asymmetric structure. When the first compound to the fourth compound have an asymmetric structure, molecular stacking and aggregation in an organic layer may be degraded or reduced. Accordingly, for example, when any of the first compound to the fourth compound are used as matrix materials in layers including the respective compounds, the organic light-emitting device may exhibit reduced deterioration and improved lifespan.

In various embodiments, the hole transport region may include a first hole transport layer and a second hole transport layer (between the first hole transport layer and the emission layer), wherein at least one selected from the first hole transport layer and the second hole transport layer may include the first compound.

In various embodiments, the second hole transport layer may directly contact the emission layer.

In various embodiments, the electron transport region may include a first electron transport layer and a second electron transport layer (between the second electrode and the first electron transport layer), wherein at least one selected from the first electron transport layer and the second electron transport layer may include the fourth compound.

In various embodiments, the first electron transport layer may include the fifth compound, and the second electron transport layer may include the fourth compound.

In various embodiments, the first electron transport layer may directly contact the emission layer.

In the organic light-emitting device, compounds including a group selected from groups represented by Formulae A to D above (e.g., compounds including, in part, a fluorene moiety) may be included in each of the hole transport region, the emission layer, and the electron transport region. In this regard, due to similarities in molecular structures of the compounds included in each of the hole transport region, the emission layer, and the electron transport region, movement of charges may be facilitated, and accordingly, interfacial properties among each of the hole transport region, the emission layer, and the electron transport region may be improved to thereby achieve improved stability and lifespan of the organic light-emitting device.

Figure 1:
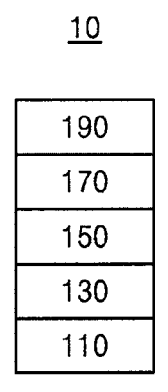

Hereinafter, a structure of an organic light-emitting device according to an embodiment and a method of manufacturing an organic light-emitting device according to an embodiment will be described in connection with FIG. 1.

FIG. 1 is a schematic cross-sectional view of an organic light-emitting device 10 according to an embodiment.

The organic light-emitting device 10 has a structure including a first electrode 110, a hole transport region 130, an emission layer 150, an electron transport region 170, and a second electrode 190, which are sequentially stacked in the stated order.

In FIG. 1, a substrate may be additionally disposed (e.g., positioned) under the first electrode 110 or above the second electrode 190. The substrate may be a glass substrate or a transparent plastic substrate, each having excellent mechanical strength, thermal stability, transparency, surface smoothness, ease of handling, and/or water-resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection. The first electrode 110 may be a reflective electrode, a semi-transmissive electrode, or a transmissive electrode. The material for forming the first electrode 110 may be a transparent and highly conductive material, and non-limiting examples of such material include indium tin oxide (ITO), indium zinc oxide (IZO), tin oxide ($SnO_2$), and zinc oxide (ZnO). When the first electrode 110 is a semi-transmissive electrode or a reflective electrode, at least one selected from magnesium (Mg), aluminum (Al), aluminum-lithium (Al—Li), calcium (Ca), magnesium-indium (Mg—In), and magnesium-silver (Mg—Ag) may be used as a material for forming the first electrode 110.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

On the first electrode 110, the hole transport region 130, the emission layer 150, and the electron transport region 170 may be sequentially stacked in this stated order.

The hole transport region 130 may include the first compound, the emission layer 150 may include the second compound and the third compound, and the electron transport region 170 may include the fourth compound and the fifth compound. Descriptions of the first compound, the second compound, the third compound, the fourth compound, and the fifth compound may be understood by referring to the descriptions thereof provided herein.

The hole transport region 130 may include at least one selected from a hole injection layer (HIL), a hole transport layer (HTL), a buffer layer, and an electron blocking layer (EBL); and the electron transport region 170 may include at least one selected from a hole blocking layer (HBL), an electron transport layer (ETL), and an electron injection layer (EIL), but they are not limited thereto.

The hole transport region 130 may have a single-layered structure formed of a single material, a single-layered structure formed of a plurality of different materials, or a multi-layered structure having a plurality of layers formed of a plurality of different materials.

For example, the hole transport region 130 may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein the layers of each structure are sequentially stacked from the first electrode 110 in this stated order, but are not limited thereto.

When the hole transport region 130 includes a hole injection layer, the hole injection layer may be formed on the first electrode 110 by using one or more suitable methods such as vacuum deposition, spin coating, casting, a Langmuir-Blodgett (LB) method, ink-jet printing, laser-printing, and/or laser-induced thermal imaging (LITI).

When a hole injection layer is formed by vacuum deposition, for example, the vacuum deposition may be performed at a deposition temperature of about 100° C. to about 500° C., at a vacuum degree of about $10^{-8}$ to about $10^{-3}$ torr, and at a deposition rate of about 0.01 to about 100 Å/sec, by taking into account a compound for the hole injection layer to be deposited, and a structure of the hole injection layer to be formed.

When a hole injection layer is formed by spin coating, for example, the spin coating may be performed at a coating rate of about 2,000 to about 5,000 rpm, and at a temperature of about 80° C. to 200° C., by taking into account a compound for the hole injection layer to be deposited, and a structure of the hole injection layer to be formed.

A thickness of the hole injection layer may be in a range of about 100 Å to about 10,000 Å, for example, about 100 Å to about 1,000 Å.

When the hole transport region 130 includes a hole transport layer, the hole transport layer may be formed on the first electrode 110 or on the hole injection layer by using one or more suitable methods such as vacuum deposition, spin coating, casting, a LB method, ink-jet printing, laser-printing, and/or LITI. When the hole transport layer is formed by vacuum deposition and/or spin coating, deposition and coating conditions for the hole transport layer may be the same as (or similar to) the deposition and coating conditions for the hole injection layer.

The hole transport region 130 may include the first compound. For example, the hole transport region 130 may include the hole transport layer, wherein the hole transport layer includes the first compound.

In various embodiments, the hole transport region 130 may include the first hole transport layer and the second hole transport layer (between the first hole transport layer and the emission layer 150), wherein at least one selected from the first hole transport layer and the second hole transport layer may include the first compound.

The hole transport region 130 may include, in addition to the first compound, at least one selected from a compound represented by Formula 201 below and a compound represented by Formula 202 below:

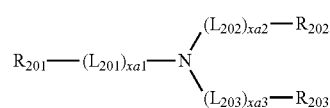

Formula 201

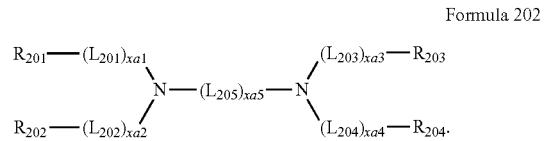

Formula 202

In Formulae 201 and 202, descriptions of $L_{201}$ to $L_{205}$ may each independently be understood by referring to the description provided herein in connection with $L_1$, xa1 to xa4 may each independently be selected from 0, 1, 2, and 3, xa5 may be selected from 1, 2, 3, 4, and 5, $R_{201}$ to $R_{204}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{201}$ and $R_{202}$ may optionally be linked to each other to form a saturated or unsaturated ring, and $R_{203}$ and $R_{204}$ may optionally be linked to each other to form a saturated or unsaturated ring.

The compound represented by Formula 201 may be represented by Formula 201A below:

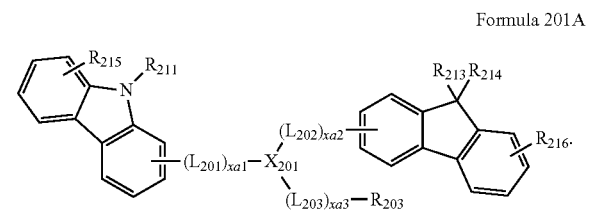

Formula 201A

For example, the compound represented by Formula 201 may be represented by Formula 201A-1, but is not limited thereto:

Formula 201A-1
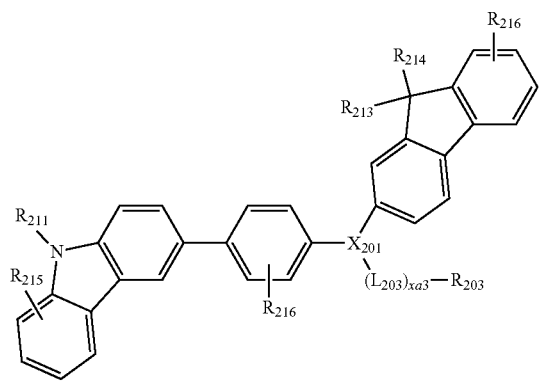
The compound represented by Formula 201 and the compound represented by Formula 202 may each independently include Compounds HT1 to HT12 below, but are not limited thereto:
HT1
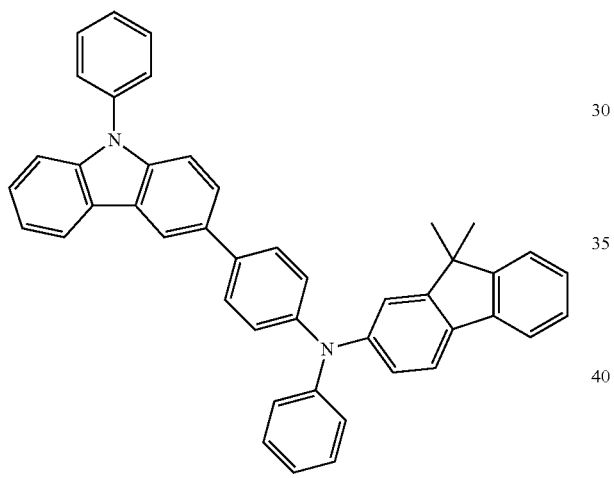
HT2
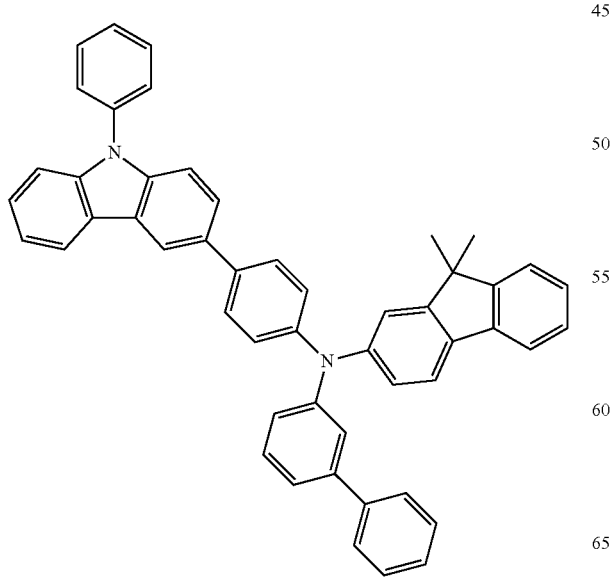
HT3
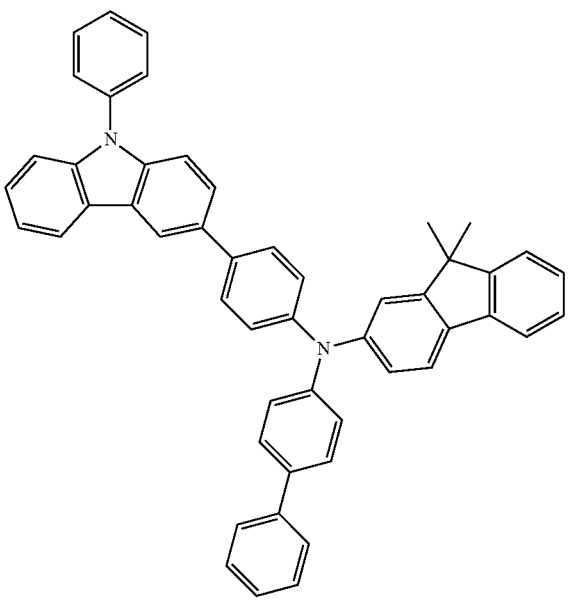
HT4
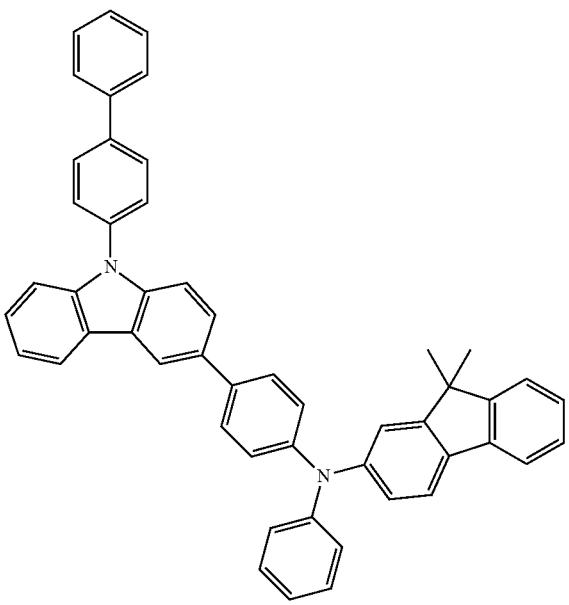

HT5
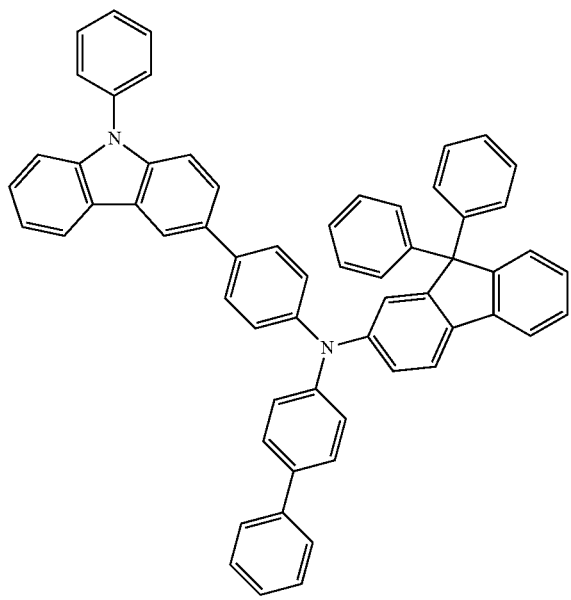
HT6
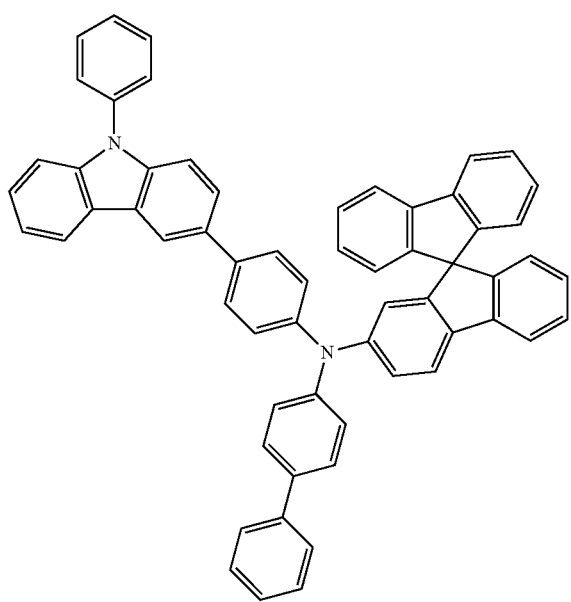
HT7
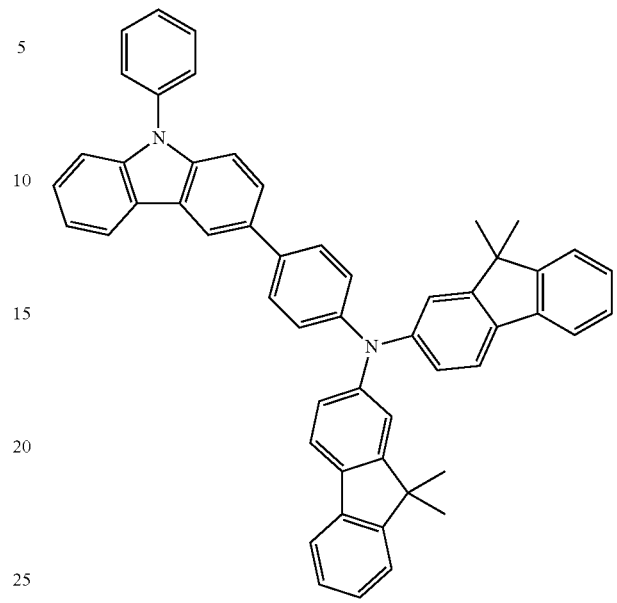
HT8
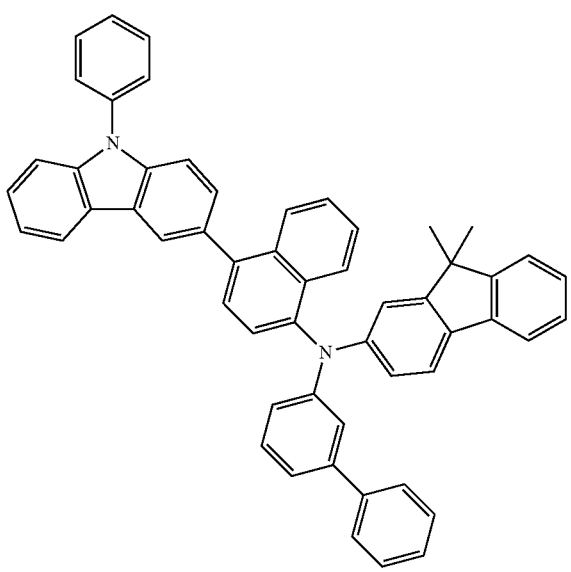

HT9
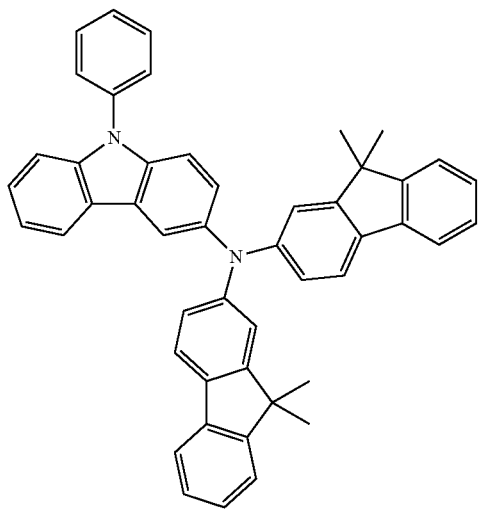

HT11
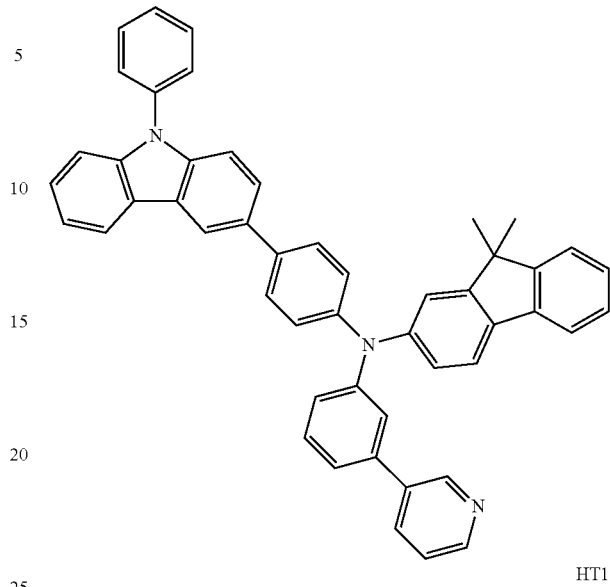

HT12
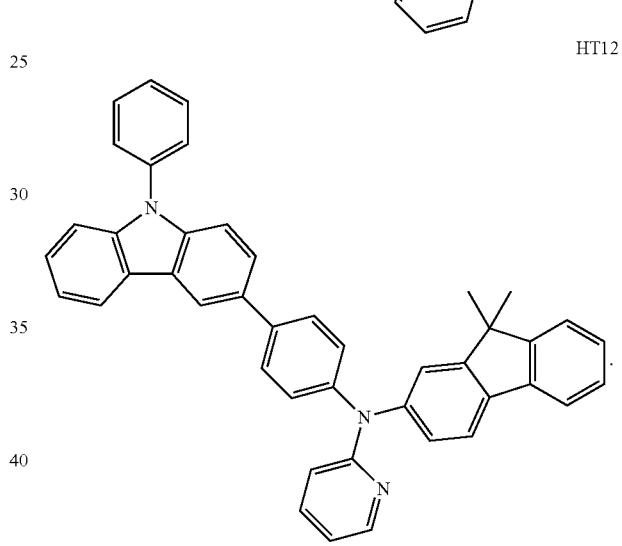

HT10
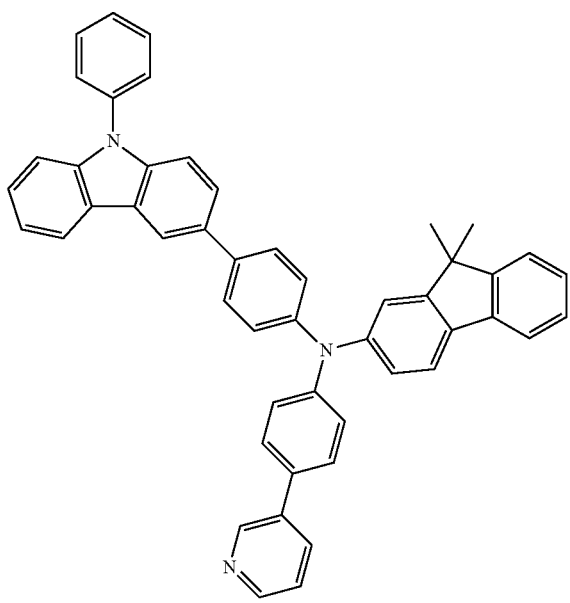

A thickness of the hole transport region 130 may be in a range of about 100 Å to about 10,000 Å, for example, about 100 Å to about 1,000 Å. When the hole transport region 130 includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region 130, the hole injection layer, and the hole transport layer are within any of these ranges, satisfactory (or suitable) hole transporting characteristics may be obtained without a substantial increase in driving voltage.

The hole transport region 130 may further include, in addition to the materials described above, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant include quinone derivatives (such as tetracyanoquinonedimethane (TCNQ) and/or 2,3,5,6-tetrafluoro-tetracyano-1,4-benzoquinonedimethane (F4-TCNQ)), metal oxides (such as tungsten oxide and/or molybdenum oxide), and Compound HT-D1 below:

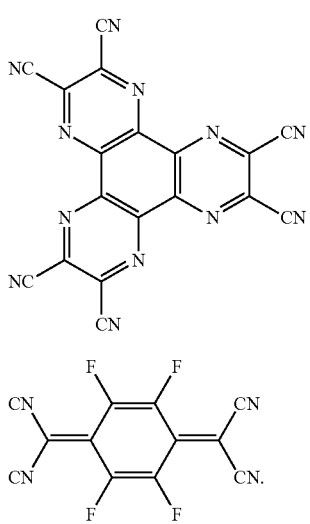

Compound HT-D1

F4-TCNQ

The hole transport region 130 may further include, in addition to the hole injection layer and/or the hole transport layer, at least one selected from a buffer layer and an electron blocking layer. Since the buffer layer may compensate for an optical resonance distance according to a wavelength of light emitted from the emission layer 150, light-emission efficiency of the formed organic light-emitting device may be improved. Also, as a material included in the buffer layer, any of the materials that are to be included in the hole transport region 130 may be used. The electron blocking layer may function to prevent or reduce the injection of electrons from the electron transport region 170.

When the organic light-emitting device 10 is a full color organic light-emitting device, the emission layer 150 may be patterned into a red emission layer, a green emission layer, and/or a blue emission layer, according to a sub pixel. In some embodiments, the emission layer 150 may have a stacked structure of two or more layers selected from a red emission layer, a green emission layer, a yellow emission layer, and a blue emission layer, in which the two or more layers contact each other or are separated from each other. In some embodiments, the emission layer 150 may include two or more materials selected from a red-light emission material, a green-light emission material, and a blue-light emission material, in which the two or more materials are mixed with each other in a single layer to emit white light.

In some embodiments, the emission layer 150 includes the second compound and the third compound. In the emission layer 150, the second compound may serve as a host and the third compound may serve as a dopant. In various embodiments, the second compound may be a fluorescent host, and the third compound may be a fluorescent dopant.

An amount of the third compound in the emission layer 150 may be in a range of about 0.01 to about 15 parts by weight based on 100 parts by weight of the second compound, but is not limited thereto.

A thickness of the emission layer 150 may be in a range of about 100 Å to about 1,000 Å, for example, about 200 Å to about 600 Å. When the thickness of the emission layer 150 is within any of these ranges, excellent (or suitable) light-emission characteristics may be obtained without a substantial increase in driving voltage.

The electron transport region 170 may be disposed (e.g., positioned) on the emission layer 150. The electron transport region 170 may include the fourth compound and the fifth compound.

The electron transport region 170 may include at least one selected from a hole blocking layer, a first electron transport layer, a second electron transport layer, and an electron injection layer, but is not limited thereto.

For example, the electron transport region 170 may have a structure of first electron transport layer/second electron transport layer/electron injection layer sequentially stacked from the emission layer 150 in this stated order, but the structure thereof is not limited thereto. In various embodiments, the first electron transport layer and the emission layer 150 may directly contact each other.

In various embodiments, the second electron transport layer may include the fourth compound, and the first electron transport layer may include the fifth compound.

The first electron transport layer and the second electron transport layer may be formed on the emission layer 150 or on the hole blocking layer by using one or more suitable methods such as vacuum deposition, spin coating, casting, a LB method, ink-jet printing, laser-printing, and/or LITI. When the first electron transport layer and/or the second electron transport layer are formed by vacuum deposition and/or spin coating, deposition and coating conditions for the first and/or second electron transport layer(s) may be the same as (or similar to) the deposition and coating conditions for the hole injection layer.

A thickness of the first electron transport layer may be in a range of about 20 Å to about 500 Å. When the thickness of the first electron transport layer is within this range, a ratio of the thickness of the first electron transport layer to that of the second electron transport layer may be adjusted, and thus injection and transport of electrons to the emission layer 150 may be adjusted, thereby implementing device performance with improved lifespan and efficiency.

A thickness of the second electron transport layer may be in a range of about 100 Å to about 1,000 Å, for example, about 150 Å to about 500 Å. When the thickness of the second electron transport layer is within any of these ranges, satisfactory (or suitable) electron transporting characteristics may be obtained without a substantial increase in driving voltage.

The electron transport layer may further include, in addition to the materials described above, a metal-containing material.

The metal-containing material may include a lithium (Li) complex, The Li complex may include, for example, Compound ET-D1 (lithium quinolate, LiQ) and/or Compound ET-D2:

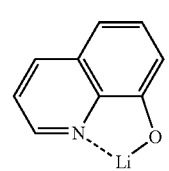

ET-D1

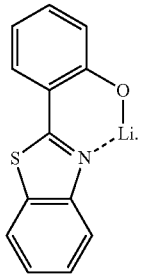

ET-D2

The electron transport region 170 may include an electron injection layer that facilitates injection of electrons from the second electrode 190.

The electron injection layer may be formed on the electron transport layer by using one or more suitable methods such as vacuum deposition, spin coating, casting, a LB method, ink-jet printing, laser-printing, and/or LITI. When the electron injection layer is formed by vacuum deposition and/or spin coating, deposition and coating conditions for the hole transport layer may be the same as (or similar to) the deposition and coating conditions for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

The second electrode 190 may be disposed (e.g., positioned) on the electron transport layer having such the structure according to embodiments of the present disclosure. The second electrode 190 may be a cathode (which is an electron injection electrode) and in this regard, a material for forming the second electrode 190 may be selected from a metal, an alloy, an electrically conductive compound, and a mixture thereof, which have a relatively low work function. Non-limiting examples of the material for forming the second electrode 190 include Li, Mg, Al, Al—Li, Ca, Mg—In, and Mg—Ag. In some embodiments, the material for forming the second electrode 190 may be ITO and/or IZO. The second electrode 190 may be a semi-transmissive electrode or a transmissive electrode.

Figure 2:
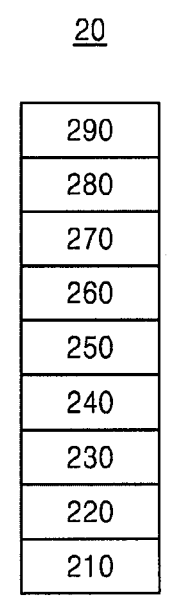

FIG. 2 is a schematic view of a structure of an organic light-emitting device 20 according to another embodiment.

In FIG. 2, the organic light-emitting device 20 has a stacked structure including a first electrode 210, a first hole transport region 220, a first emission layer 230, a first electron transport region 240, a charge generation region 250, a second hole transport region 260, a second emission layer 270, a second electron transport region 280, and a second electrode 290.

Descriptions of the first electrode 210 and the second electrode 290 may be understood by referring to the descriptions provided herein in connection with the first electrode 110 and the second electrode 190, respectively, descriptions of the first hole transport region 220 and the second hole transport region 260 may be understood by referring to the description provided herein in connection with the hole transport region 130, descriptions of the first emission layer 230 and the second emission layer 270 may be understood by referring to the description provided herein in connection with the emission layer 150, and descriptions of the first electron transport region 240 and the second electron transport region 280 may be understood by referring to the description provided herein in connection with the electron transport region 170.

The charge generation region 250 is a layer that may function to generate a charge when an electric field is applied to the organic light-emitting device 20, and in this regard, electrons may be injected to the first electron transport region 240 and holes may be injected to the second hole transport region 260. The charge generation region 250 may be formed as a single-layered structure or a multi-layered structure.

The organic light-emitting device 20 is a tandem-type device (e.g., tandem organic light-emitting device), and thus the organic light-emitting device 20 may implement white emission in a stable (or substantially stable) manner based on improved driving current and efficiency.

The term "$C_1$-$C_{60}$ alkyl group" as used herein may refer to a linear or branched monovalent aliphatic hydrocarbon group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein may refer to a divalent group having the same structure as the $C_1$-$C_{60}$ alkyl group.

The term "$C_1$-$C_{60}$ alkoxy group" as used herein may refer to a monovalent group represented by —$OA_{101}$ (wherein $A_{101}$ is the $C_1$-$C_{60}$ alkyl group), and non-limiting examples thereof include a methoxy group, an ethoxy group, and an isopropoxy group.

The term "$C_2$-$C_{60}$ alkenyl group" as used herein may refer to a hydrocarbon group having at least one carbon double bond at one or more positions along the hydrocarbon chain of the $C_2$-$C_{60}$ alkyl group (e.g., in the middle and/or at either terminus of the $C_2$-$C_{60}$ alkyl group), and non-limiting examples thereof include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon triple bond at one or more positions along the hydrocarbon chain of the $C_2$-$C_{60}$ alkyl group (e.g., in the middle and/or at either terminus of the $C_2$-$C_{60}$ alkyl group), and non-limiting examples thereof include an ethynyl group and a propynyl group. The term "$C_2$-$C_{60}$ alkynylene group," as used herein may refer to a divalent group having the same structure as the $C_2$-$C_{60}$ alkynyl group.

The term "$C_3$-$C_{10}$ cycloalkyl group" as used herein may refer to a monovalent hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group having at least one heteroatom selected from N, O, Si, P, and S as a ring-forming atom and 1 to 10 carbon atoms, and non-limiting examples thereof include a tetrahydrofuranyl group and a tetrahydrothiophenyl group. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms and at least one double bond in the ring thereof, and does not have aromaticity. Non-limiting examples of the $C_3$-$C_{10}$ cycloalkenyl group include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 2,3-hydrofuranyl group and a 2,3-hydrothiophenyl group. The term "$C_1$-$C_{10}$ heterocycloalkenylene group" as used herein may refer to a divalent group having the same structure as the $C_1$-$C_{10}$ heterocycloalkenyl group.

The term "$C_6$-$C_{60}$ aryl group" as used herein may refer to a monovalent group having a carbocyclic aromatic system having 6 to 60 carbon atoms, and the term "$C_6$-$C_{60}$ arylene group," as used herein may refer to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group" as used herein may refer to a monovalent group having a carbocyclic aromatic system that has at least one heteroatom selected from N, O, Si, P, and S as a ring-forming atom and 1 to 60 carbon atoms. The term "$C_1$-$C_{60}$ heteroarylene group," as used herein may refer to a divalent group having a carbocyclic aromatic system that has at least one heteroatom selected from N, O, Si, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused to each other.

The term "$C_6$-$C_{60}$ aryloxy group" as used herein may refer to a monovalent group represented by —$OA_{102}$ (wherein $A_{102}$ is the $C_6$-$C_{60}$ aryl group), and the term "$C_6$-$C_{60}$ arylthio group" as used herein may refer to a monovalent group represented by —$SA_{103}$ (wherein $A_{103}$ is the $C_6$-$C_{60}$ aryl group).

The term "monovalent non-aromatic condensed polycyclic group" as used herein may refer to a monovalent group that has two or more rings condensed (e.g., fused) to each other, only carbon atoms as a ring-forming atoms (e.g., 8 to 60 carbon atoms), and non-aromaticity in the entire molecular structure (e.g., does not have overall aromaticity). A non-limiting example of the monovalent non-aromatic condensed polycyclic group is a fluorenyl group. The term "divalent non-aromatic condensed polycyclic group," as used herein may refer to a divalent group having the same structure as the monovalent non-aromatic condensed polycyclic group.

The term "monovalent non-aromatic condensed heteropolycyclic group" as used herein may refer to a monovalent group that has two or more rings condensed (e.g., fused) to each other, has at least one heteroatom selected from N, O, Si, P, and S, other than carbon atoms (e.g., 2 to 60 carbon atoms), as a ring-forming atom, and has non-aromaticity in the entire molecular structure (e.g., does not have overall aromaticity). Examples of the monovalent non-aromatic condensed heteropolycyclic group include a carbazolyl group. The term "divalent non-aromatic condensed heteropolycyclic group" as used herein may refer to a divalent group having the same structure as the monovalent non-aromatic condensed heteropolycyclic group.

At least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})$($Q_{15}$), and —$B(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{26}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{37}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

The expression "Ph" used herein may refer to a phenyl group, the expression "Me" used herein may refer to a methyl group, the expression "Et" used herein may refer to an ethyl group, the expression "ter-Bu" or "Bu$^t$" used herein may refer to a tert-butyl group, and "D" may refer to deuterium.

The term "a biphenyl group" as used herein may refer to a monovalent group having two benzene rings linked to each other via a single bond, and the term "a terphenyl group" as used herein may refer to a monovalent group having three benzene rings in which adjacent benzenes are linked to each other via a single bond.

Hereinafter, an organic light-emitting device according to one or more embodiments of the present disclosure will be described in more detail with reference to Synthesis Examples and Examples.

EXAMPLES

Example 1

An ITO glass substrate (a product of Corning Co., Ltd) with an ITO layer having a thickness of 15 Ω/cm$^2$ (1,200 Å) thereon was cut to a size of 50 mm×50 mm×0.5 mm, and then, sonicated by using isopropyl alcohol and pure water, each for 5 minutes, and cleaned by the exposure to ultraviolet rays for 30 minutes, and then ozone, and the resulting ITO glass substrate was mounted on a vacuum deposition apparatus.

Compound 1-2 was vacuum deposited on the ITO glass substrate to form a first hole injection layer having a thickness of 600 Å, and then, Compound HTM1 was vacuum deposited on the first hole injection layer to form a second hole transport layer having a thickness of 100 Å. Compound 2-1 (as a host) and Compound BD (as a dopant) (illustrated below) were co-deposited on the second hole transport layer at a weight ratio of 95:5, thereby forming an emission layer having a thickness of 300 Å.

Then, Compound 5-1 was vacuum deposited on the emission layer to form a first electron transport layer having a thickness of 100 Å. Compound 4-1 and Liq were co-deposited on the first electron transport layer at a weight ratio of 1:1 to form a second electron transport layer having a thickness of 300 Å. LiF was deposited on the second electron transport layer to form an electron injection layer having a thickness of 10 Å, and Al was deposited on the electron injection layer to form a cathode having at thickness of 2,000 Å, thereby completing the manufacture of an organic light-emitting device.

Examples 2 to 9 and Comparative Examples 1 to 4

Organic light-emitting devices were each manufactured in the same (or substantially the same) manner as in Example 1, except that compounds listed in Table 1 below were used in forming the first hole transport layer, the second hole transport layer, the emission layer, the first electron transport layer, and the second electron transport layer.

Evaluation Example 1

The efficiency and $T_{90}$ lifespan of each of the organic light-emitting devices of Examples 1 to 9 and Comparative Examples 1 to 4 were measured by using a PR650 brightness measuring meter. Results thereof are shown in Table 1 below. Here, the $T_{90}$ lifespan results were obtained by measuring the time at which the brightness of the organic light-emitting devices reached 90% of the initial brightness (measured as 100%) under conditions of current density of 10 mA/cm$^2$.

TABLE 1

| | Material for forming hole transport layer | | Material for forming emission layer | Material for forming electron transport layer | | | |
|---|---|---|---|---|---|---|---|
| | First hole transport layer (60 nm) | Second hole transport layer (10 nm) | Host: Dopant (30 nm) | First electron transport layer (10 nm) | Second electron transport layer (30 nm) | Efficiency (cd/A) | Lifespan ($T_{90}$, hr) |
| Example 1 | 1-2 | HTM1 | 2-1: BD | 5-1 | 4-1: Liq | 5.5 | 95 |
| Example 2 | 1-8 | HTM1 | 2-7: BD | 5-2 | 4-3: Liq | 5.6 | 98 |
| Example 3 | 1-20 | HTM1 | ADN: 3-11 | 5-2 | 4-6: Liq | 5.4 | 113 |
| Example 4 | 1-2 | HTM1 | ADN: 3-18 | 5-1 | 4-11: Liq | 6.0 | 87 |
| Example 5 | NPB | 1-10 | 2-4: BD | 5-2 | 4-5: Liq | 5.4 | 96 |

TABLE 1-continued

| | Material for forming hole transport layer | | Material for forming emission layer | Material for forming electron transport layer | | | |
|---|---|---|---|---|---|---|---|
| | First hole transport layer (60 nm) | Second hole transport layer (10 nm) | Host: Dopant (30 nm) | First electron transport layer (10 nm) | Second electron transport layer (30 nm) | Efficiency (cd/A) | Lifespan ($T_{90}$, hr) |
| Example 6 | NPB | 1-11 | 2-11: BD | 5-2 | 4-7: Liq | 5.6 | 107 |
| Example 7 | NPB | 1-12 | ADN: 3-1 | 5-1 | 4-13: Liq | 5.6 | 95 |
| Example 8 | NPB | 1-17 | ADN: 3-7 | 4-1 | 5-4: Liq | 5.5 | 101 |
| Example 9 | NPB | 1-19 | ADN: 3-12 | 4-17 | 5-4: Liq | 5.8 | 110 |
| Comparative Example 1 | | NPB | 2-1: BD | | 4-1: Liq | 4.5 | 71 |
| Comparative Example 2 | 1-1 | HTM1 | ADN: BD | | 4-1: Liq | 4.8 | 57 |
| Comparative Example 3 | NPB | 1-9 | 2-1: BD | | $Alq_3$ | 4.4 | 63 |
| Comparative Example 4 | NPB | 1-9 | 2-1: BD | | 4-1: Liq | 5.1 | 80 |

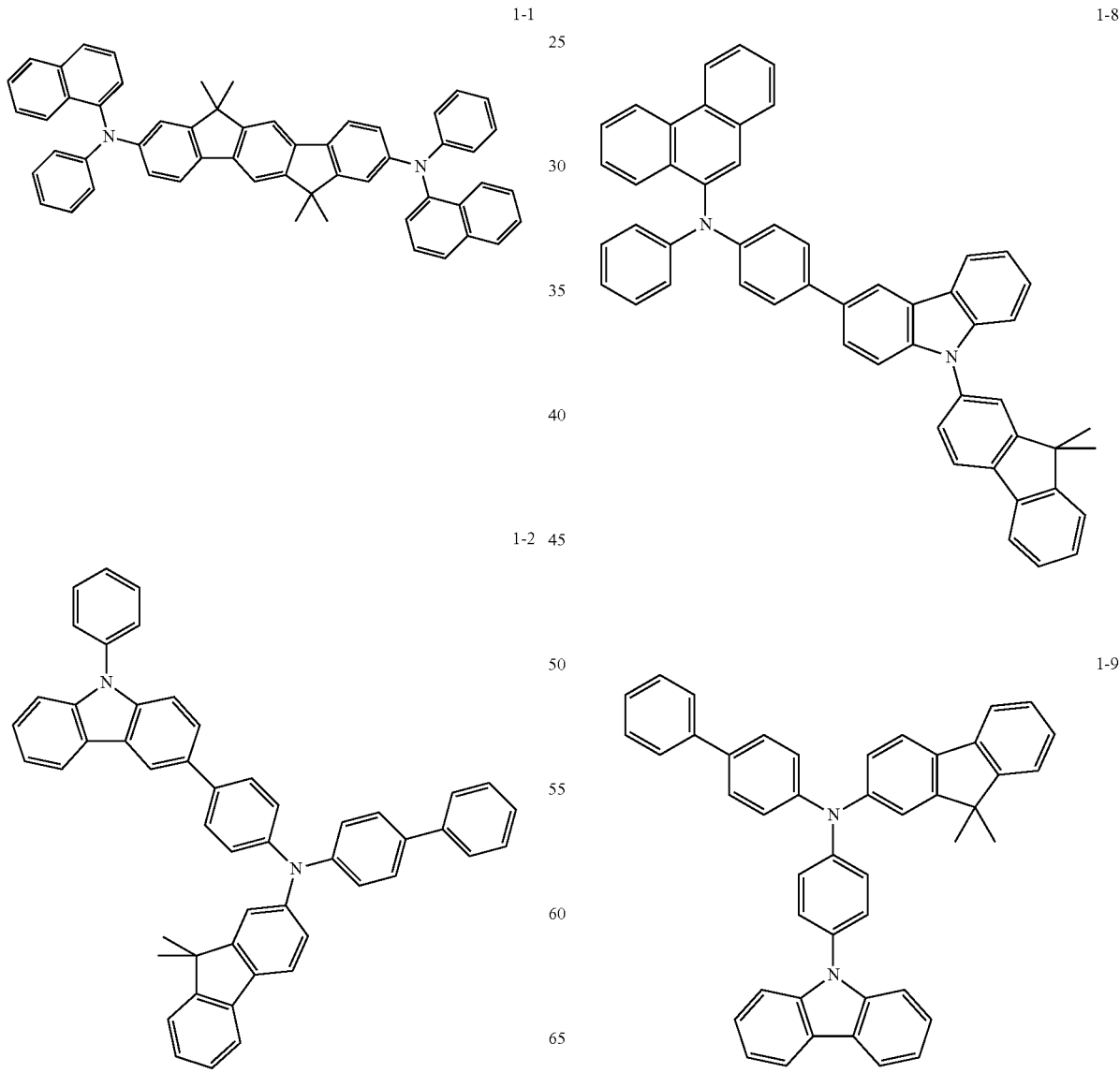

1-10
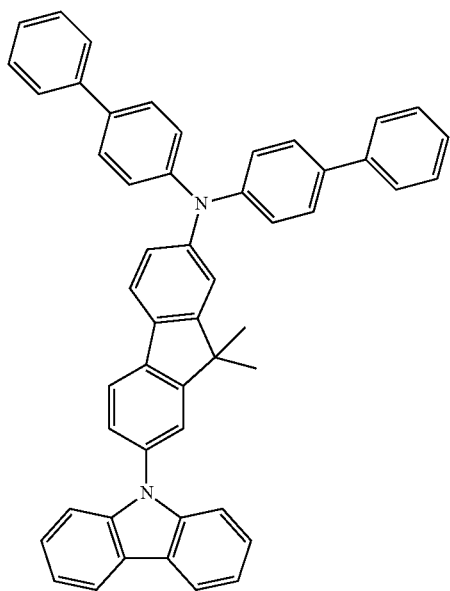
1-11
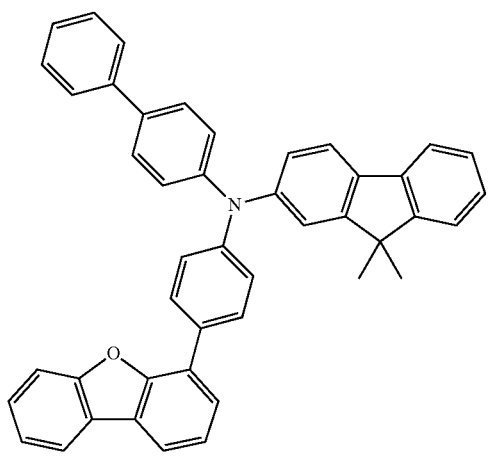
1-12
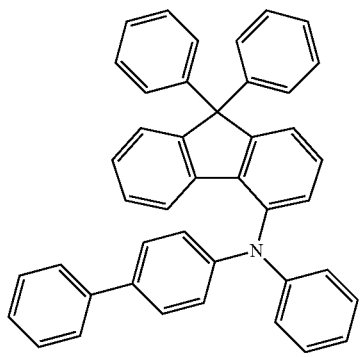
1-17
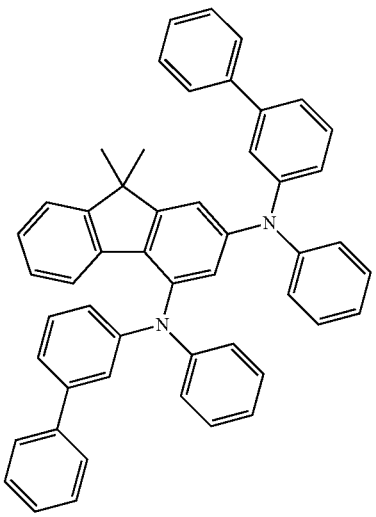
1-19
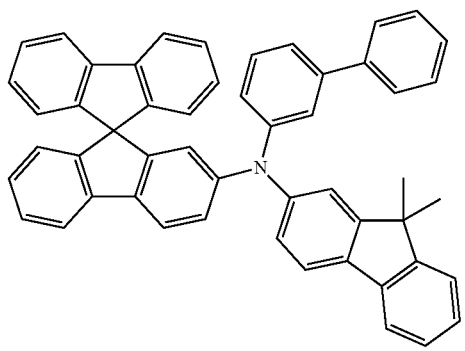
1-20
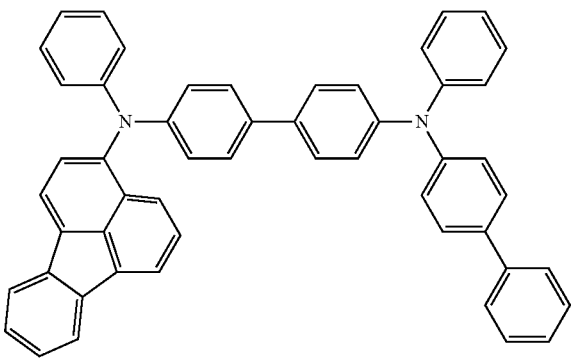
2-1
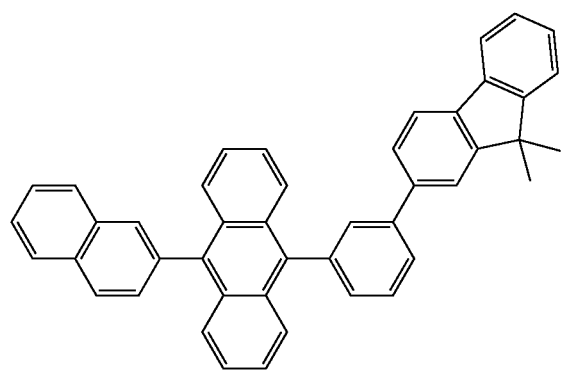

2-4
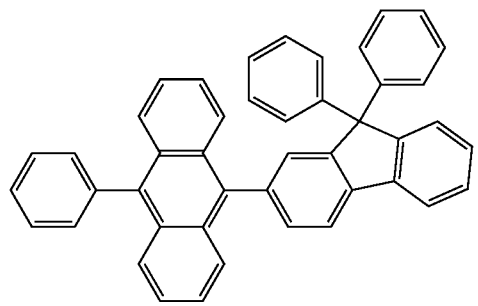
2-7
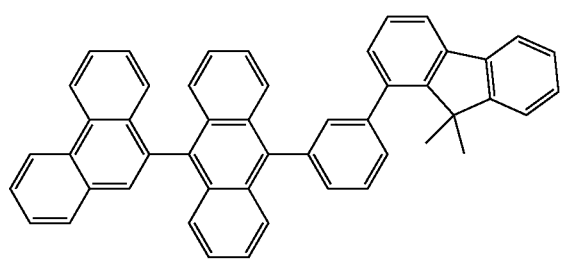
2-11
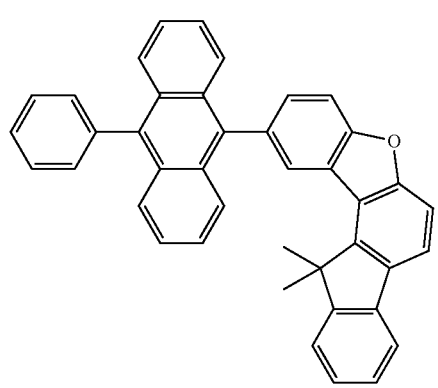
3-1
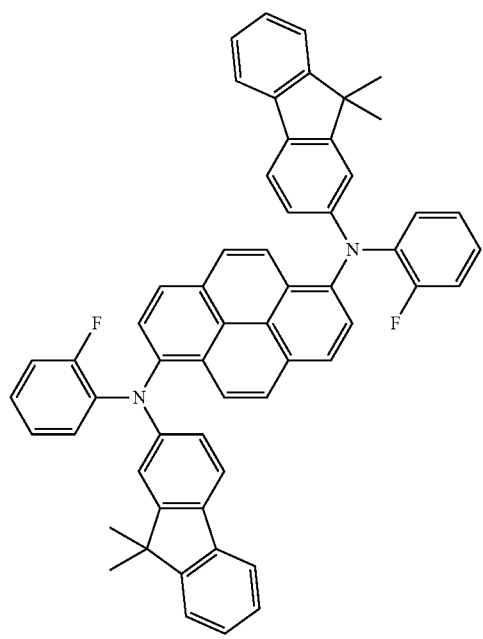
3-7
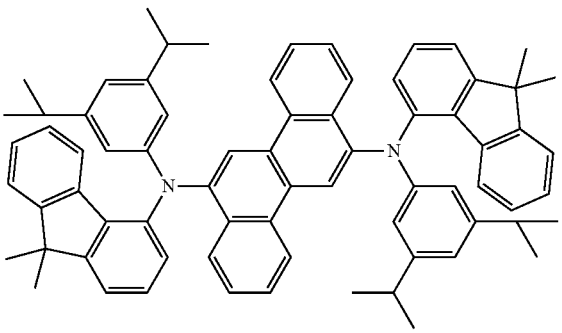
3-11
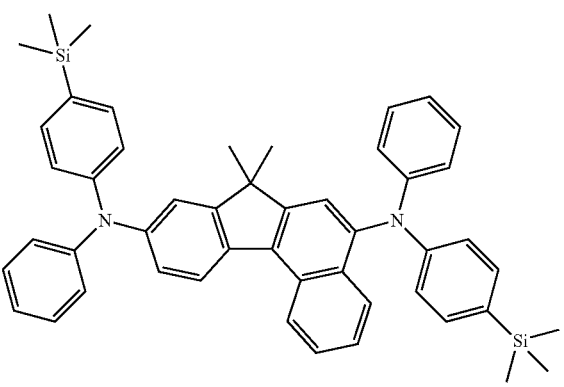
3-12
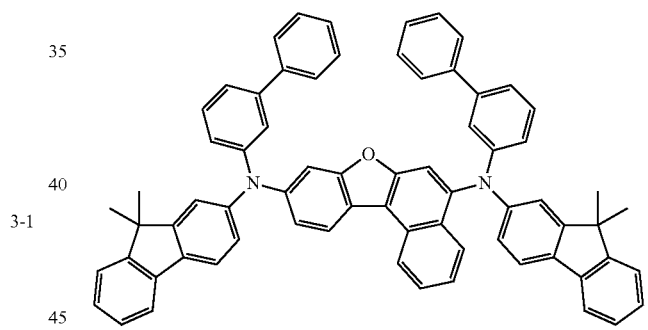
3-18
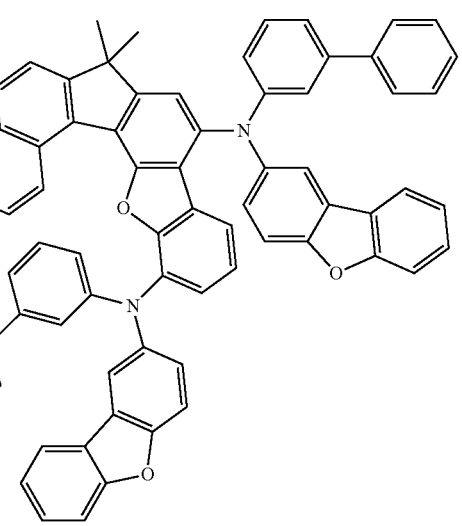

4-1
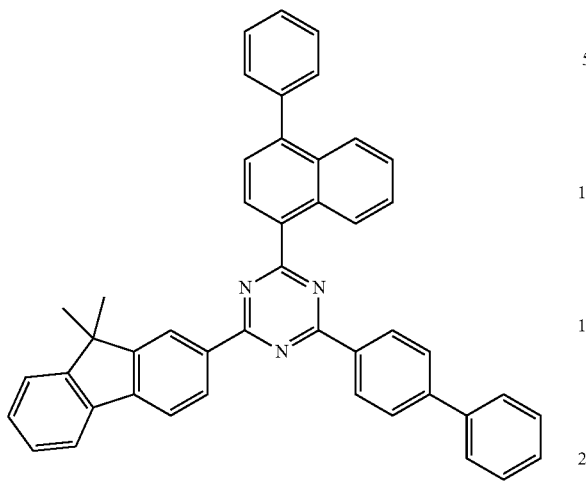
4-3
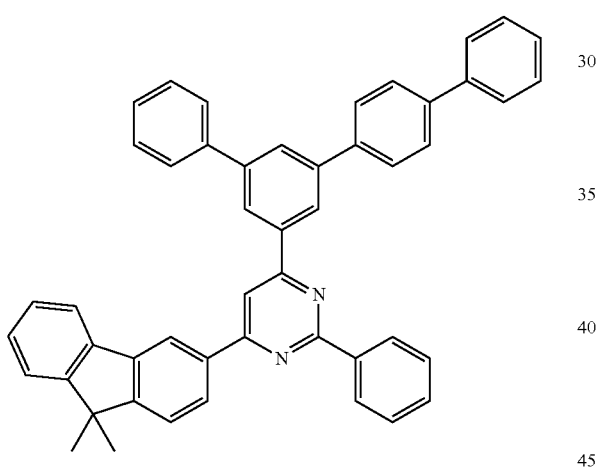
4-5
4-6
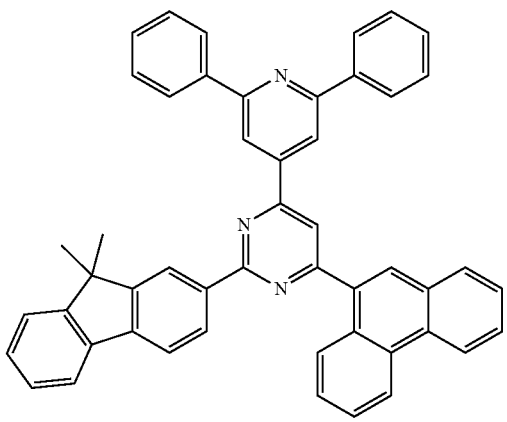
4-7
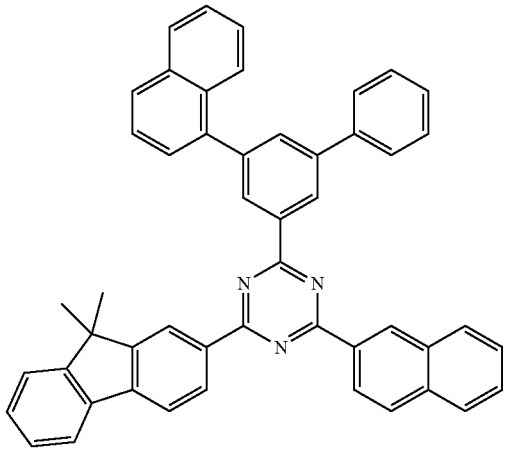
4-11
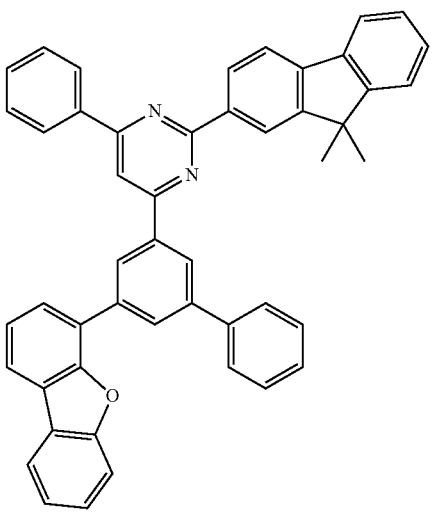

4-13
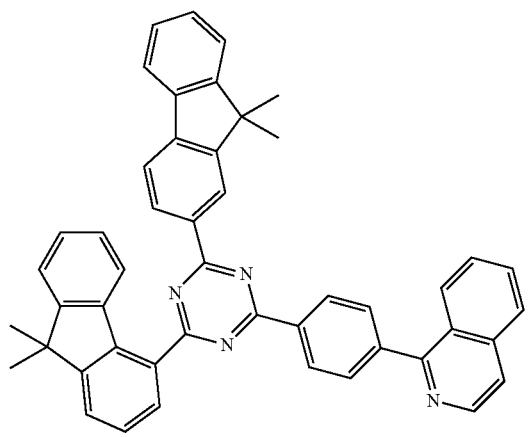
4-17
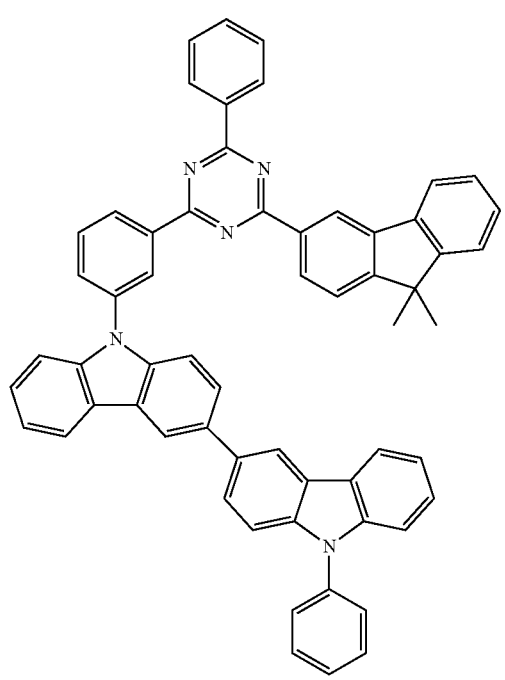
5-1
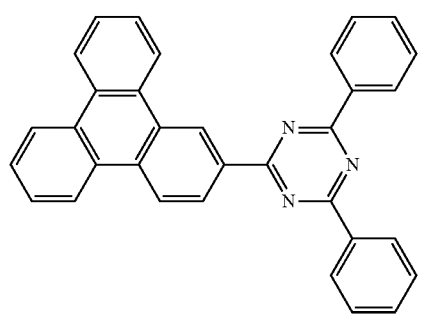
5-2
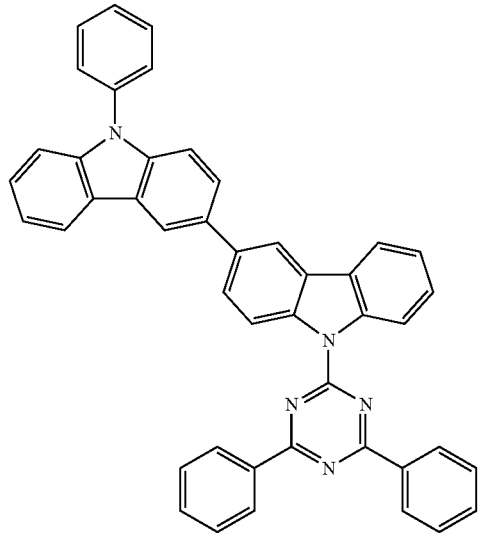
5-4
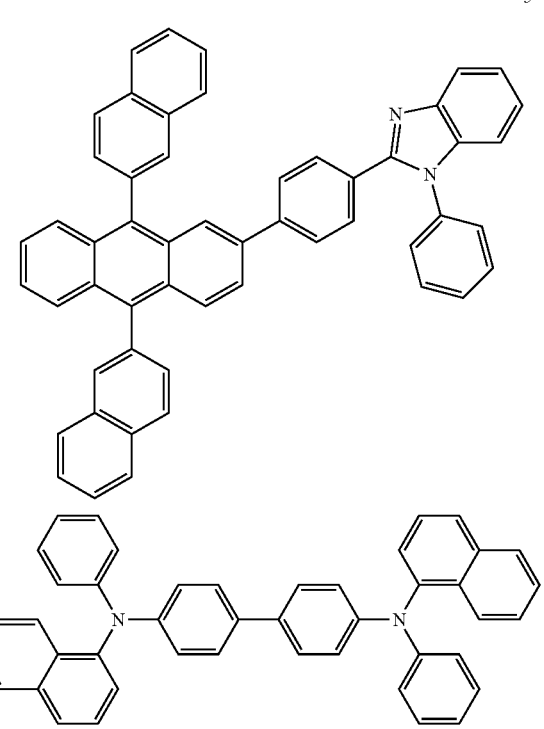
NPB
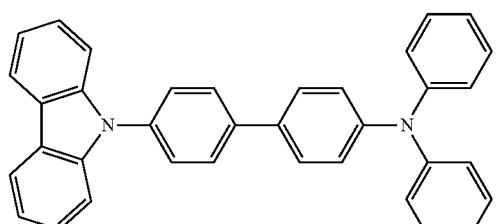
HTM1

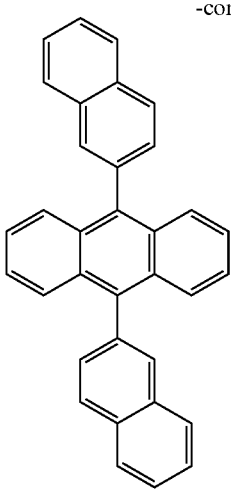

ADN

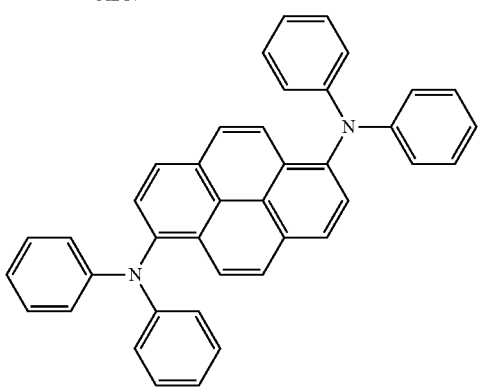

BD

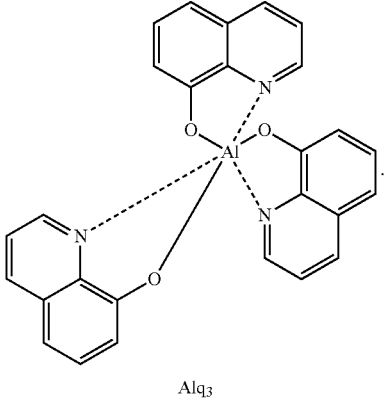

Alq₃

Referring to the results shown in Table 1, it can be seen that the organic light-emitting devices of Examples 1 to 9 had improved efficiency and lifespan, compared to those of the organic light-emitting devices of Comparative Examples 1 to 4.

An organic light-emitting device according to the one or more embodiments may have high efficiency and long lifespan.

It will be understood that if a substituent that appears in the present disclosure is not expressly defined above, the definition of the substituent is consistent with a general definition thereof, unless stated otherwise.

It will also be understood that when an element such as a layer, film, region, or substrate is referred to as being "on" another element, it can be directly on the other element or intervening elements may also be present. In contrast, when an element is referred to as being "directly on" or "directly contacting" another element, there are no intervening elements present.

As used herein, the terms "use," "using," and "used" may be considered synonymous with the terms "utilize," "utilizing," and "utilized," respectively.

In addition, as used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the drawings, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:
   a first electrode;
   a second electrode facing the first electrode;
   an emission layer between the first electrode and the second electrode;
   a hole transport region between the first electrode and the emission layer; and
   an electron transport region between the emission layer and the second electrode,
   wherein the hole transport region comprises a first compound, the emission layer comprises a second compound and a third compound, and the electron transport region comprises a fourth compound and a fifth compound,
   wherein the second compound is a fluorescent host and the third compound is a fluorescent dopant,
   the fourth compound is selected from compounds represented by Formulae 4-1 to 4-3,
   the first compound and the fourth compound each independently comprise at least one group selected from groups represented by Formulae A to D,
   at least one selected from the second compound and the third compound comprises at least one group selected from groups represented by Formulae A to D, and the fifth compound comprises, as a ring-forming moiety, a nitrogen-containing heterocyclic group including *=N—*' of the fifth compound:

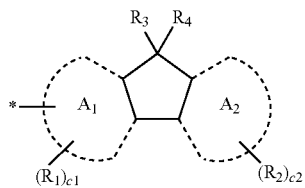

Formula A

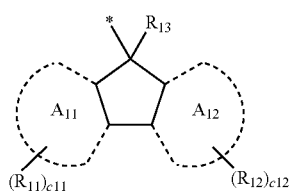

Formula B

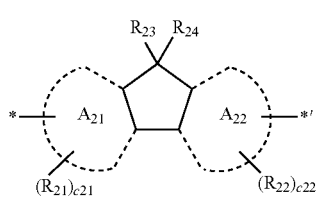

Formula C

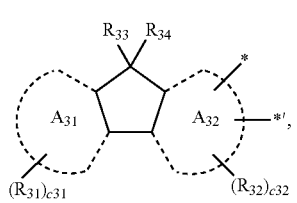

Formula D wherein, in Formulae A to D, ring $A_1$, ring $A_2$, ring $A_{11}$, ring $A_{12}$, ring $A_{21}$, ring A22, ring $A_{31}$, and ring $A_{32}$ are each independently selected from a $C_5$-$C_{30}$ carbocyclic group and a $C_1$-$C_{30}$ heterocyclic group, $R_1$ to $R_4$, $R_{11}$ to $R_{13}$, $R_{21}$ to $R_{24}$, and $R_{31}$ to $R_{34}$ are each independently selected from hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —N($Q_4$)($Q_5$), c1, c2, c11, c12, c21, c22, c31, and c32 are each independently an integer selected from 0 to 10, $R_1$ and $R_3$ are optionally linked to each other to form a saturated or unsaturated ring, $R_2$ and $R_4$ are optionally linked to each other to form a saturated or unsaturated ring, $R_3$ and $R_4$ are optionally linked to each other to form a saturated or unsaturated ring, $R_{12}$ and $R_{13}$ are optionally linked to each other to form a saturated or unsaturated ring, $R_{21}$ and $R_{23}$ are optionally linked to each other to form a saturated or unsaturated ring, $R_{23}$ and $R_{24}$ are optionally linked to each other to form a saturated or unsaturated ring, $R_{22}$ and $R_{24}$ are optionally linked to each other to form a saturated or unsaturated ring, $R_{31}$ and $R_{33}$ are optionally linked to each other to form a saturated or unsaturated ring, and $R_{33}$ and $R_{34}$ are optionally linked to each other to form a saturated or unsaturated ring, and

* and *' each indicate a binding site with a neighboring atom, wherein $Q_1$ to $Q_5$ are each independently selected from a $C_1$-$C_{10}$ alkyl group, a $C_1$-$C_{10}$ alkoxy group, a phenyl group, a biphenyl group, a terphenyl group, and a naphthyl group,

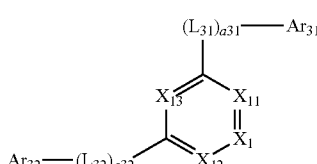

Formula 4-1

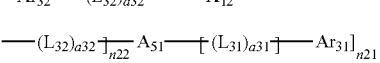

Formula 4-2

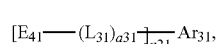

Formula 4-3 wherein, in Formulae 4-1 to 4-3, $X_1$ is C-($L_{33}$)$_{a33}$-$Ar_{33}$ or N, $X_{11}$ is C-($L_{34}$)$_{a34}$-($R_{51}$) or N, $X_{12}$ is C-($L_{35}$)$_{a35}$-($R_{52}$) or N, and $X_{13}$ is C-($L_{36}$)$_{a36}$-($R_{53}$) or N, wherein at least one selected from $X_1$ and $X_{11}$ to $X_{13}$ is N, $A_{51}$ is selected from a $C_5$-$C_{30}$ a carbocyclic group and a $C_1$-$C_{30}$ heterocyclic group, provided that $A_{51}$ is not an anthracene, $L_{31}$ to $L_{36}$ are each independently selected from a group represented by Formula C, a group represented by Formula D, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, provided that $L_{31}$ to $L_{36}$ are each independently not an anthracenylene group, a31 to a36 are each independently an integer selected from 0 to 3, $Ar_{31}$ to $Ar_{33}$, and $E_{41}$ are each independently selected from a group represented by Formula A, a group represented by Formula B, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, at least one selected from $Ar_{31}$ to $Ar_{33}$ in Formula 4-1 is selected from groups represented by Formulae A and B, $Ar_{31}$ in Formula 4-2 is selected from groups represented by Formulae A and B, and $E_{41}$ in Formula 4-2 includes a nitrogen-containing heterocyclic group including *=N—*' of the fourth compound, $Ar_{31}$ in Formula 4-3 is selected from groups represented by Formulae A and B, and $E_{41}$ in Formula 4-3 includes a nitrogen-containing heterocyclic group including *=N—*' of the fourth compound, wherein the nitrogen-containing heterocyclic group including *=N—*' of the fourth compound is selected from the group consisting of:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a phenanthrenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, and a benzoxazolyl group, $R_{51}$ to $R_{53}$ are each independently selected from hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), n21 and n22 are each independently an integer selected from 0 to 10, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

a $C_1$-$C_{60}$ alkyl group, a $C_3$-$C_{10}$ cycloalkyl group, a $C_1$-$C_{10}$ heterocycloalkyl group, a $C_2$-$C_{60}$ alkenyl group, a $C_3$-$C_{10}$ cycloalkenyl group, a $C_2$-$C_{60}$ alkynyl group, a $C_1$-$C_{10}$ heterocycloalkenyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each unsubstituted or substituted with at least one selected from deuterium, —F, —Cl, —Br, —I, a hydroxyl group, a cyano group, a nitro group, an amino group, a $C_1$-$C_{60}$ alkyl group, a $C_3$-$C_{10}$ cycloalkyl group, a $C_1$-$C_{10}$ heterocycloalkyl group, a $C_2$-$C_{60}$ alkenyl group, a $C_3$-$C_{10}$ cycloalkenyl group, a $C_2$-$C_{60}$ alkynyl group, a $C_1$-$C_{10}$ heterocycloalkenyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —N($Q_{14}$)($Q_{15}$); and —Si($Q_{31}$)($Q_{32}$)($Q_{33}$), and —N($Q_{34}$)($Q_{35}$), wherein $Q_1$ to $Q_3$, $Q_{11}$ to $Q_{15}$ and $Q_{31}$ to $Q_{35}$ are each independently selected from hydrogen, deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein ring $A_1$, ring $A_2$, ring $A_{11}$, and ring $A_{12}$ are each independently selected from a benzene, a naphthalene, a phenanthrene, an anthracene, a fluorene, a benzofluorene, a chrysene, a triphenylene, a pyridine, a pyrimidine, a quinoline, an isoquinoline, a benzoquinoline, a quinoxaline, a quinazoline, phenanthroline, an indole, a carbazole, a benzofuran, a benzothiophene, a dibenzofuran, a dibenzothiophene, and a benzonaphthothiophene.

3. The organic light-emitting device of claim 1, wherein $R_1$ to $R_4$, $R_{11}$ to $R_{13}$, $R_{21}$ to $R_{24}$, and $R_{31}$ to $R_{34}$ are each independently selected from the group consisting of:

hydrogen, deuterium, —F, —Cl, —Br, —I, a hydroxyl group, a cyano group, a nitro group, an amino group, a $C_1$-$C_{20}$ alkyl group, and a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, a $C_6$-$C_{16}$ aryl group, and a $C_3$-$C_{16}$ heteroaryl group; and —Si($Q_1$)($Q_2$)($Q_3$), and —N($Q_4$)($Q_5$), wherein $Q_1$ to $Q_5$ are each independently selected from a $C_1$-$C_{10}$ alkyl group, a $C_1$-$C_{10}$ alkoxy group, a phenyl group, a biphenyl group, a terphenyl group, a fluorenyl group, a naphthyl group, and a phenanthryl group.

4. The organic light-emitting device of claim 1, wherein $R_1$ to $R_4$, $R_{11}$ to $R_{13}$, $R_{21}$ to $R_{24}$, and $R_{31}$ to $R_{34}$ are each independently selected from the group consisting of:

hydrogen, deuterium, —F, —Cl, —Br, —I, a hydroxyl group, a cyano group, a nitro group, an amino group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, and an amino group;

a phenyl group, a biphenyl group, a terphenyl group, a fluorenyl group, a naphthyl group, a phenanthryl group, an anthracenyl group, a pyridinyl group, a pyrimidinyl group, a triazinyl group, a quinolinyl group, an isoquinolinyl group, a quinazolinyl group, a quinoxalinyl group, a dibenzofuranyl group, a dibenzothiophenyl group, a carbolinyl group, and a carbazolyl group;

a $C_1$-$C_{20}$ alkyl group, a $C_1$-$C_{20}$ alkoxy group, a phenyl group, a biphenyl group, a terphenyl group, a fluorenyl group, a naphthyl group, a phenanthryl group, an anthracenyl group, a pyridinyl group, a pyrimidinyl group, a triazinyl group, a quinolinyl group, an isoquinolinyl group, a quinazolinyl group, a quinoxalinyl group, a dibenzofuranyl group, a dibenzothiophenyl group, a carbolinyl group, and a carbazolyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, and a $C_6$-$C_{16}$ aryl group; and —Si($Q_1$)($Q_2$)($Q_3$), and —N($Q_4$)($Q_5$), wherein $Q_1$ to $Q_5$ are each independently selected from a $C_1$-$C_{10}$ alkyl group, a $C_1$-$C_{10}$ alkoxy group, a phenyl group, a biphenyl group, a terphenyl group, a fluorenyl group, a phenanthryl group, an anthracenyl group, and a naphthyl group.

5. The organic light-emitting device of claim 1, wherein the first compound and the fourth compound each independently comprise at least one group selected from groups represented by Formulae A-1, A-2, B-1, C-1, C-2, and D-1; and at least one of the second compound and the third compound each independently comprise at least one group selected from groups represented by Formulae A-1, A-2, B-1, C-1, C-2, and D-1:

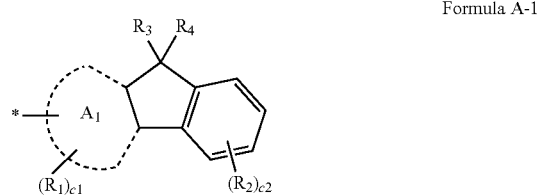

Formula A-1

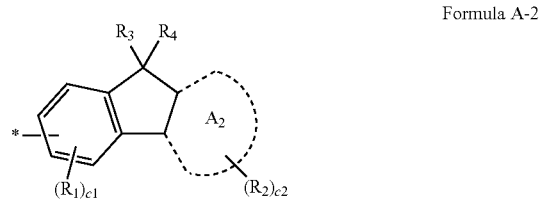

Formula A-2

-continued

Formula B-1

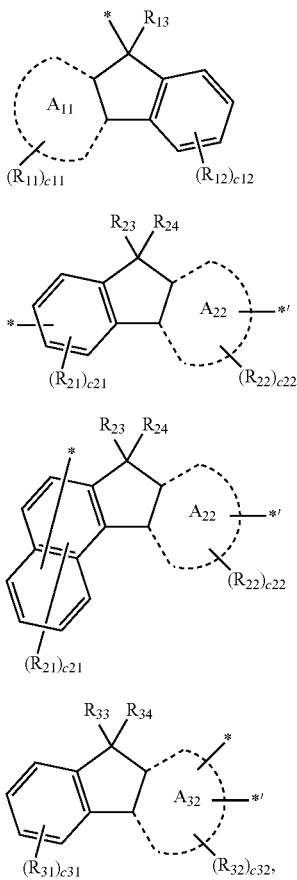

Formula C-1

Formula C-2

Formula D-1 wherein, in Formulae A-1, A-2, B-1, C-1, C-2, and D-1,
descriptions of $A_1$, $A_2$, $A_{11}$, $A_{22}$, $A_{32}$, $R_1$ to $R_4$, $R_{11}$ to $R_{13}$, $R_{21}$ to $R_{24}$ and $R_{31}$ to $R_{34}$ are the same as in Formulae A to D, descriptions of c1, c2, c11, c12, c21, c22, c31, and c32 are the same as in Formulae A to D, and

* and *' each indicate a binding site with a neighboring atom.

6. The organic light-emitting device of claim 1, wherein the first compound is selected from compounds represented by Formulae 1-1 and 1-2,
the second compound is selected from compounds represented by Formulae 2-1 and 2-2,
the third compound is selected from compounds represented by Formulae 3-1 and 3-2, and
the fifth compound is selected from compounds represented by Formulae 5-1 and 5-2:

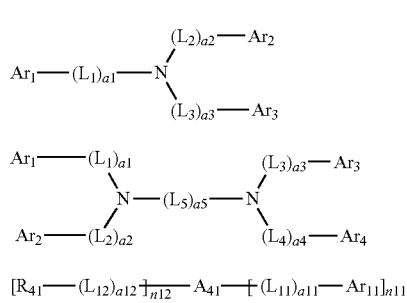

Formula 1-1

Formula 1-2

Formula 2-1

Formula 2-2

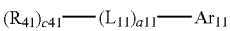

Formula 3-1

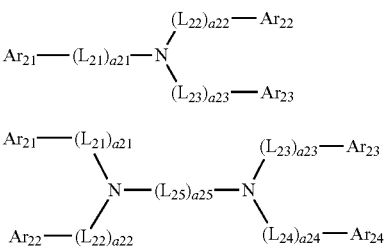

Formula 3-2

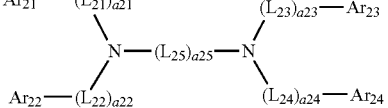

Formula 5-1

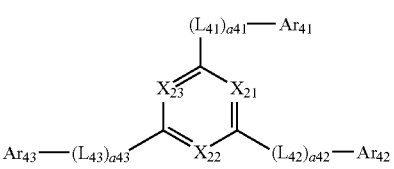

Formula 5-2

$[R_{71}—(L_{42})_{a42}]_{n32}—A_{61}—[(L_{41})_{a41}—E_{51}]_{n31}$, wherein, in the formulae above, $X_{21}$ is $C-(L_{44})_{a44}-(R_{61})$ or N, $X_{22}$ is $C-(L_{45})_{a45}-(R_{62})$ or N, and $X_{23}$ is $C-(L_{46})_{a46}-(R_{63})$ or N, wherein at least one selected from $X_{21}$ to $X_{23}$ is N, $A_{41}$ and $A_{61}$ are each independently selected from a $C_5$-$C_{30}$ carbocyclic group and a $C_1$-$C_{30}$ heterocyclic group, $L_1$ to $L_5$, $L_{11}$, $L_{12}$, $L_{21}$ to $L_{25}$, and $L_{41}$ to $L_{46}$ are each independently selected from a group represented by Formula C, a group represented by Formula D, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a5, a11, a12, a21 to a25, and a41 to a46 are each independently an integer selected from 0 to 3, $Ar_1$ to $Ar_4$, $Ar_{11}$, $Ar_{21}$ to $Ar_{24}$, $Ar_{41}$ to $Ar_{43}$, and $E_{51}$ are each independently selected from a group represented by Formula A, a group represented by Formula B, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_1$ and $Ar_2$ are optionally linked to each other to form a saturated or unsaturated ring, and $Ar_3$ and $Ar_4$ are optionally linked to each other to form a saturated or unsaturated ring, i) at least one selected from $Ar_1$ to $Ar_3$ in Formula 1-1 is selected from groups represented by Formulae A and B, and ii) at least one selected from $L_1$ to $L_3$ in Formula 1-1 is selected from groups represented by Formulae C and D, i) at least one selected from $Ar_1$ to $Ar_4$ in Formula 1-2 is selected from groups represented by Formulae A and B, and ii) $L_5$ in Formula 1-2 is selected from groups represented by Formulae C and D, i) $Ar_{11}$ in Formula 2-1 is selected from groups represented by Formulae A and B, ii) at least one selected from $L_{11}$ and $L_{12}$ in Formula 2-1 is selected from groups represented by Formulae C and D, iii) $L_{11}$ in Formula 2-2 is selected from groups represented by Formulae C and D, iv) at least one selected from $L_{21}$ to $L_{23}$ in Formula 3-1 is selected from groups represented by Formulae C and D, v) at least one selected from $Ar_{21}$ to $Ar_{23}$ in Formula 3-1 is selected from groups represented by Formulae A and B, vi) $L_{25}$ in Formula 3-2 is selected from groups represented by Formulae C and D, vii) at least one selected from $Ar_{21}$ to $Ar_{24}$ in Formula 3-2 is selected from groups represented by Formulae A and B, or viii) $Ar_{11}$ in Formula 2-1 is selected from groups represented by Formulae A and B, at least one selected from $L_{11}$ and $L_{12}$ in Formula 2-1 is selected from groups represented by Formulae C and D, $L_{11}$ in Formula 2-2 is selected from groups represented by Formulae C and D, at least one selected from $L_{21}$ to $L_{23}$ in Formula 3-1 is selected from groups represented by Formulae C and D, at least one selected from $Ar_{21}$ to $Ar_{23}$ in Formula 3-1 is selected from groups represented by Formulae A and B, $L_{25}$ in Formula 3-2 is selected from groups represented by Formulae C and D, and at least one selected from $Ar_{21}$ to $Ar_{24}$ in Formula 3-2 is selected from groups represented by Formulae A and B, $E_{51}$ in Formula 5-2 includes, as a ring-forming moiety, a nitrogen-containing heterocyclic group including *=N—*', $R_{41}$, $R_{61}$ to $R_{63}$, and $R_{71}$ are each independently selected from hydrogen, deuterium, —F, —Cl, —Br, —I, a hydroxyl group, a cyano group, a nitro group, an amino group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), c41 is an integer selected from 0 to 4, n11, n12, n31, and n32 are each independently an integer selected from 0 to 10, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

a $C_1$-$C_{60}$ alkyl group, a $C_3$-$C_{10}$ cycloalkyl group, a $C_1$-$C_{10}$ heterocycloalkyl group, a $C_2$-$C_{60}$ alkenyl group, a $C_3$-$C_{10}$ cycloalkenyl group, a $C_2$-$C_{60}$ alkynyl group, a $C_1$-$C_{10}$ heterocycloalkenyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each unsubstituted or substituted with at least one selected from deuterium, —F, —Cl, —Br, —I, a hydroxyl group, a cyano group, a nitro group, an amino group, a $C_1$-$C_{60}$ alkyl group, a $C_3$-$C_{10}$ cycloalkyl group, a $C_1$-$C_{10}$ heterocycloalkyl group, a $C_2$-$C_{60}$ alkenyl group, a $C_3$-$C_{10}$ cycloalkenyl group, a $C_2$-$C_{60}$ alkynyl group, a $C_1$-$C_{10}$ heterocycloalkenyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —N($Q_{14}$)($Q_{15}$); and —Si($Q_{31}$)($Q_{32}$)($Q_{33}$), and —N($Q_{34}$)($Q_{35}$), wherein $Q_1$ to $Q_3$, $Q_{11}$ to $Q_{15}$, and $Q_{31}$ to $Q_{35}$ are each independently selected from hydrogen, deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

7. The organic light-emitting device of claim 6, wherein $A_{41}$, $A_{51}$, and $A_{61}$ are each independently selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, provided that $A_{51}$ is not an anthracene.

8. The organic light-emitting device of claim 6, wherein $L_1$ to $L_5$, $L_{11}$, $L_{12}$, $L_{21}$ to $L_{25}$, $L_{31}$ to $L_{36}$, and $L_{41}$ to $L_{46}$ are each independently selected from the group consisting of:

a group represented by Formula C, a group represented by Formula D, a phenylene group, a pentalenylene group, an indenylene group, a naphthylene group, an azulenylene group, a heptalenylene group, an indacenylene group, an acenaphthylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a rubicenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a rubicenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a terphenyl group, a pentalenyl group, an indenyl group, a naphthyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, provided that $L_{31}$ to $L_{36}$ are each independently not an anthracenylene group.

9. The organic light-emitting device of claim 6, wherein $Ar_1$ to $Ar_4$, $Ar_{11}$, $Ar_{21}$ to $Ar_{24}$, $Ar_{31}$ to $Ar_{33}$, and $Ar_{41}$ to $Ar_{43}$ are each independently selected from the group consisting of:

a group represented by Formula A and a group represented by Formula B;

a phenyl group, a biphenyl group, a terphenyl group, a pentalenyl group, an indenyl group, a naphthyl group, an azulenyl group, a heptalenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a rubicenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzooxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group; and a phenyl group, a biphenyl group, a terphenyl group, a pentalenyl group, an indenyl group, a naphthyl group, an azulenyl group, a heptalenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a rubicenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a cyclopentyl group, a cyclohexyl group, a phenyl group, a biphenyl group, a terphenyl group, a pentalenyl group, an indenyl group, a naphthyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, an imidazopyrimidinyl group, and —Si($Q_{31}$)($Q_{32}$)($Q_{33}$), wherein $Q_{31}$ to $Q_{33}$ are each independently selected from hydrogen, deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

10. The organic light-emitting device of claim 6, wherein $E_{51}$ is selected from the group consisting of:

a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group; and a pyrrolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a triazolyl group, a tetrazolyl group, an oxadiazolyl group, a triazinyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a biphenyl group, a terphenyl group, a naphthyl group, a phenanthrenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, and a benzoxazolyl group.

11. The organic light-emitting device of claim 6, wherein $R_{41}$, $R_{51}$ to $R_{53}$, $R_{61}$ to $R_{63}$, and $R_{71}$ are each independently selected from the group consisting of:

hydrogen, deuterium, —F, —Cl, —Br, —I, a hydroxyl group, and a cyano group; a $C_1$-$C_{10}$ alkyl group, a $C_1$-$C_{10}$ alkoxy group, a phenyl group, a naphthyl group, a pyridinyl group, a pyrimidinyl group, a triazinyl group, and a carbazolyl group;

a $C_1$-$C_{10}$ alkyl group, a $C_1$-$C_{10}$ alkoxy group, a phenyl group, a naphthyl group, a pyridinyl group, a pyrimidinyl group, a triazinyl group, and a carbazolyl group, each substituted with at least one selected from deuterium, —F, —Cl, —Br, —I, a hydroxyl group, a cyano group, a nitro group, an amino group, a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a triazinyl group, and —Si($Q_{31}$)($Q_{32}$)($Q_{33}$); and —Si($Q_1$)($Q_2$)($Q_3$), wherein $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

12. The organic light-emitting device of claim 1, wherein an amount of the third compound in the emission layer ranges from about 0.01 parts by weight to about 15 parts by weight based on 100 parts by weight of the second compound.

13. The organic light-emitting device of claim 1, wherein the hole transport region comprises a first hole transport layer and a second hole transport layer, the second hole transport layer being between the first hole transport layer and the emission layer, wherein at least one selected from the first hole transport layer and the second hole transport layer comprises the first compound.

14. The organic light-emitting device of claim 1, wherein the electron transport region comprises a first electron transport layer and a second electron transport layer, the second electron transport layer being between the second electrode and the first electron transport layer, wherein at least one selected from the first electron transport layer and the second electron transport layer comprises the fourth compound, and at least one selected from the first electron transport layer and the second electron transport layer comprises the fifth compound.

15. The organic light-emitting device of claim 14, wherein the first electron transport layer comprises the fourth compound and the second electron layer comprises the fifth compound, or the first electron transport layer comprises the fifth compound and the second electron transport layer comprises the fourth compound.

16. The organic light-emitting device of claim 14, wherein the first electron transport layer directly contacts the emission layer.

17. The organic light-emitting device of claim 14, wherein the second electron transport layer further comprises a metal-containing material.

18. The organic light-emitting device of claim 17, wherein a weight ratio of the fourth compound to the metal-containing material ranges from about 2:8 to about 8:2.

19. The organic light-emitting device of claim 1, wherein at least two compounds selected from the first compound to the fourth compound have the lowest triplet energy of 2.4 eV or greater.

20. The organic light-emitting device of claim 1, wherein at least two compounds selected from the first compound to the fourth compound have an asymmetrical structure.

* * * * *